US010256158B1

(12) United States Patent
Frougier et al.

(10) Patent No.: US 10,256,158 B1
(45) Date of Patent: Apr. 9, 2019

(54) INSULATED EPITAXIAL STRUCTURES IN NANOSHEET COMPLEMENTARY FIELD EFFECT TRANSISTORS

(71) Applicant: GLOBALFOUNDRIES INC., Grand Cayman (KY)

(72) Inventors: Julien Frougier, Albany, NY (US); Ruilong Xie, Schenectady, NY (US); Steven Bentley, Menands, NY (US); Puneet H. Suvarna, Menands, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/820,477

(22) Filed: Nov. 22, 2017

(51) Int. Cl.
| | |
|---|---|
| *H01L 21/8238* | (2006.01) |
| *H01L 29/06* | (2006.01) |
| *H01L 29/167* | (2006.01) |
| *H01L 29/423* | (2006.01) |
| *H01L 27/092* | (2006.01) |
| *H01L 21/822* | (2006.01) |
| *H01L 29/161* | (2006.01) |
| *H01L 21/84* | (2006.01) |

(52) U.S. Cl.
CPC .. *H01L 21/823814* (2013.01); *H01L 21/8221* (2013.01); *H01L 21/823821* (2013.01); *H01L 21/823878* (2013.01); *H01L 21/845* (2013.01); *H01L 27/0924* (2013.01); *H01L 29/0653* (2013.01); *H01L 29/161* (2013.01); *H01L 29/167* (2013.01); *H01L 29/42356* (2013.01)

(58) Field of Classification Search
CPC ............ H01L 27/1211; H01L 29/0646; H01L 21/823821; H01L 21/845
See application file for complete search history.

(56) References Cited

U.S. PATENT DOCUMENTS

| | | | |
|---|---|---|---|
| 8,273,610 B2 | 9/2012 | Or-Bach et al. | |
| 8,541,819 B1 | 9/2013 | Or-Bach et al. | |
| 2011/0092030 A1 | 4/2011 | Or-Bach et al. | |
| 2011/0121366 A1 | 5/2011 | Or-Bach et al. | |
| 2013/0020707 A1 | 1/2013 | Or-Bach et al. | |
| 2013/0122672 A1 | 5/2013 | Or-Bach et al. | |
| 2016/0211276 A1* | 7/2016 | Liu ..................... | H01L 27/1211 |

* cited by examiner

*Primary Examiner* — Dung A. Le
(74) *Attorney, Agent, or Firm* — Gibb & Riley, LLC; Anthony J. Canale

(57) ABSTRACT

Integrated circuit structures include isolation elements extending into a substrate, and source/drain regions of a first transistor contacting the isolation elements. The isolation elements extend from the substrate to the source/drain regions of the first transistor. Isolation layers contact the source/drain regions of the first transistor, and source/drain regions of a second transistor also contact the isolation layers. Thus, the isolation layers are between the source/drain regions of the first transistor and the source/drain regions of the second transistor. Channel regions of the first transistor contact and extend between the source/drain regions of the first transistor, and channel regions of the second transistor contact and extend between the source/drain regions of the second transistor. A gate conductor surrounds sides of the channel region of the first transistor and the channel region of the second transistor.

20 Claims, 72 Drawing Sheets

INSULATED EPITAXIAL STRUCTURES IN NANOSHEET COMPLEMENTARY FIELD EFFECT TRANSISTORS

BACKGROUND

Field of the Invention

The present disclosure relates to integrated circuit structures, and more specifically, to epitaxial structures in 3D monolithic complementary field effect transistors (CFETs).

Description of Related Art

Integrated circuit devices use transistors for many different functions, and these transistors can take many different forms, from planar transistors, to transistors that use a "fin" style structure. A fin of a fin-type transistor is a thin, long, six-sided rectangle that extends from a substrate, with sides that are longer than they are wide, a top and bottom that have the same length as the sides (but that have a width that is much more narrow), and ends that are as tall from the substrate as the width of the sides, but that are only as wide as the as the top and bottom.

In one example, multiple horizontal gate-all-around field effect transistors (h-GAAFETs) will typically have a row of N-type GAAFETs on one-side, a corresponding row of P-type GAAFETs on the opposite side, and shared gates that extend laterally across and wrap around the channel regions of side-by-side pairs of N-type and P-type GAAFETs. Contrarily, a Complementary-FET (CFET) layout with multiple vertically stacked pairs of GAAFETs will have P-type GAAFETs on one-level, N-type GAAFETs on an adjacent level (i.e., above or below) and shared gates, where each shared gate extends vertically across and wraps around the channel regions of a stacked pair of N-type and P-type GAAFETs. In such structures, the source/drain regions of the lower GAAFET are electrically isolated from the source/drain regions of the upper GAAFET by dielectric layers.

SUMMARY

According to structure embodiments herein, isolation elements (which can be isolation plugs or a buried oxide portion of the substrate) can extend into the surface of a substrate. Source/drain regions of a first transistor contact the isolation elements, and the isolation elements extend from the substrate to the source/drain regions of the first transistor. Isolation layers contact the source/drain regions of the first transistor. Source/drain regions of a second transistor also contact the isolation layers. Thus, the first transistor is positioned between the second transistor and the substrate, and the isolation layers are between the source/drain regions of the first transistor and the source/drain regions of the second transistor.

Also, a channel region of the first transistor contacts and extends between the source/drain regions of the first transistor. Similarly, a channel region of the second transistor contacts and extends between the source/drain regions of the second transistor. The channel region of the first transistor and the channel region of the second transistor extend parallel to the surface of the substrate.

In addition, a gate conductor surrounds sides of the channel region of the first transistor and the channel region of the second transistor. A liner dielectric is laterally adjacent the gate conductor. The liner dielectric is different from the isolation layers and the isolation elements.

Method embodiments herein form a multi-layer structure on a substrate to include semiconductor layers separated by spacer layers, and pattern the multi-layer structure to form recesses through the multi-layer structure extending to the substrate, thereby defining fins. Such methods form isolation elements extending into the surface of the substrate between the fins, and form source/drain regions of a first transistor in the recesses to contact the isolation elements. The isolation elements are formed to extend from the substrate to the source/drain regions of the first transistor. The isolation elements can be formed to be insulator plugs or a buried oxide region in the substrate.

Further, such methods form isolation layers in the recesses between the fins to contact the source/drain regions of the first transistor, and form source/drain regions of a second transistor in the recesses to contact the isolation layers. The first transistor is formed to be positioned between the second transistor and the substrate.

The isolation layers are formed to be between the source/drain regions of the first transistor and the source/drain regions of the second transistor. The isolation layers can be formed to have a width that is smaller than, or equal to, the width of the source/drain regions of the first transistor (where the width is measured in the direction parallel to the surface of the substrate). Also, the source/drain regions of the first transistor can be formed to contact a buried oxide layer connected to the substrate. In addition, the height (which is perpendicular to the aforementioned width) of the isolation layers is formed to be less than the height of the source/drain regions.

One of the semiconductor layers is a channel region of the first transistor that contacts and extends between the source/drain regions of the first transistor, while another of the semiconductor layers is a channel region of the second transistor that contacts and extends between the source/drain regions of the second transistor.

These methods also form a liner dielectric laterally adjacent the fins. The liner dielectric is different from the isolation layers and the isolation elements. The liner dielectric can be formed to be positioned between the isolation elements and the substrate. Also, these methods replace portions of the spacer layers with a gate conductor that surrounds sides of the channel region of the first transistor and the channel region of the second transistor.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, various types of complementary transistor structures use opposite polarity transistors (e.g., n-type field effect transistors (nFETs) and p-type field effect transistors (pFETs)). Such nFETs and pFETs have conductively doped source/drain (S/D) regions that are epitaxially grown, and such epitaxial source/drain regions are independently grown where they contact the semiconductive channel regions (e.g., within a nanosheet stack). The nFET and pFET epitaxial source/drain regions can be vertically integrated in complementary field effect transistors (CFETs); however, to avoid short circuits, the nFET and pFET epitaxial source/drain should be electrically insulated from one another.

When forming transistors using nanosheet-like architectures (e.g., CFETs) on bulk substrates, the epitaxial source/drain regions are generally grown from (i) the side of the silicon nanosheets and (ii) the bottom silicon substrate. This can lead to parasitic source/drain leakage through the substrate harming device performance. Dielectric isolation of the epitaxial source/drain regions (and the region below the nanosheet stack) from the substrate is useful for optimal electrical performance. In view of this, the devices and processing described herein use pFET selective protection with a liner during nFET epitaxial processing. Also, some embodiments can form a bottom isolation using oxide plugs, or an epitaxial spacer for epitaxial source/drain disconnection. Other embodiments herein address these issues by providing electrical isolation of the source/drain regions using selective oxidation of the pFET dummy gate (e.g., epitaxial boron doped silicon germanium (SiGe:B)) to form self-aligned epitaxial spacers between the nFET and pFET epitaxial source/drain regions.

Figure 1:
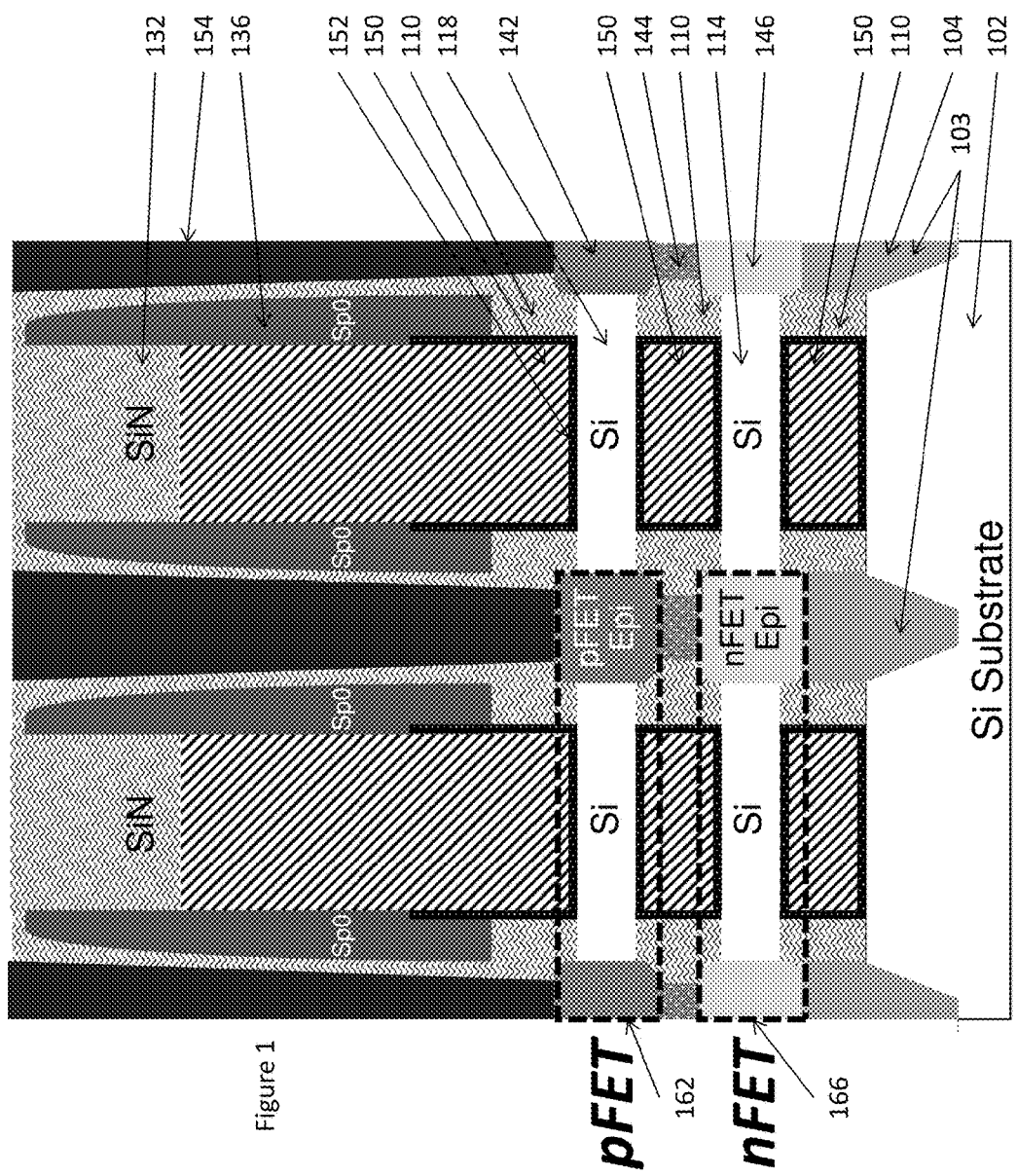
FIG. 1-6 are schematic diagrams illustrating various structures according to embodiments herein.

Referring now to the drawings, FIG. 1-6 are schematic diagrams illustrating various structures according to embodiments herein. FIG. 1 illustrates one exemplary structure herein, and FIGS. 7-23 (discussed below) illustrate various exemplary processing steps that can be used to produce the structure shown in FIG. 1.

More specifically, FIG. 1 illustrates a silicon substrate 102 and isolation elements (which in this case are isolation plugs 103 made of an isolation insulator 104) that extend into the surface of the substrate 102. In some examples, the insulator can be an oxide, such as silicon oxide. The isolation elements extend from the substrate 102 to an nFET source/drain region 146, and this allows the isolation plugs 103 to provide additional electrical isolation of the nFET source/drain regions 146 from the substrate 102 (and this helps prevent current flow between laterally adjacent source/drain regions of adjacent fins through the substrate 102).

Source/drain regions 146 of a first transistor (e.g., nFET 166) contact the isolation plugs 103, and the isolation plugs 103 extend from the substrate 102 to the source/drain regions 146 of the first transistor 166. Isolation layers 144 contact the source/drain regions 146 of the first transistor 166. Also, source/drain regions 142 of a second transistor (e.g., pFET 162) contact the isolation layers 144. Thus, the first transistor 166 is positioned between the second transistor 162 and the substrate 102, and the isolation layers 144 are between the source/drain regions 146 of the first transistor 166 and the source/drain regions 142 of the second transistor 162.

As explained in greater detail below, the isolation layer 144 can be a conformal deposition of a high-quality insulator (such as $SiO_2$, SiBCN, SiOC, SiOCN, etc.) and the isolation layer 144 is self-aligned with the nFET source/drain region 146 and the pFET source/drain region 142, to be consistently formed between the nFET source/drain region 146 and the pFET source/drain region 142, and to provide a high-quality electrical insulator consistently between the between the nFET source/drain region 146 and a pFET source/drain region 142.

Also, a channel region 114 of the first transistor 166 contacts and extends between the source/drain regions 146 of the first transistor 166. Similarly, a channel region 114 of the second transistor 162 contacts and extends between the source/drain regions 142 of the second transistor 162. The channel region 114 of the first transistor 166 and the channel region 118 of the second transistor 162 extend parallel to the top surface of the substrate 102 into which the isolation plugs 103 extend. In other words, the top surface of the substrate 102 is the surface closest to the transistors 162, 166.

In FIG. 1, a potentially single, continuous gate conductor 150 surrounds the sides of the elongated channel regions 114 of both transistors 162, 166. The gate structure for stacked GAAFETs could include a single gate conductor, or a first work function metal layer adjacent to the lower channel (e.g., optimal for NFET performance), a second work function metal layer adjacent to the upper channel (e.g., optimal for PFET performance), and, optionally, some fill metal, and such can be referred to as a shared gate structure. Gate insulators 152 electrically insulate the gate conductors 150 from the channel regions 114.

Further, a liner dielectric 110 electrically isolates components of adjacent fins from one another (e.g., insulates the gate conductor 150 from laterally adjacent gate conductors 150 in other fins). Gate (sidewall) spacers 136 are laterally adjacent to the upper portions (upper sidewalls) of the gate conductors 150, and various contacts 154 extend through the liner dielectric 110 to contact various source/drain regions (not all of which are illustrated in the views presented). Additionally, gate caps 132 can be positioned at the top of the gate conductors 150 (the "top" is the portion of the gate conductor 150 that is distal to the substrate 102). The liner dielectric 110 is different (e.g., different materials, differently formed, different structurally, etc.) from the isolation layers 144 and the isolation elements (which are the isolation plugs 103 in this example).

Figure 2:
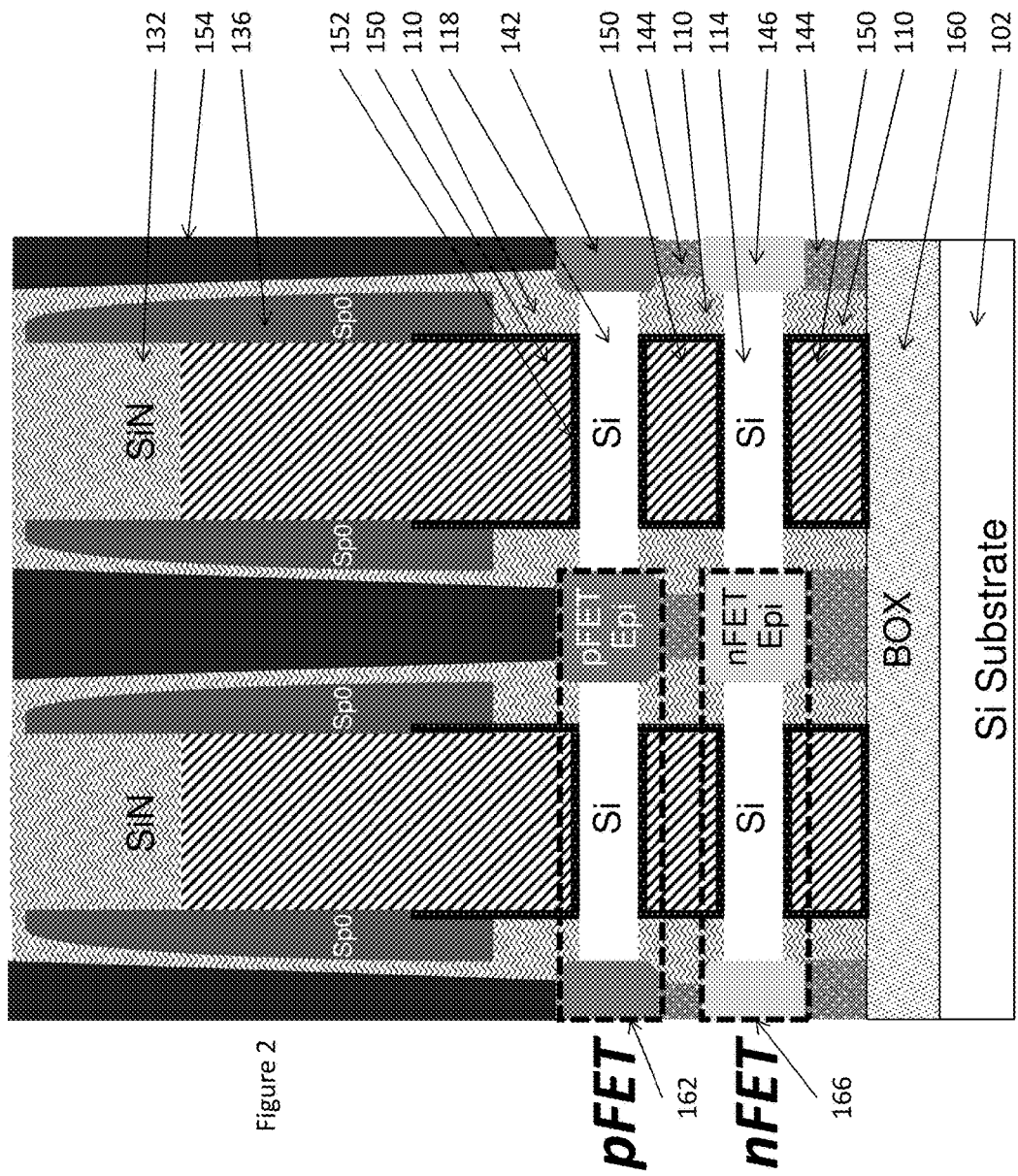

FIG. 2 illustrates an alternative structure herein, which is similar to FIG. 1 (and, therefore, the same identification numerals are used to identify similar features without redundant description, to maintain reader focus); however, in FIG. 2, the isolation element is instead a buried oxide layer (BOX) or other similar dielectric substrate element 160 that has lower conductivity (greater electrical insulation (higher K)) relative to the remainder of the substrate 102. Again, this isolation element (BOX 160) is utilized to provide additional electrical isolation of the nFET source/drain regions 146 from the substrate 102 to prevent undesirable current flow through the substrate 102 between adjacent fins. In the structure shown in FIG. 2, the isolation layers 144 are additionally positioned between the BOX 160 and the source/drain regions 146 of the first transistor 166 to further insulate the source/drain regions 146 from the substrate 102.

FIGS. 24-31 (discussed below) are schematic diagrams illustrating various exemplary processing steps that can be used to produce the structure shown in FIG. 2.

Figure 3:
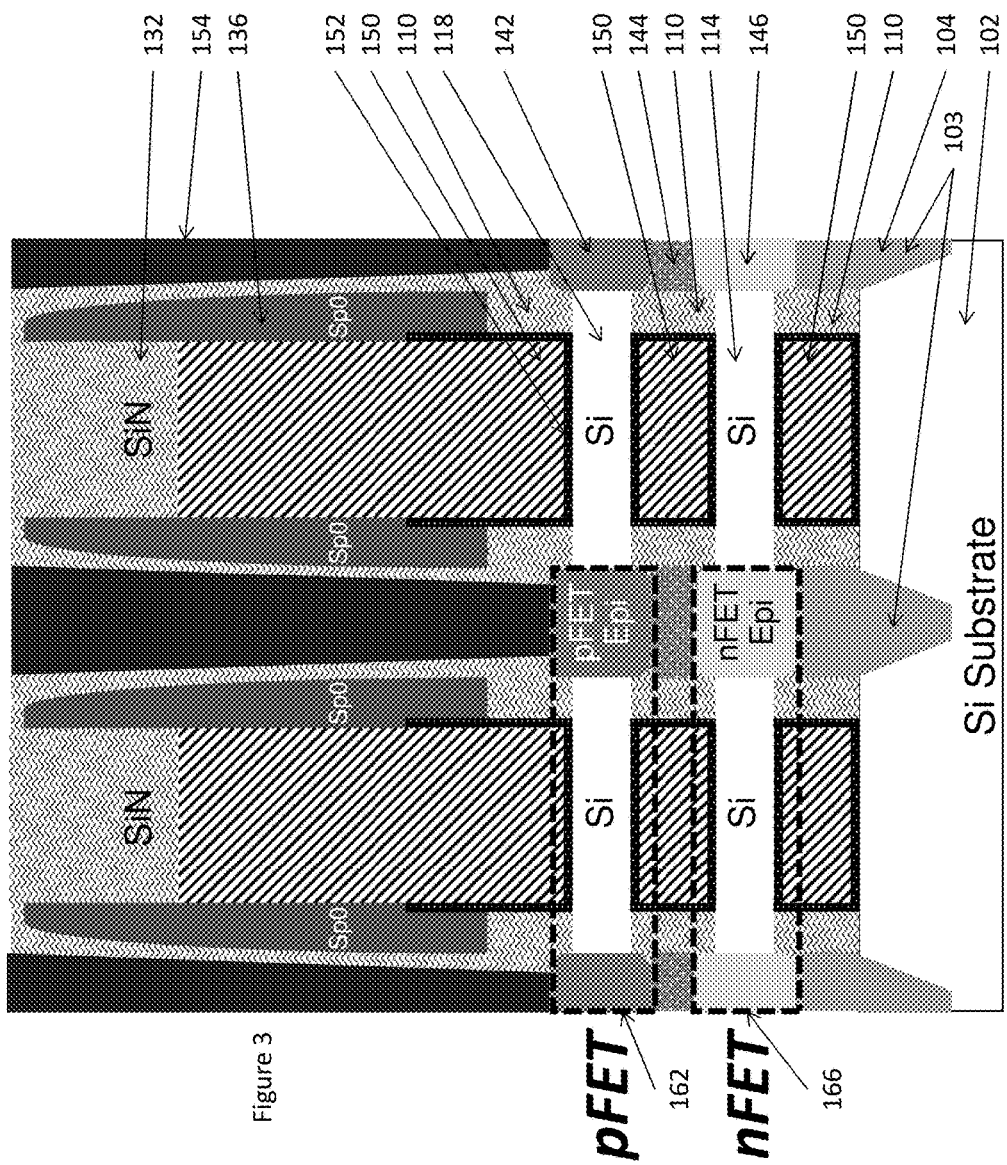

FIG. 3 also illustrates an alternative structure herein, which is similar to the previously discussed Figures (and, therefore, the same identification numerals are used to identify similar features, again without redundant description); however, in FIG. 3, the isolation layers 144 are the same width as the source/drain regions 142, 146. Note that in the structure shown in FIG. 1, the isolation layers 144 had a smaller width than the source/drain regions 142, 146. In this example "width" is measured in the direction parallel to the top surface of the substrate 102 and to the channel regions 114. FIGS. 32-36 (discussed below) are schematic diagrams illustrating various exemplary processing steps that can be used to produce the structure shown in FIG. 3.

Figure 4:
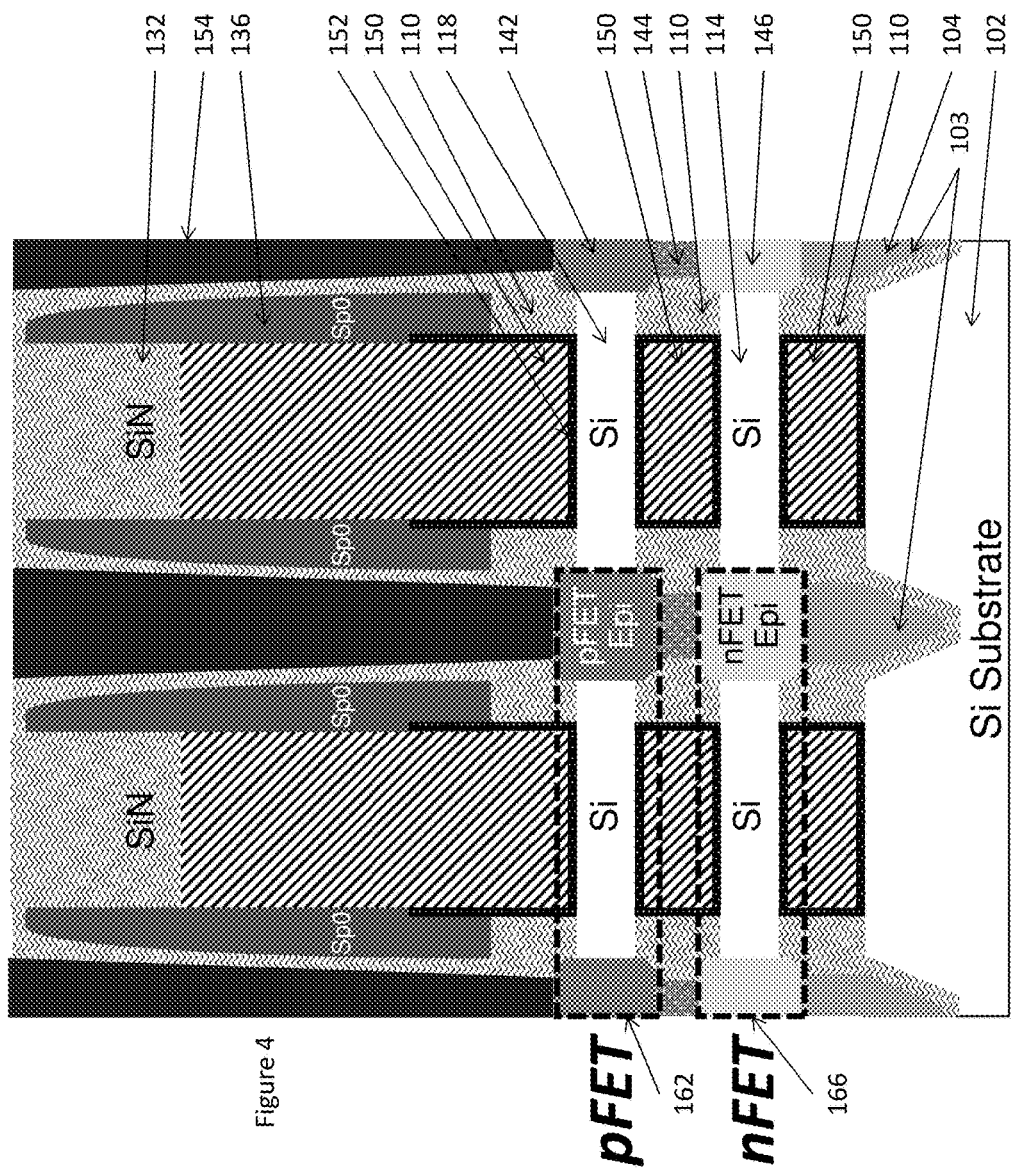

FIG. 4 further illustrates an alternative structure herein, which is similar to the previously discussed Figures (and, again, the same identification numerals are used to identify similar features, without redundant discussion); however, in FIG. 4 the liner dielectric 110 is positioned between the isolation elements (isolation plugs 103 in this example) and the substrate 102 to further insulate the source/drain regions 146 from the substrate 102. Further, FIG. 4 includes the more narrow (less wide) isolation layers 144. FIGS. 37-50 (discussed below) are schematic diagrams illustrating various exemplary processing steps that can be used to produce the structure shown in FIG. 4.

Figure 5:
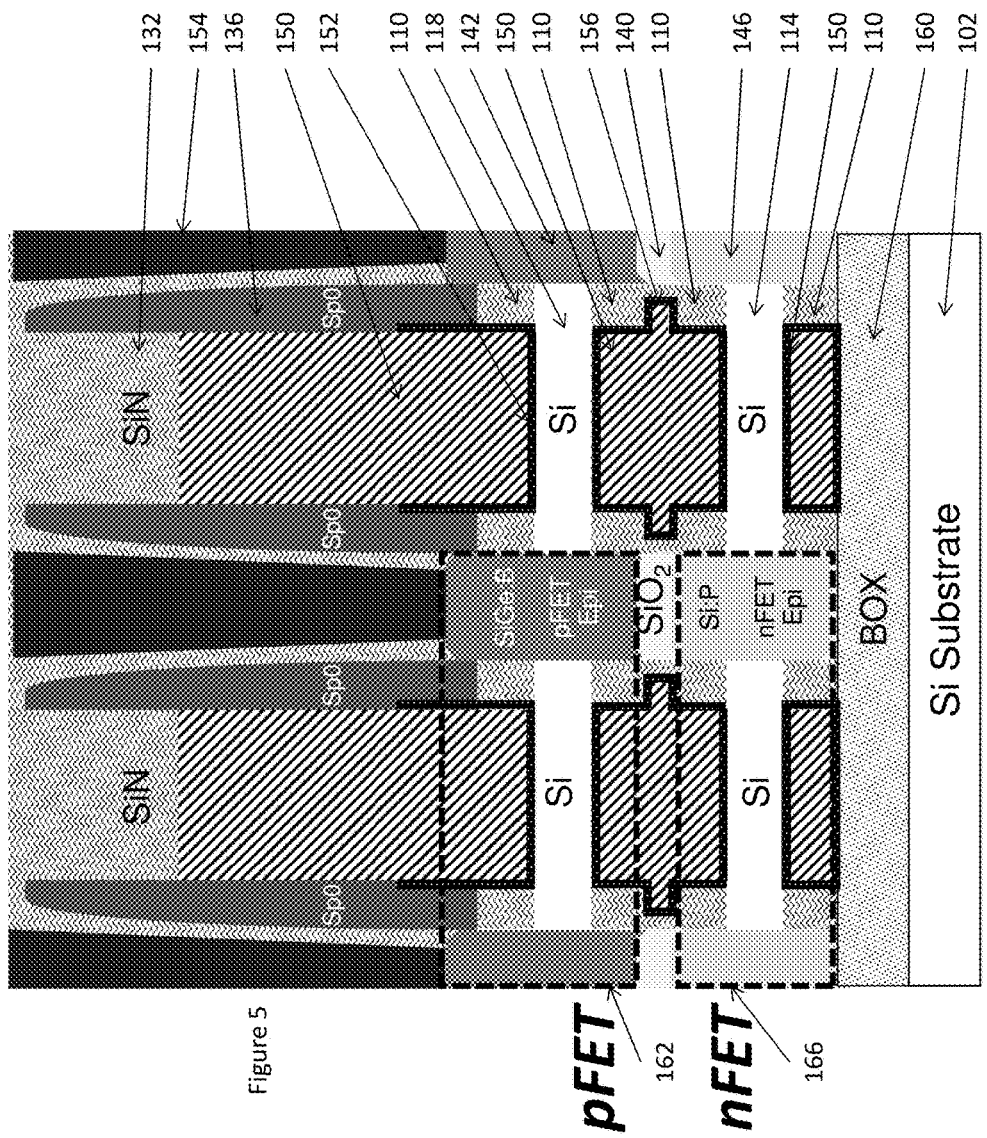

FIG. 5 additionally illustrates an alternative structure herein, which is similar to the previously discussed Figures (again, the same identification numerals are used to identify similar features); however, in FIG. 5 the source/drain regions 146 of the first transistor 166 contact the buried oxide layer 160. This increases the height of the source/drain regions 146 relative to the height of the source/drain regions 146 in the other structures discussed herein, where the height of the source/drain regions 142, 146 of the transistors 162, 166 are the same (and where the "height" direction is perpendicular to the aforementioned "width" direction (e.g., is perpendicular to the top of the substrate 102). In the structures shown herein, the height of the isolation layers 144 is less than the height of the source/drain regions 142, 146. Also, in the structure shown in FIG. 5, the spacing between the channel regions 114 is greater than the spacing between the channel region 114 of the first transistor 166 and the substrate 102. The gate conductors 150 include extensions 156 laterally adjacent locations where the isolation layers 144 electrically isolate the source/drain regions 142, 146 from one another. Such extensions 156 are artifacts from a layer (116, discussed below) in the nanosheet stack used to increase the channel spacing. FIGS. 51-62 (discussed below) are schematic diagrams illustrating various exemplary processing steps that can be used to produce the structure shown in FIG. 5.

Figure 6:
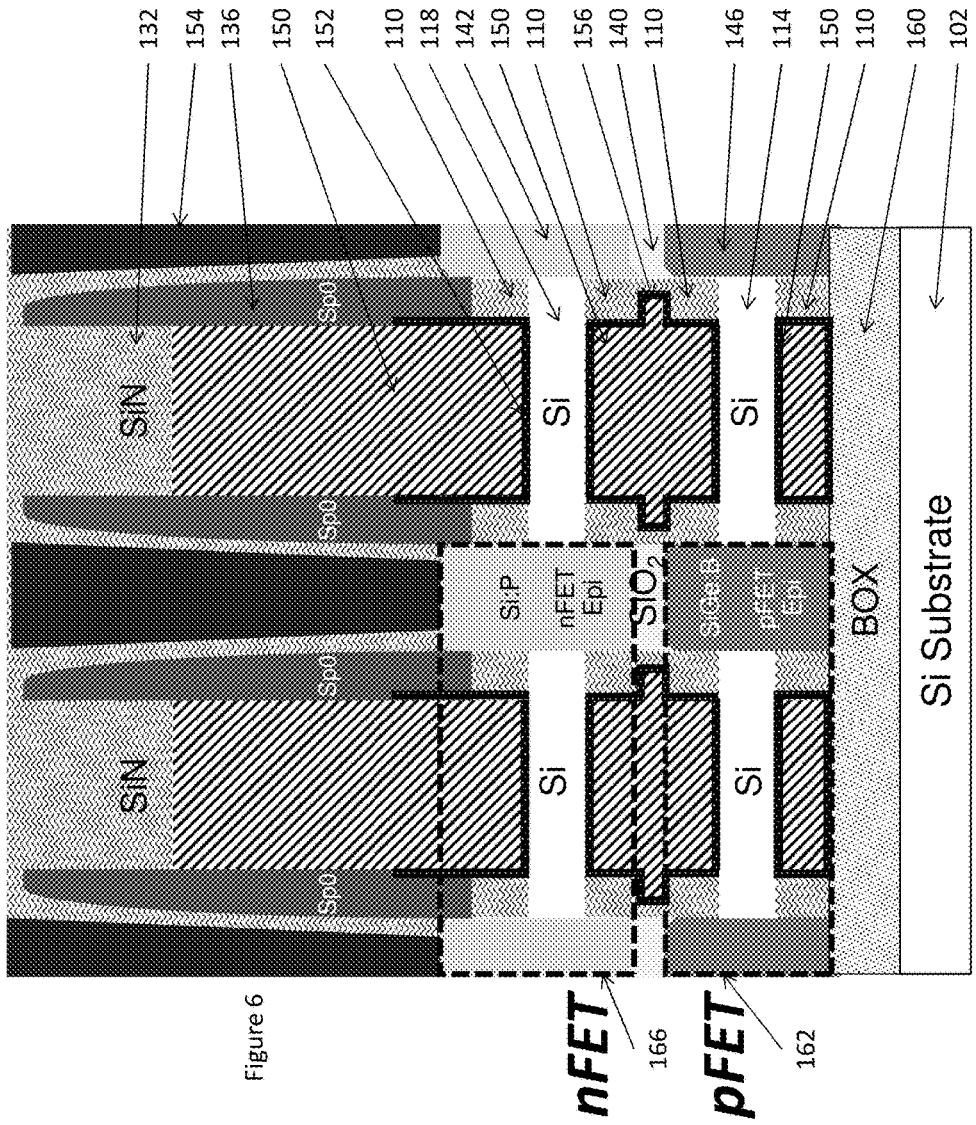

FIG. 6 also illustrates an alternative structure herein, which is similar to that shown in FIG. 5 (and, again, the same identification numerals are used to identify similar features without redundant discussion); however, in FIG. 6 the positions of the first transistor 166 and the second transistor 162 are switched, such that the second transistor 162 is between the first transistor 166 and the substrate 102. FIGS. 63-72 (discussed below) are schematic diagrams illustrating various exemplary processing steps that can be used to produce the structure shown in FIG. 6.

Figure 7:
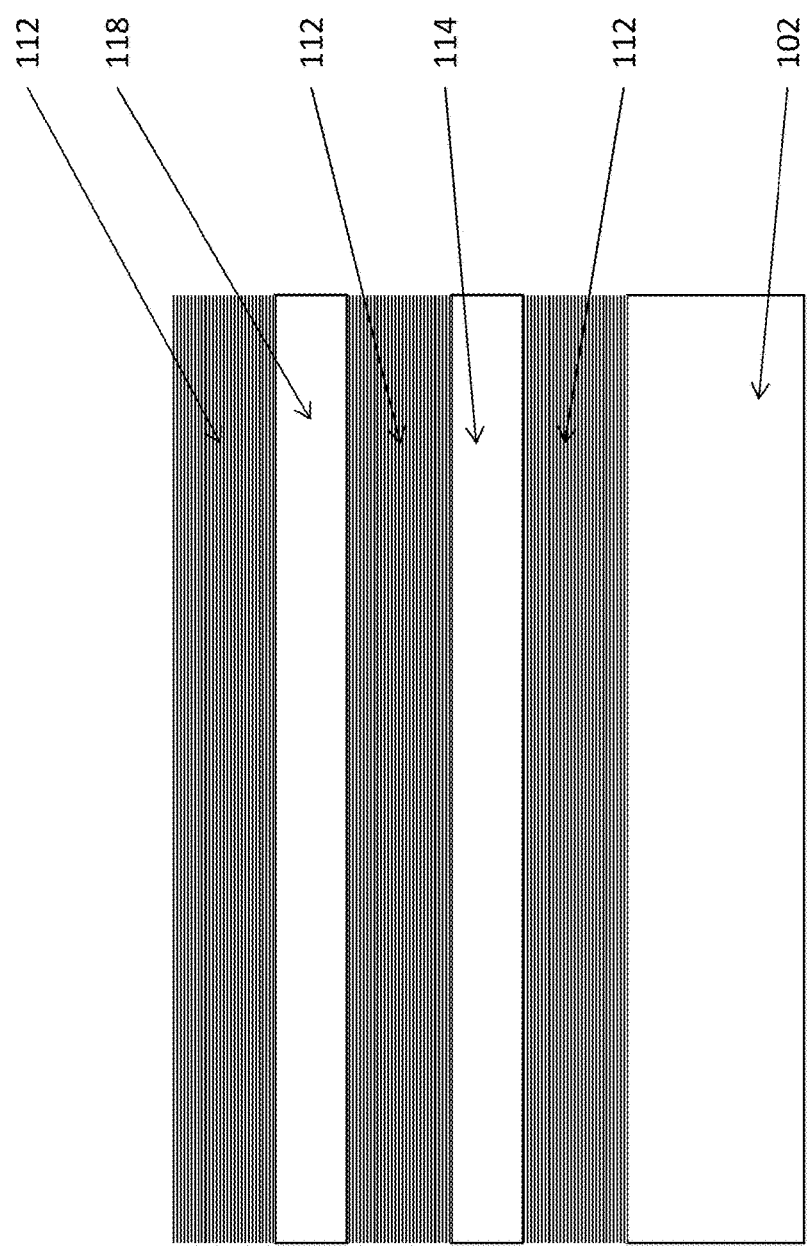
FIGS. 7-23 are schematic diagrams illustrating various exemplary processing steps that can be used to produce the structure shown in FIG. 1.

As noted above, FIGS. 7-23 illustrate various exemplary processing steps that can be used to produce the structure shown in FIG. 1. As shown in FIG. 7, the processing herein forms a multi-layer structure 112, 114 on a substrate 102 to include semiconductor layers 114 (e.g., semiconductively doped silicon) separated by spacer layers 112, which can be SiGe, etc., (e.g., forms a nanosheet stack) using multiple epitaxial growth processes.

Figure 8:
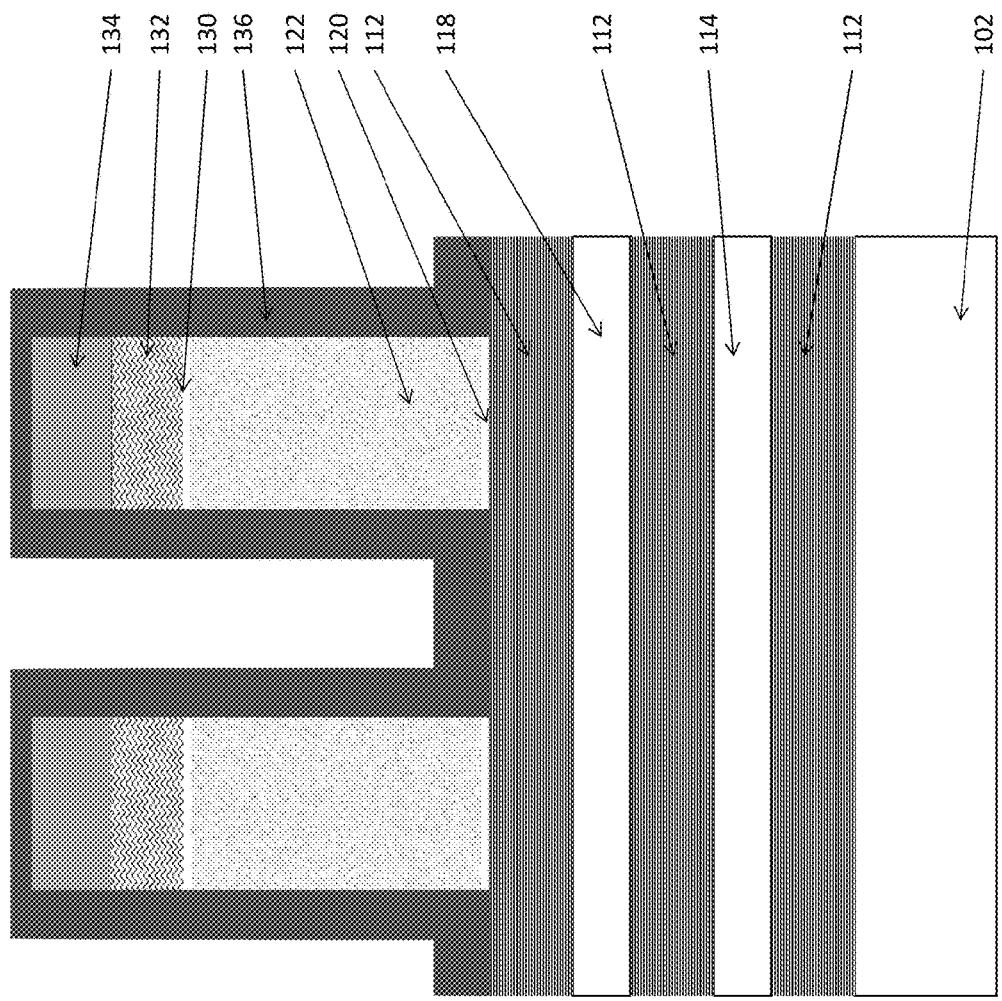
Figure 9:
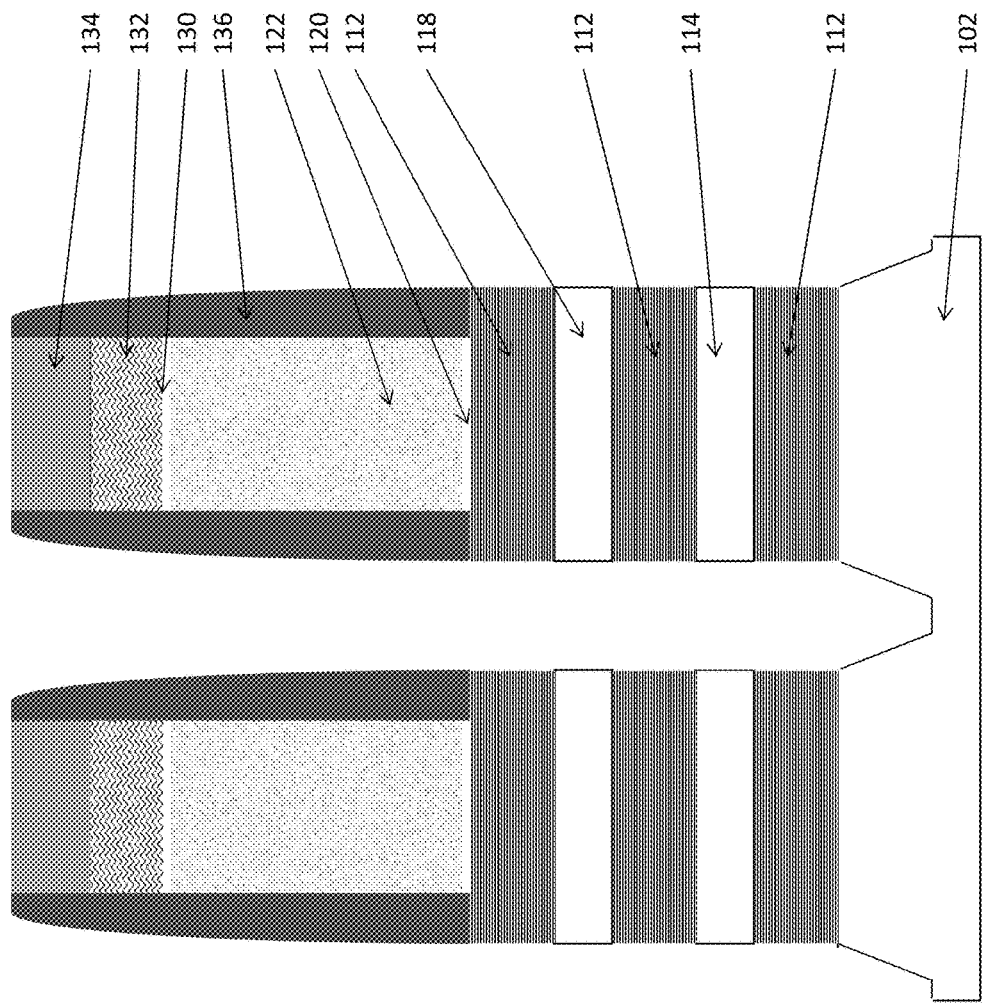
Figure 10:
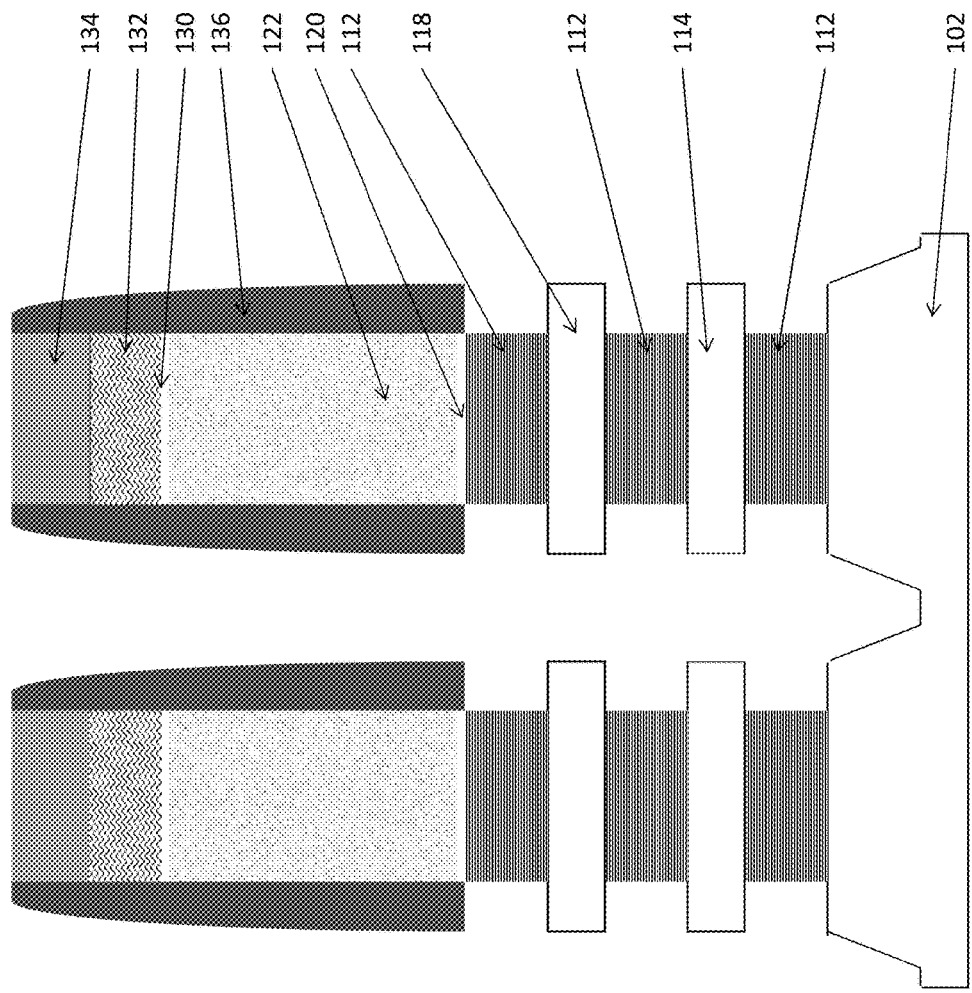

As shown in FIG. 8, these methods form an insulator layer 120 (e.g., an oxide) and form additional layers (e.g., amorphous silicon 122, an oxide 130, SiN 132, SiO 134), which are patterned into fins. In FIG. 8, such processing deposits a conformal protective layer 136 (e.g., SiBCN) over the fins. In FIG. 9, such processing patterns the multi-layer structure to form recesses through the multi-layer structure extending into the substrate 102, using for example reactive ion etching (RIE). This processing reshapes the protective layer 136 into sidewall spacers 136. In FIG. 10, the spacer layers 112 are reduced in width using processing that selectively removes the spacer layer material (e.g., SiGe, etc.) without substantially affecting the other exposed materials, to indent the spacer layers 112 relative to the other materials.

Figure 11:
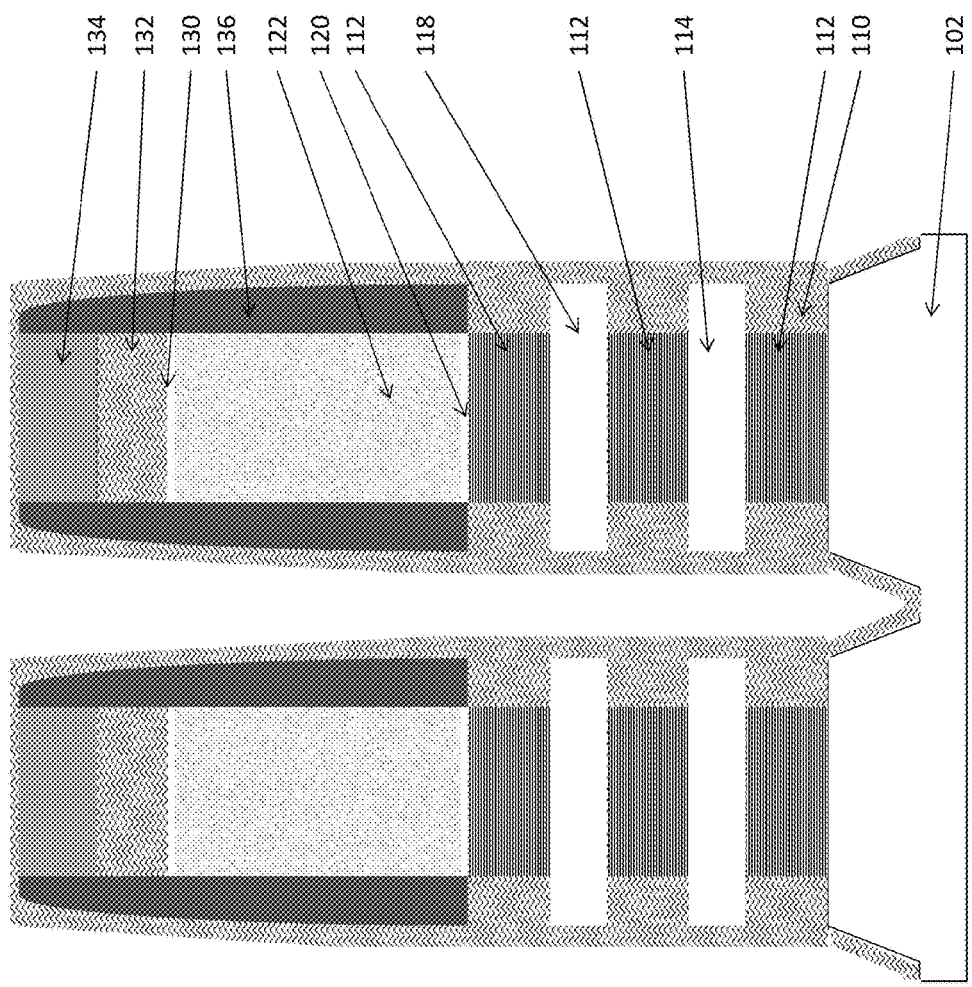
Figure 12:
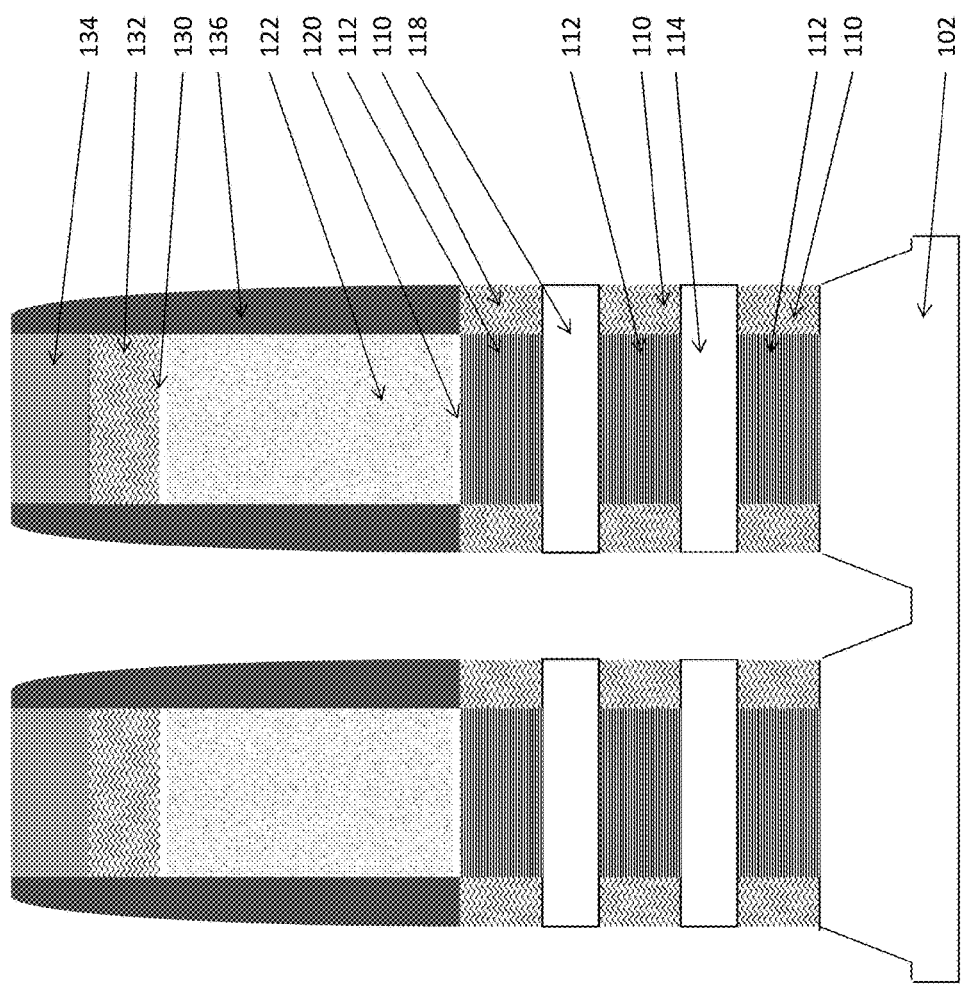
Figure 13:
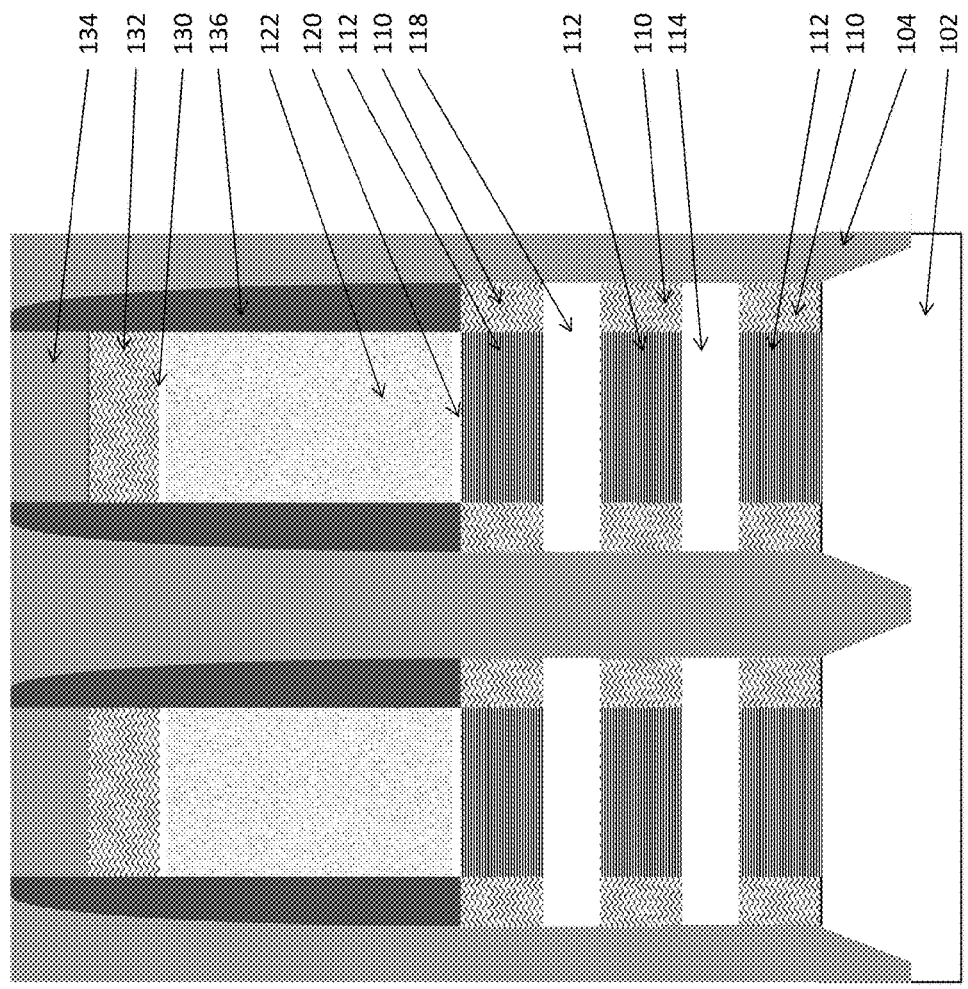
Figure 14:
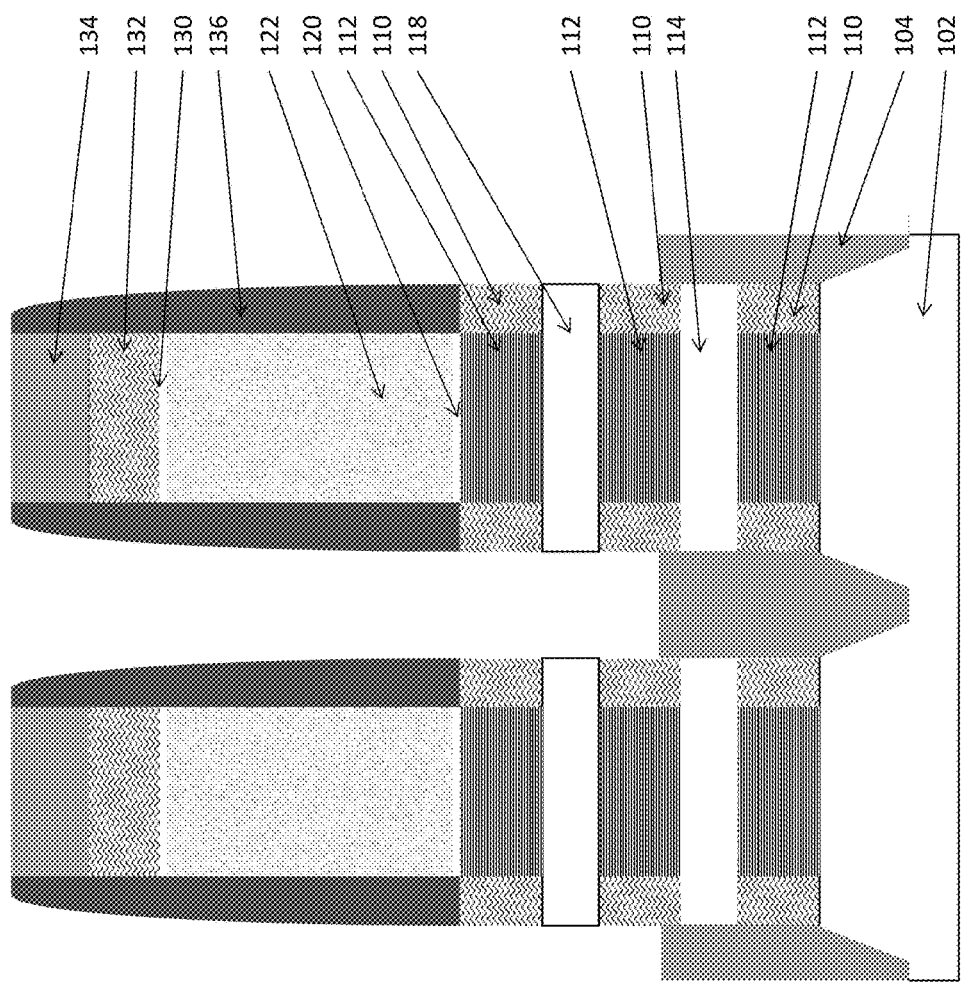

In FIG. 11, a liner dielectric 110 is formed over the fins using, for example, a conformal deposition of SiN, etc., (using processing such as in-situ radical assisted deposition (iRAD) of oxide to form, for example, a 60A layer, etc.). In FIG. 12, the liner dielectric 110 is self-aligned to the shape of the conformal protective layer 136 in a material removal process (e.g., an etch back process, for example of $H_3PO_4$ at 165° C., etc.). Next, as shown in FIG. 13, this processing forms an isolation insulator 104 over the structure by, for example, depositing a thick conformal oxide liner (e.g., SiO, etc.) in processing such as flowable chemical vapor deposition (FCVD), anisotropic high density plasma (HDP) processing, etc. Note that this step may result in a different geometry from shown, or may not completely fill between the gates. In FIG. 14, the isolation insulator 104 is recessed down to a level above the lower semiconductor layer 114 (which will eventually become an nFET in this example), using processing such as oxide anisotropic recess (e.g., hybrid wet (BHF)/dry pulsing etch-deposition ($C_4F_6+O_2$/CO/Ar), etc.), a fully isotropic etch, or combinations thereof.

Figure 15:
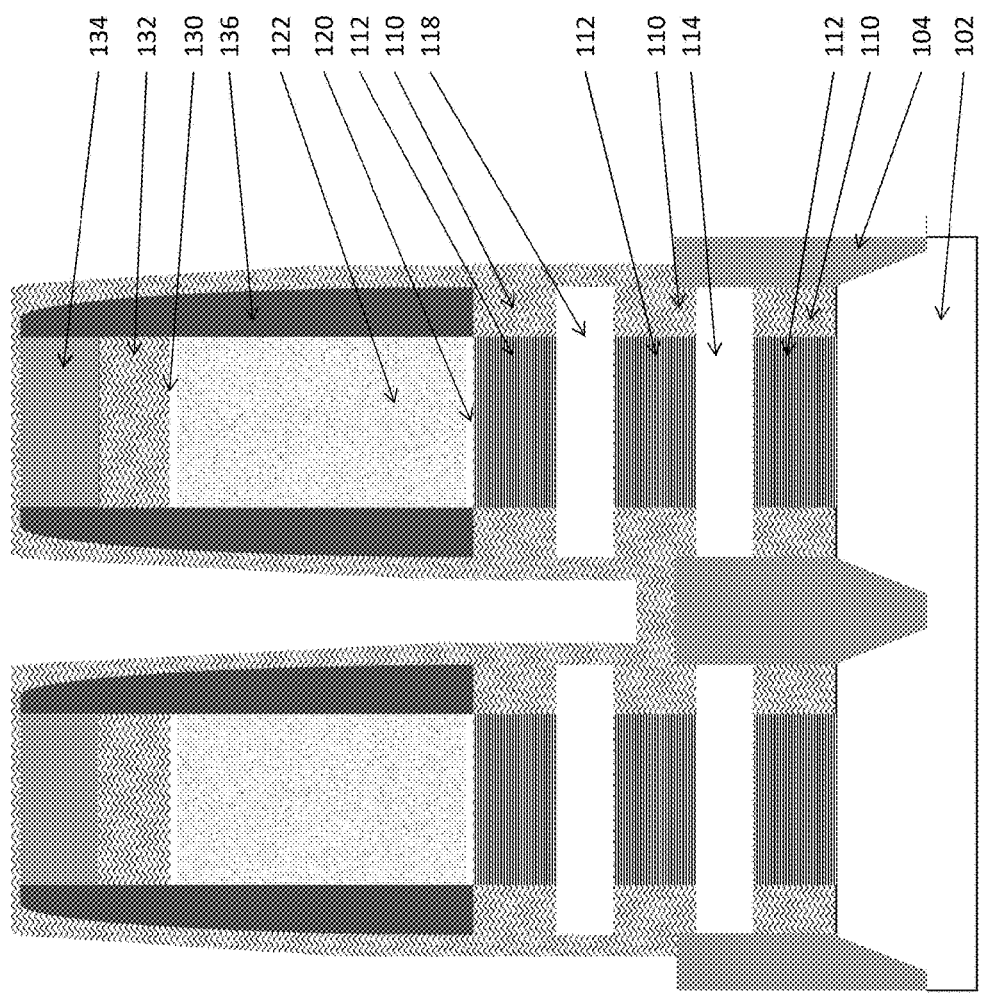
Figure 16:
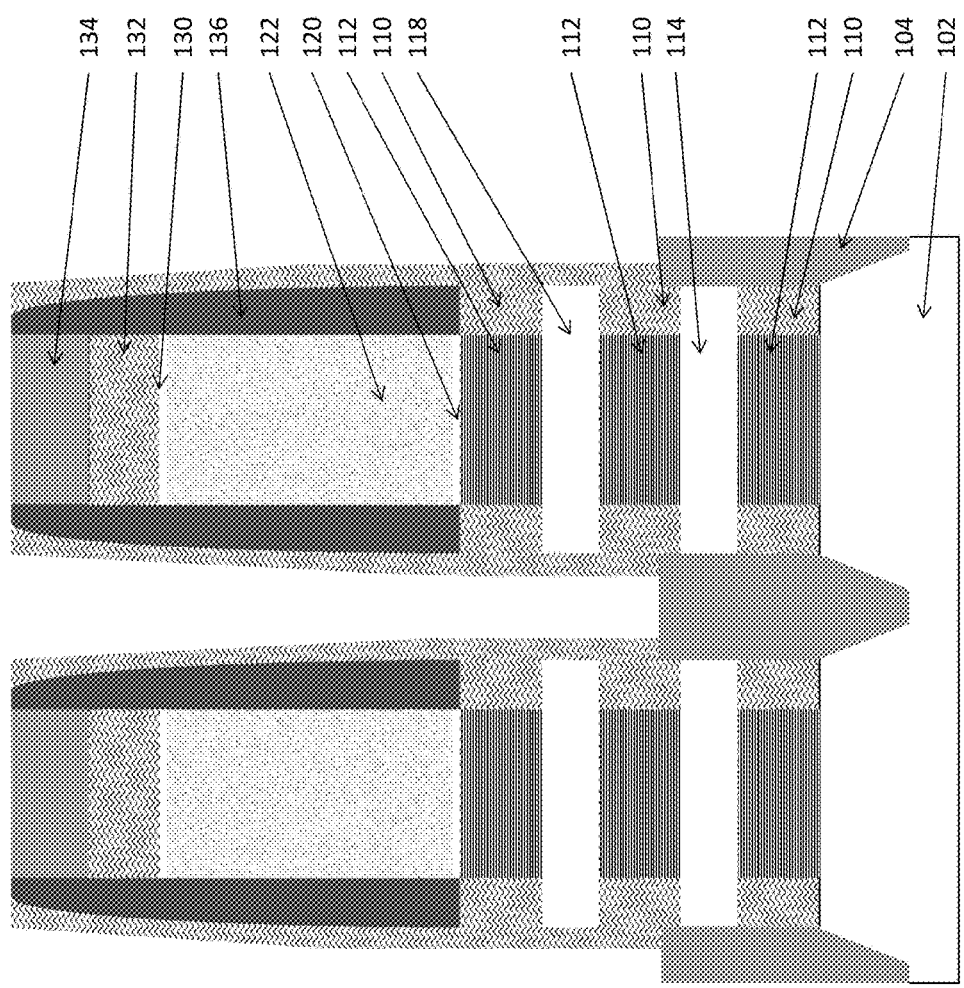
Figure 17:
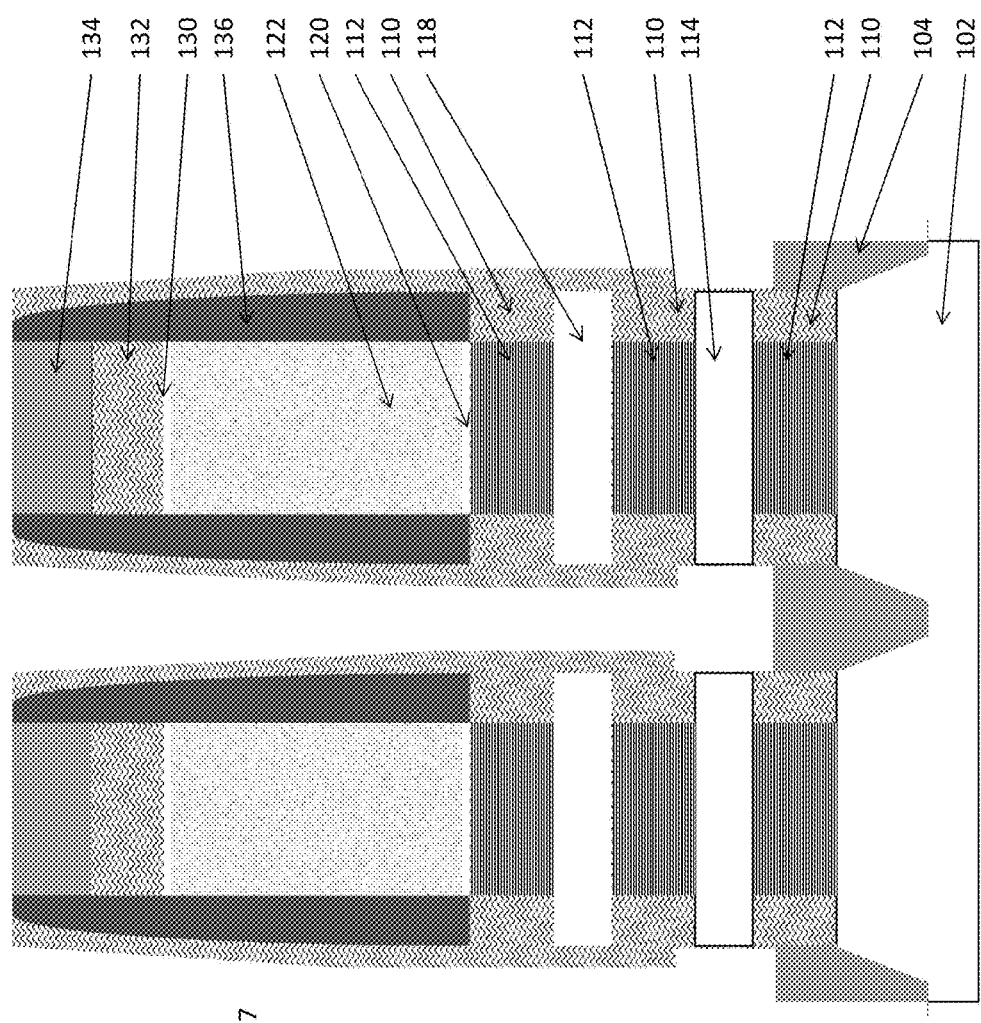
Figure 18:
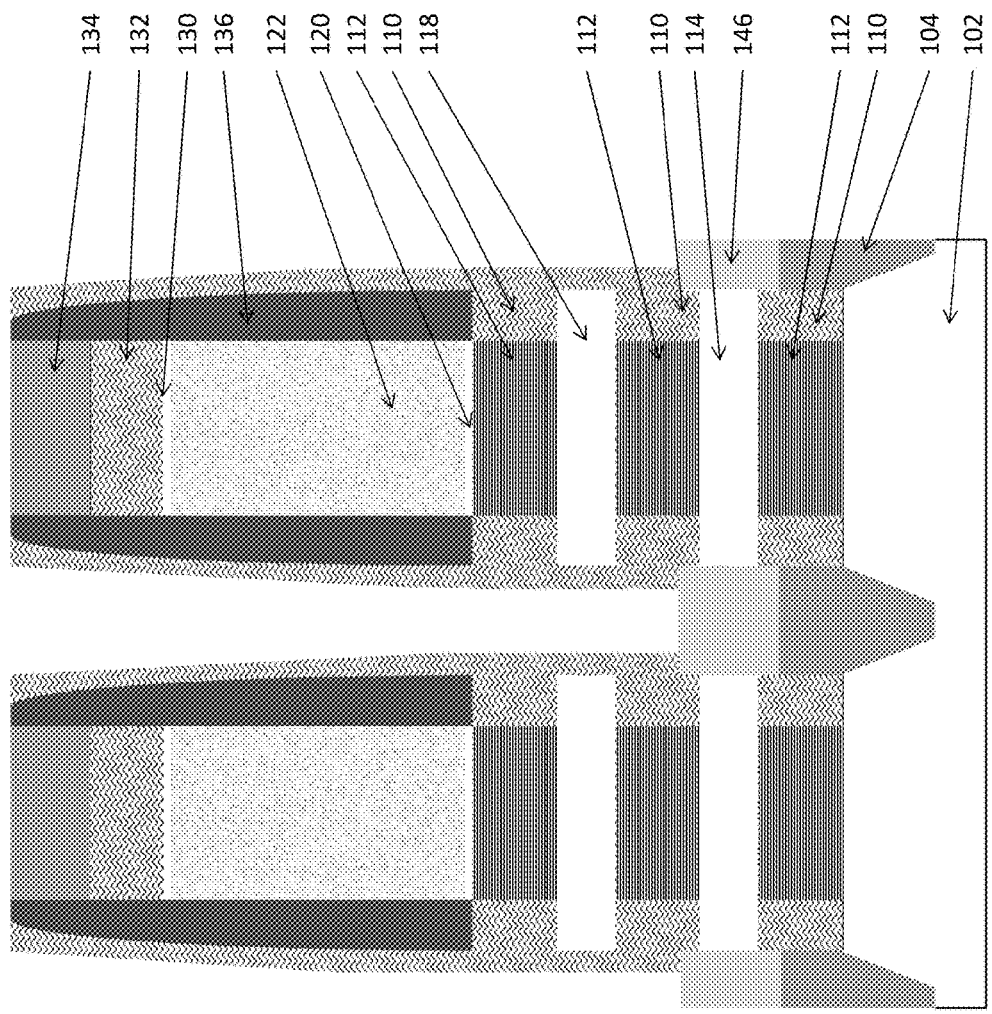

The upper semiconductor layer 118 (which will eventually become a pFET in this example) is encapsulated by conformally forming additional amounts of the liner dielectric 110, as shown in FIG. 15. Again, as discussed with respect to FIG. 11, the liner dielectric 110 can be formed using iRAD of oxide (e.g., to form, for example, a 4 nm layer, etc.). Subsequently, as shown in FIG. 16, the liner dielectric 110 is etched to be removed from the tops of the isolation insulator 104 (e.g., in an anisotropic etch back, such as reactive ion etching (RIE) Ge implant with selective recess, etc.). In FIG. 17, with the isolation insulator 104 exposed, a material removal process (e.g., oxide isotropic recess (BHS)) is performed to remove the isolation insulator 104 down to a level between the lower semiconductor layer 114 and the substrate 102, thereby exposing the sides of the lower semiconductor layer 114. Note that the upper semiconductor layer 118 is still protected at this stage, by the liner dielectric 110, as shown in FIG. 17. With the sides of the lower semiconductor layer 114 exposed, and the upper semiconductor layer 118 is still protected, as shown in FIG. 18, the source/drain regions 146 of the lower transistor are epitaxially grown on exposed surface of the lower semiconductor layer 114 to include an nFET source/drain type dopant (e.g., Si:P).

Figure 19:
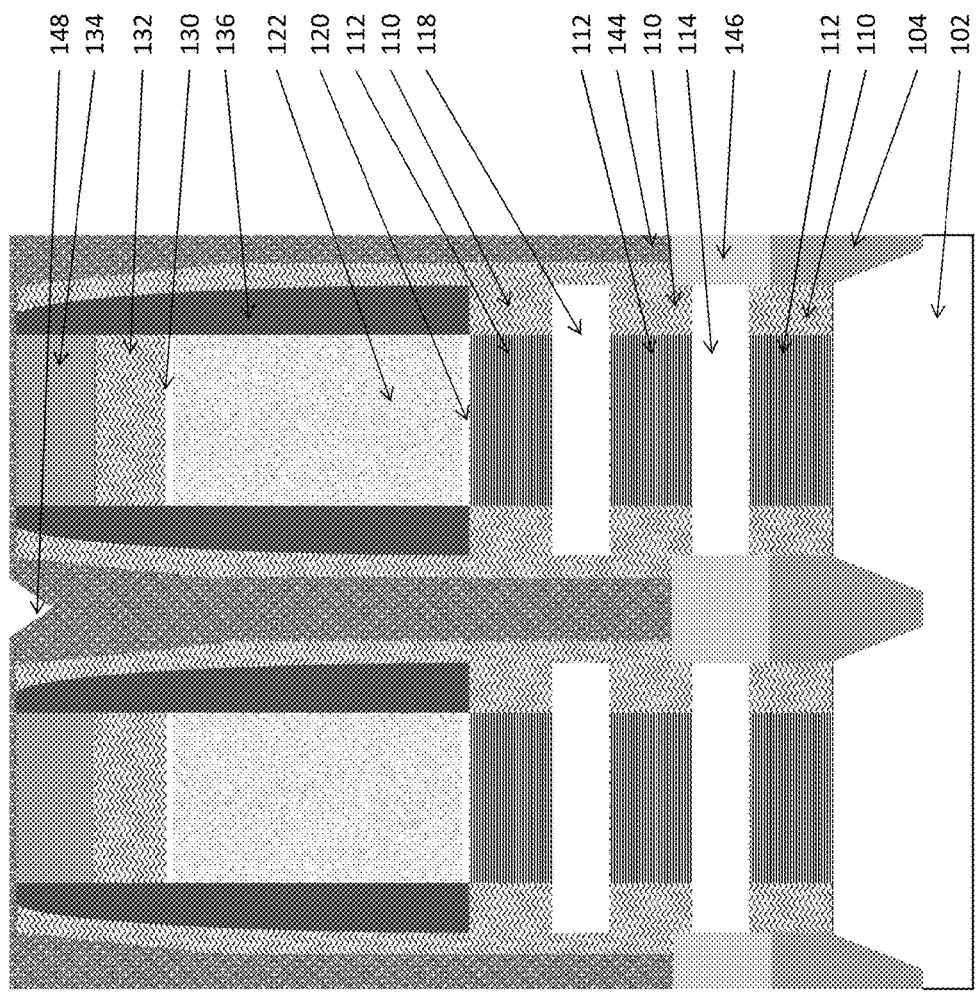
Figure 20:
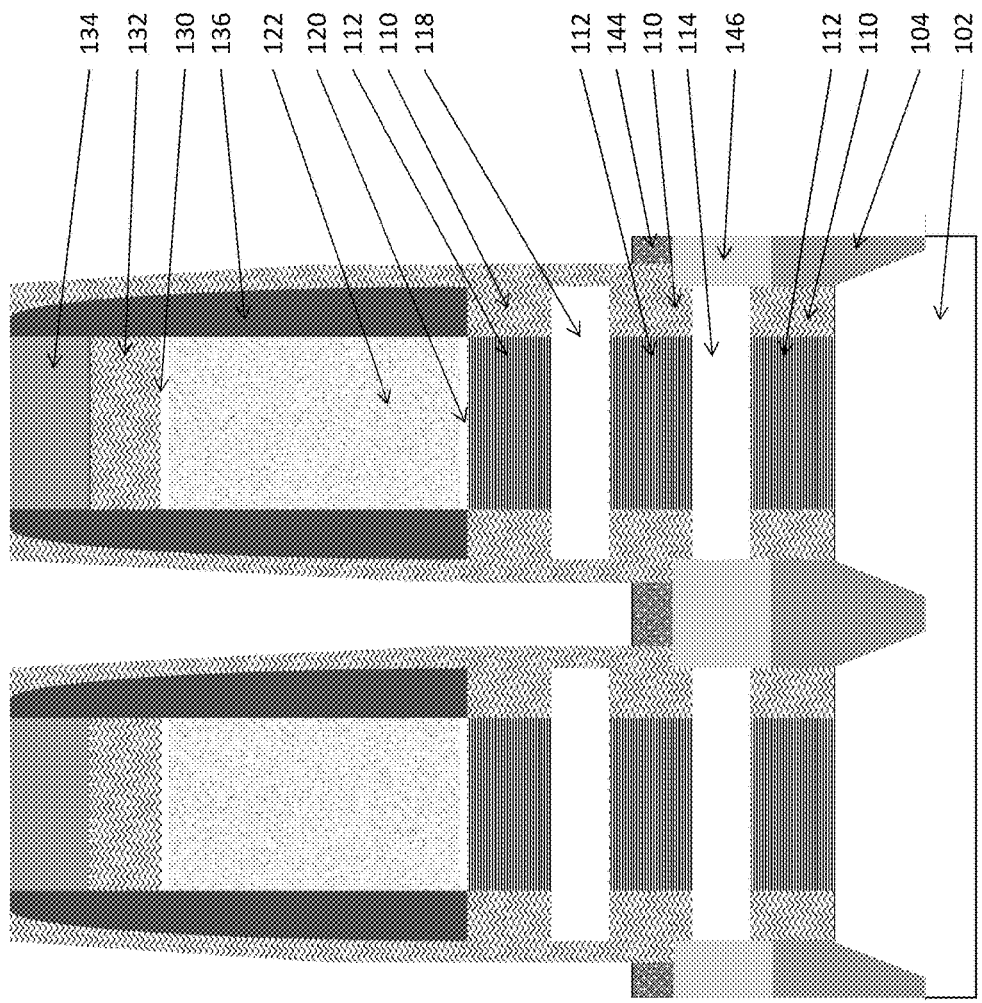
Figure 21:
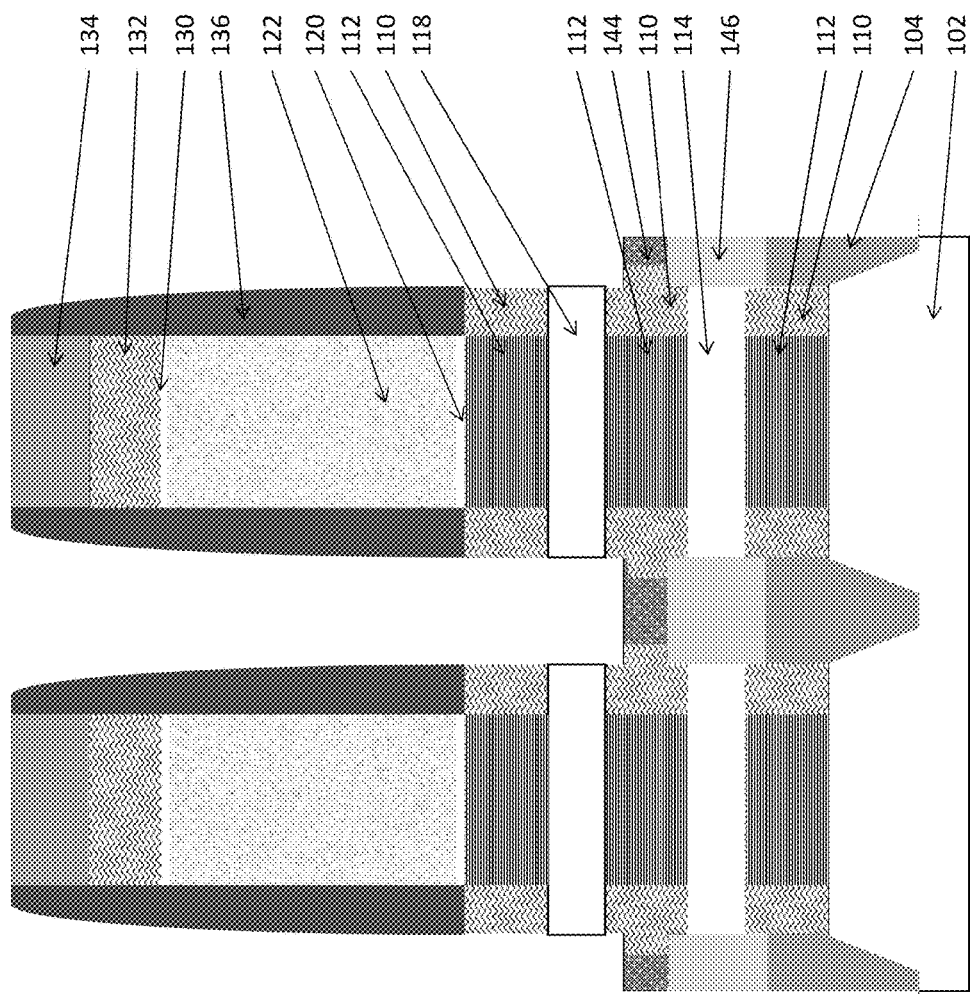

As shown in FIG. 19, an isolation layer material 144 is formed over the structure, using processing such as conformal deposition of $SiO_2$, SiBCN, SiOC, SiOCN, etc. Note that multiple layers may be used, which may be dissimilar. Here, the spacer formation provides encapsulation of the lower transistor source/drain 146, and prevents the subsequent upper source/drain 142 nucleation from occurring on the lower transistor source/drain 146. Note that, in some embodiments, as shown in FIG. 19, in region 148, the seam is minimized by overfill at the top, and the isolation layer material 144 is thick enough between the fins to force pinch-off between the subsequently formed gates. The height of the isolation layer material 144 is reduced, as shown in FIG. 20, using processing such as isotropic or anisotropic recessing, etc. Next, as shown in FIG. 21, the liner dielectric 110 is self-aligned to the shape of the conformal protective layer 136 in a material removal process (e.g., an etch back process of $H_3PO_4$ at 165° C., etc.) to expose the upper semiconductor layer 118.

Figure 22:
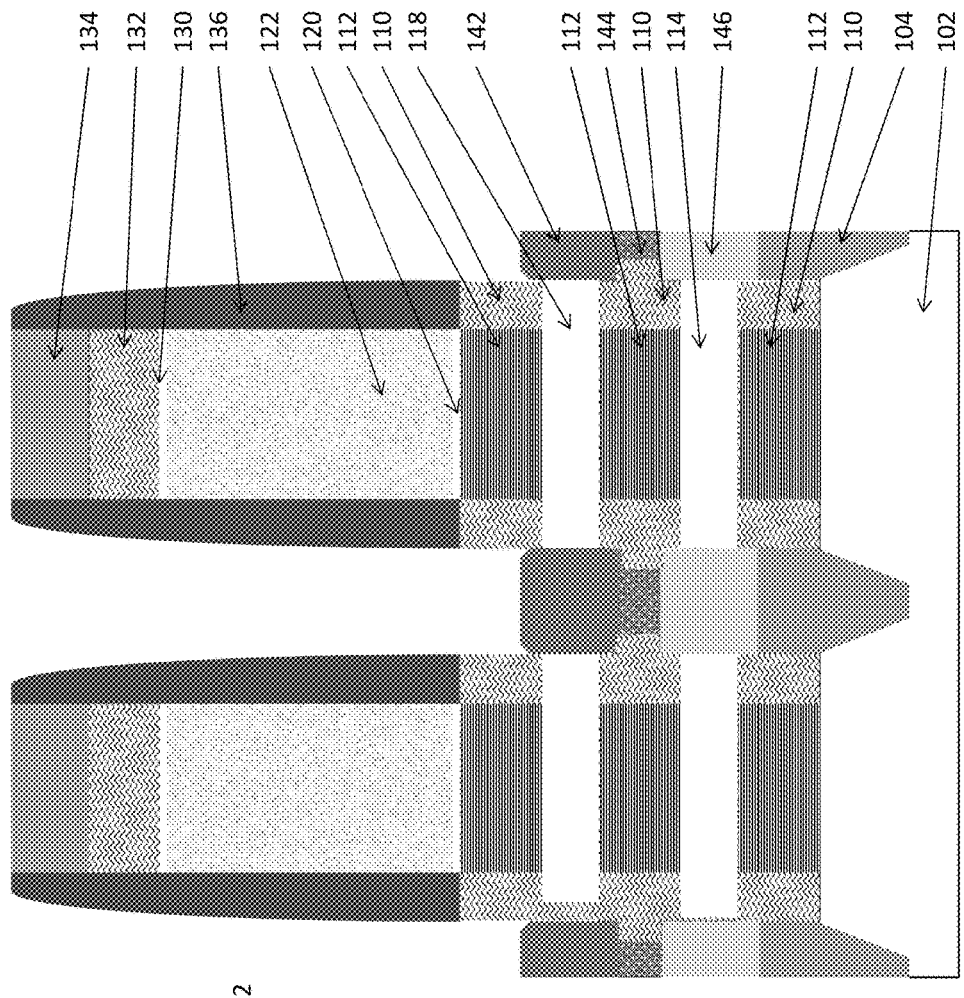
Figure 23:
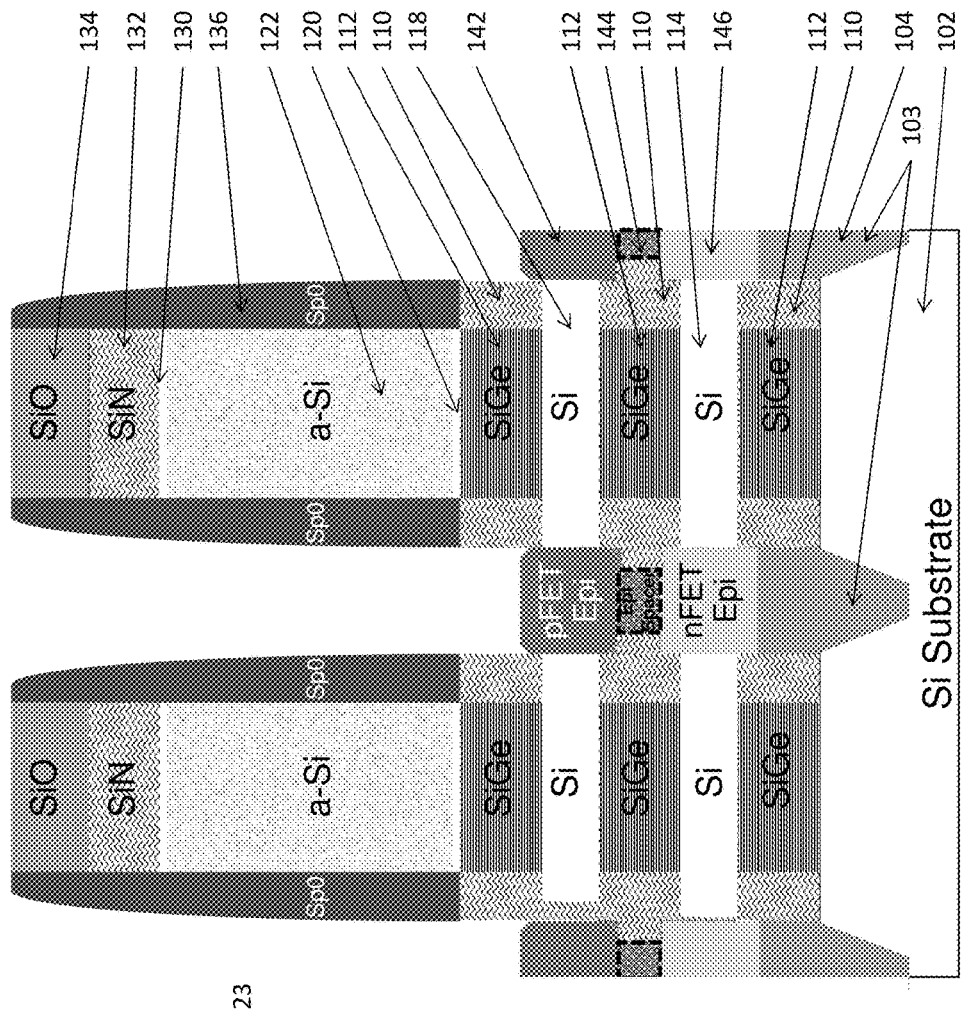

With the sides of the upper semiconductor layer 118 exposed, and the lower semiconductor layer 114 is still protected, as shown in FIG. 22, the source/drain regions 142 of the upper transistor are epitaxially grown on exposed surfaces of the upper semiconductor layer 118 to include a pFET source/drain type dopant (e.g., SiGe:B). FIG. 23 illustrates the same structure shown in FIG. 22; however, in FIG. 23, exemplary material identifications are added to the drawing to illustrate one example of some chemical compositions that could be utilized for the different components of the structure (and those ordinarily skilled in the art would understand that other materials could be substituted in place of those shown in this example, without departing from the structures identified by the claims presented below). Additionally, FIG. 23 illustrates the portion of the isolation insulator 104 that extends into the substrate 102 and forms the isolation plugs 103. The structure shown in FIGS. 22 and 23 is then additionally processed to remove the materials above and around the semiconductor layers 114, 118 (materials 112, 120, 122, 130, 132, 134 that are described above) and replace such components with the gate conductor 150 (described above), and various gate insulators 152 (e.g., oxides), and other conductive contacts 154, resulting in the structure shown in FIG. 1.

As mentioned above, FIGS. 24-31 are schematic diagrams illustrating various exemplary processing steps that can be used to produce the structure shown in FIG. 2. Note that the structures shown in FIGS. 2 and 24-31 do not utilize the isolation plugs 103; and instead, in this embodiment the substrate includes (or is attached to) a buried insulator layer 160 (which can be any type of dielectric that provides greater electrical insulation relative to the substrate 102 alone, and for convenience is simply referred to herein as a buried oxide layer (BOX)). Therefore, in the example shown in FIGS. 2 and 24-31, the isolation element is the BOX 160, instead of the isolation plugs 103.

Figure 24:
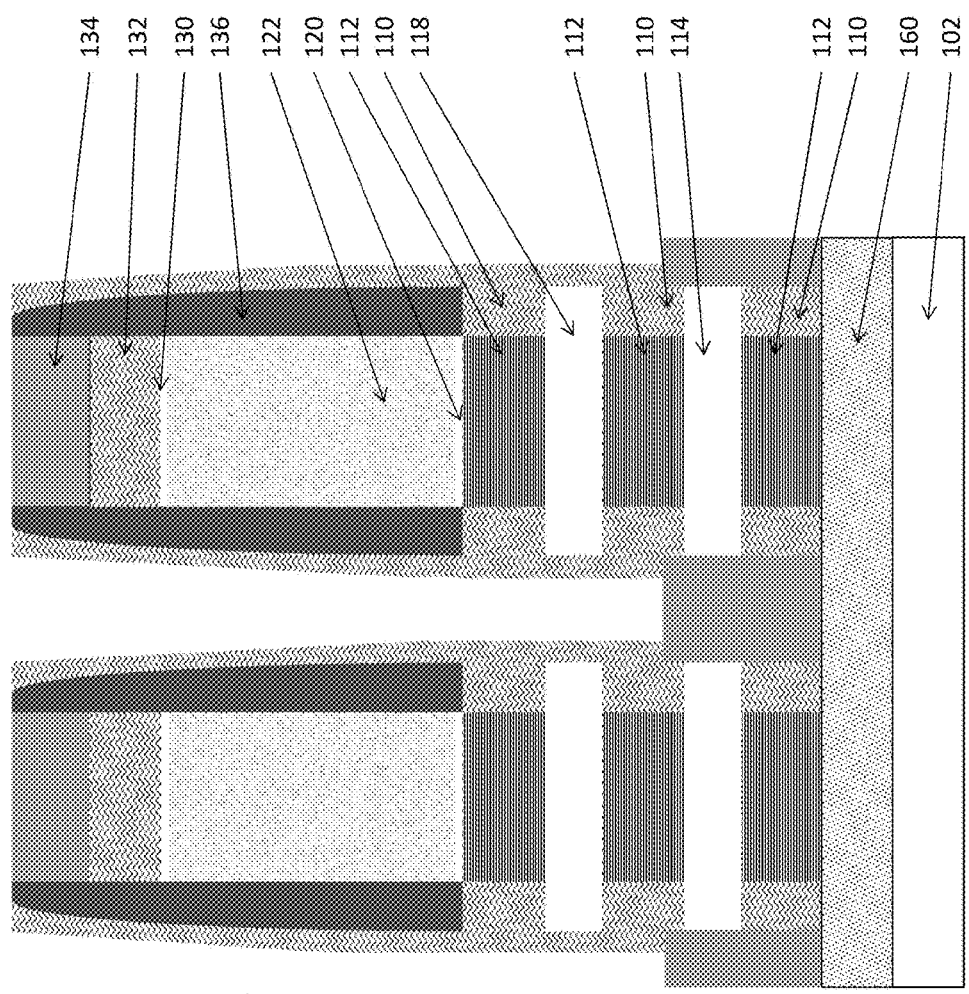
FIGS. 24-31 are schematic diagrams illustrating various exemplary processing steps that can be used to produce the structure shown in FIG. 2.
Figure 25:
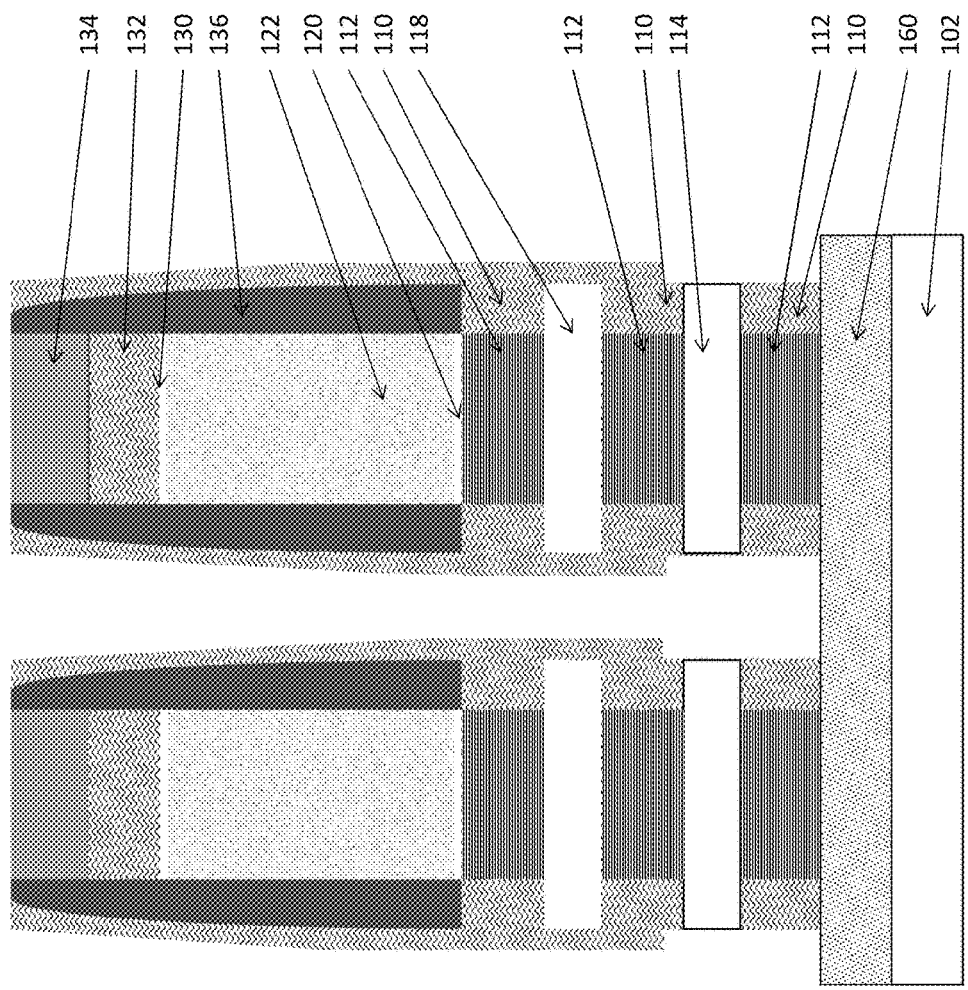
Figure 26:
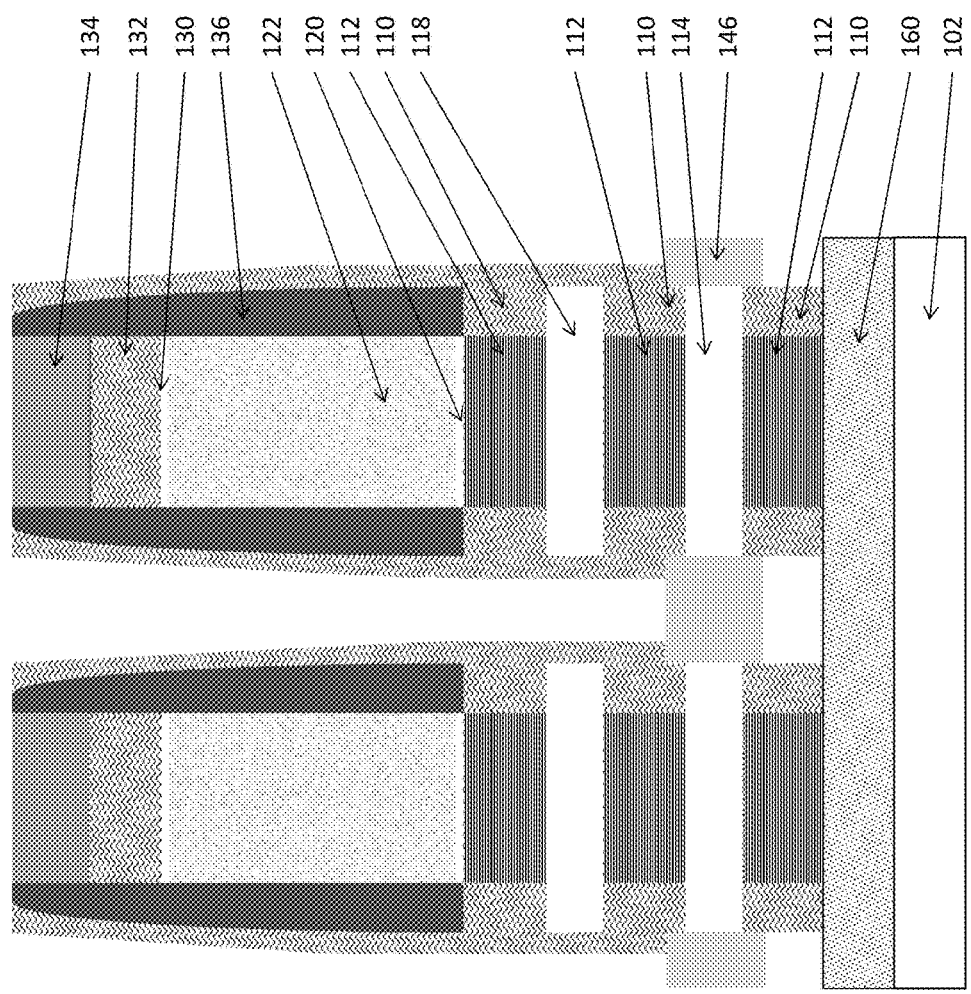

FIG. 24 illustrates the structure after processing similar to that shown in FIGS. 7-16 has been completed (again, however, with the inclusion of the BOX 160 in place of the isolation plugs 103) and a redundant discussion/illustration of such processing is avoided to maintain focus on the salient aspects of this embodiment. In FIG. 25, the isolation insulator 104 is fully recessed down to the BOX 160, using processing such as oxide anisotropic recess (e.g., hybrid wet (BHF)/dry pulsing etch-deposition ($C_4F_6+O_2$/CO/Ar), etc.). Here, the isolation insulator 104 can be fully removed because the bottom BOX 160 already provides isolation from the substrate 102. Note that the upper semiconductor layer 118 is still protected here, by the liner dielectric 110, as shown in FIG. 25. With the sides of the lower semiconductor layer 114 exposed, and the upper semiconductor layer 118 is still protected, as shown in FIG. 26, the source/drain regions 146 of the lower transistor are epitaxially grown on exposed surface of the lower semiconductor layer 114 to include an nFET source/drain type dopant (e.g., Si:P).

Figure 27:
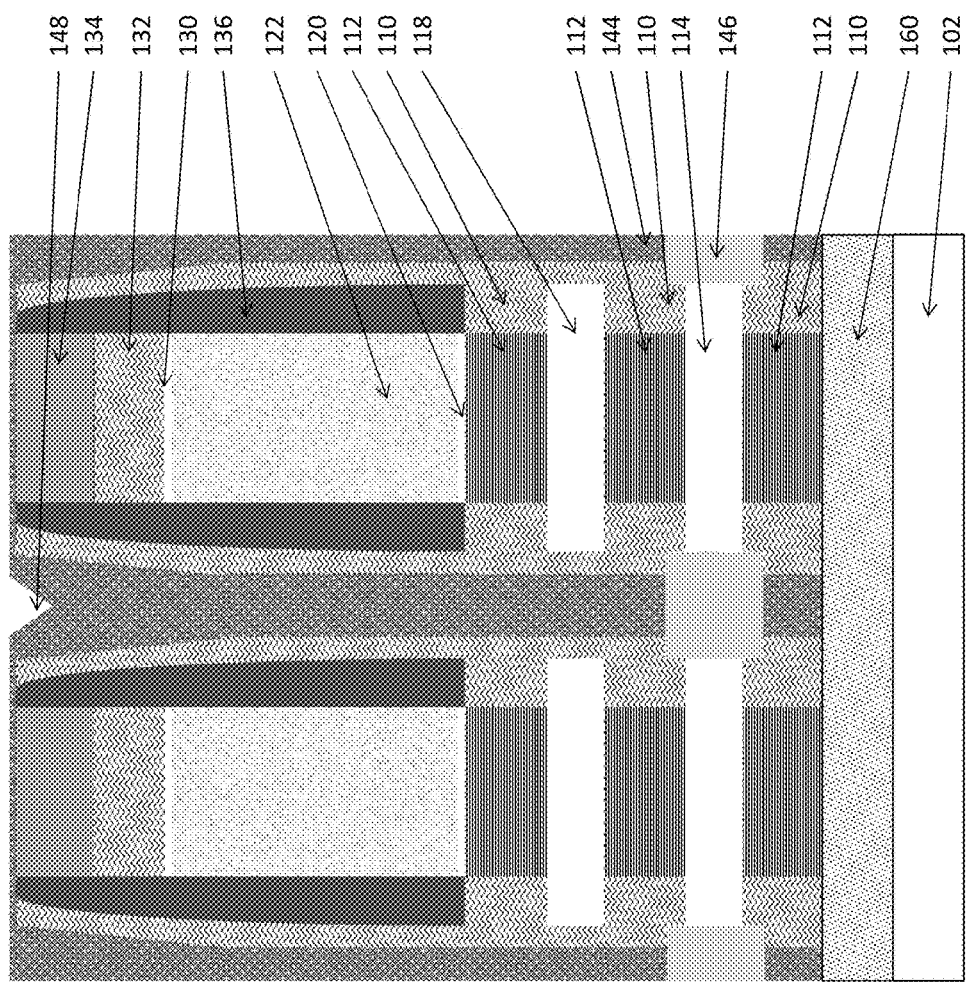
Figure 28:
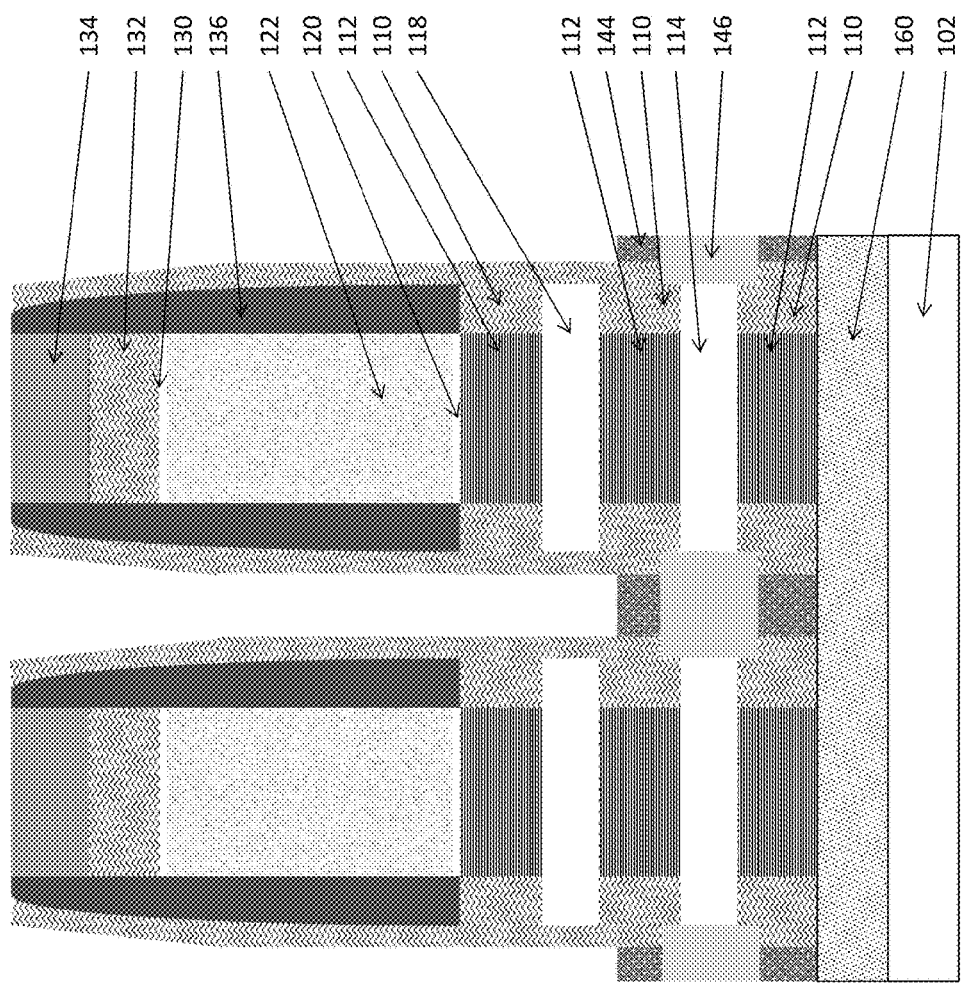
Figure 29:
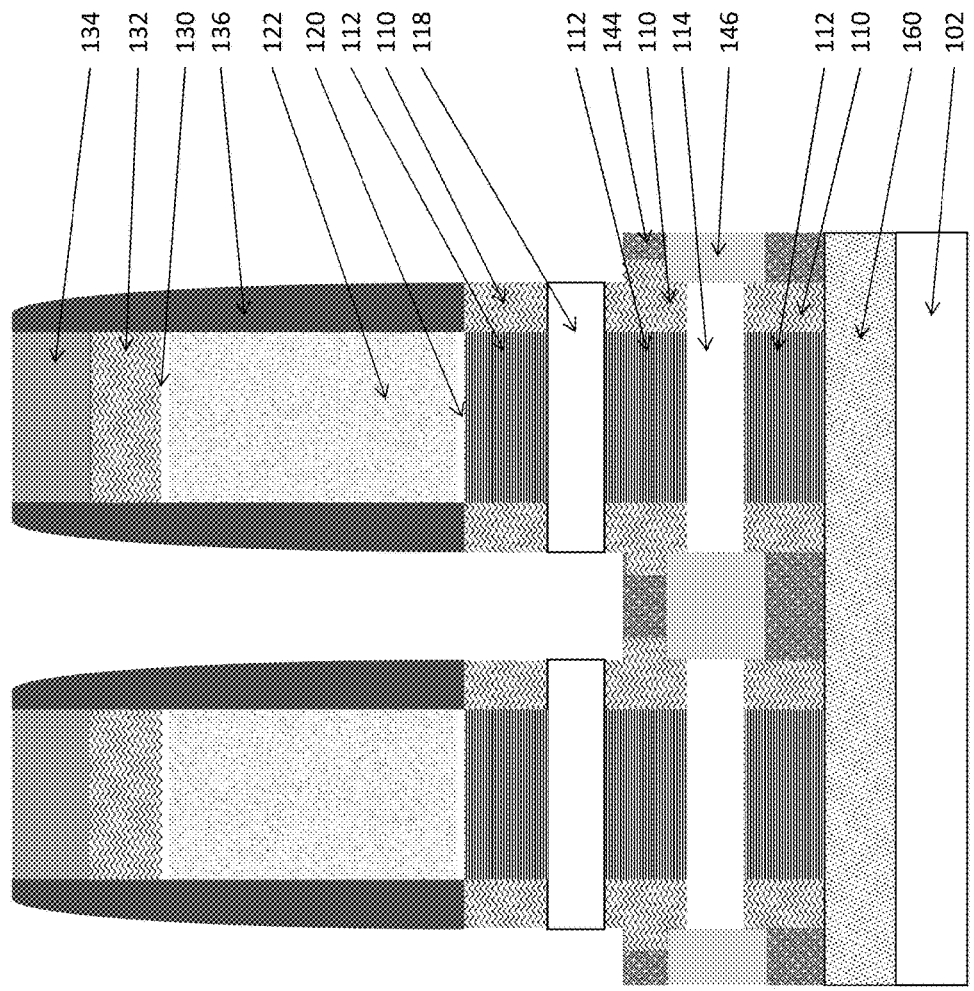

Next, in FIG. 27, an isolation layer material 144 is formed over the structure, using processing such as conformal deposition of $SiO_2$, SiBCN, SiOC, SiOCN, etc. Here, the conformal deposition provides encapsulation of the lower transistor source/drain 146, and prevents the subsequent upper source/drain 142 nucleation from occurring on the lower transistor source/drain 146. Note that, as shown in FIG. 27, in region 148, the seam is minimized by overfill at the top, and the isolation layer material 144 is thick enough between the fins to force pinch-off between the subsequently formed gates. The height of the isolation layer material 144 is reduced, as shown in FIG. 28, using processing such as anisotropic recessing, etc. Next, as shown in FIG. 29, the liner dielectric 110 is self-aligned to the shape of the conformal protective layer 136 in a material removal process (e.g., an etch back process of $H_3PO_4$ at 165° C., etc.) to expose the upper semiconductor layer 118.

Figure 30:
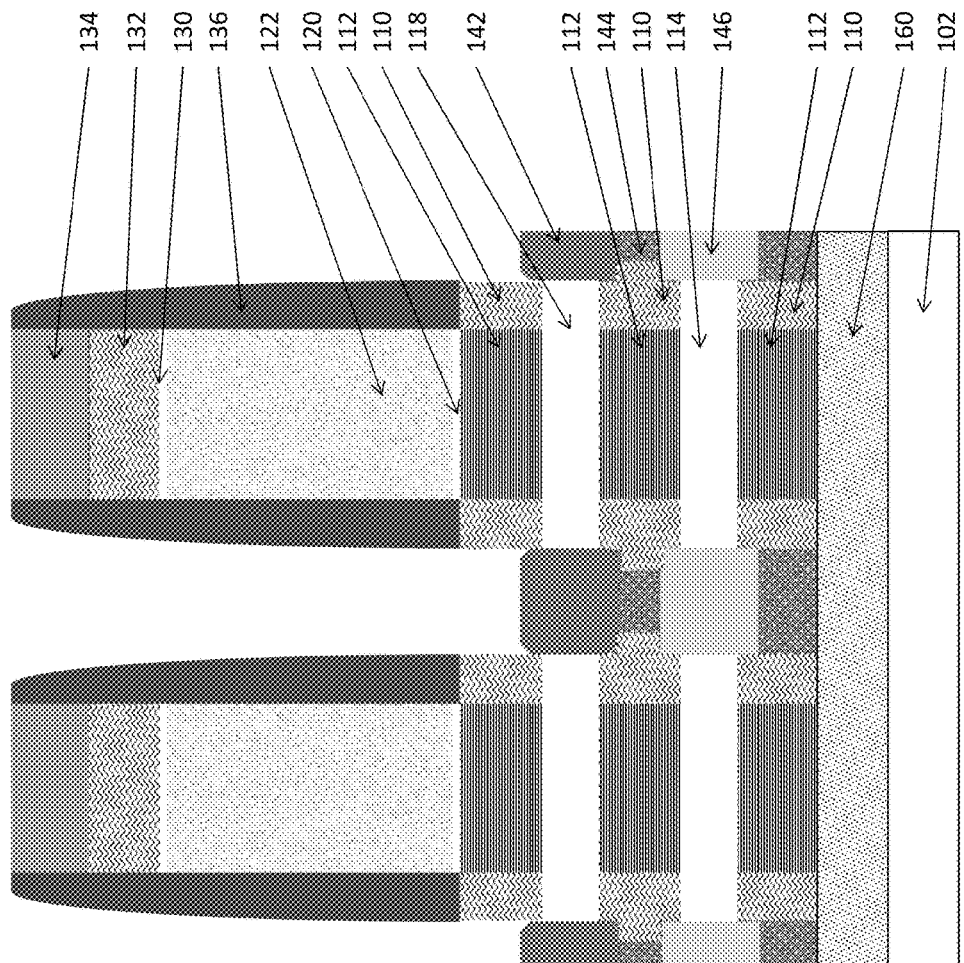
Figure 31:
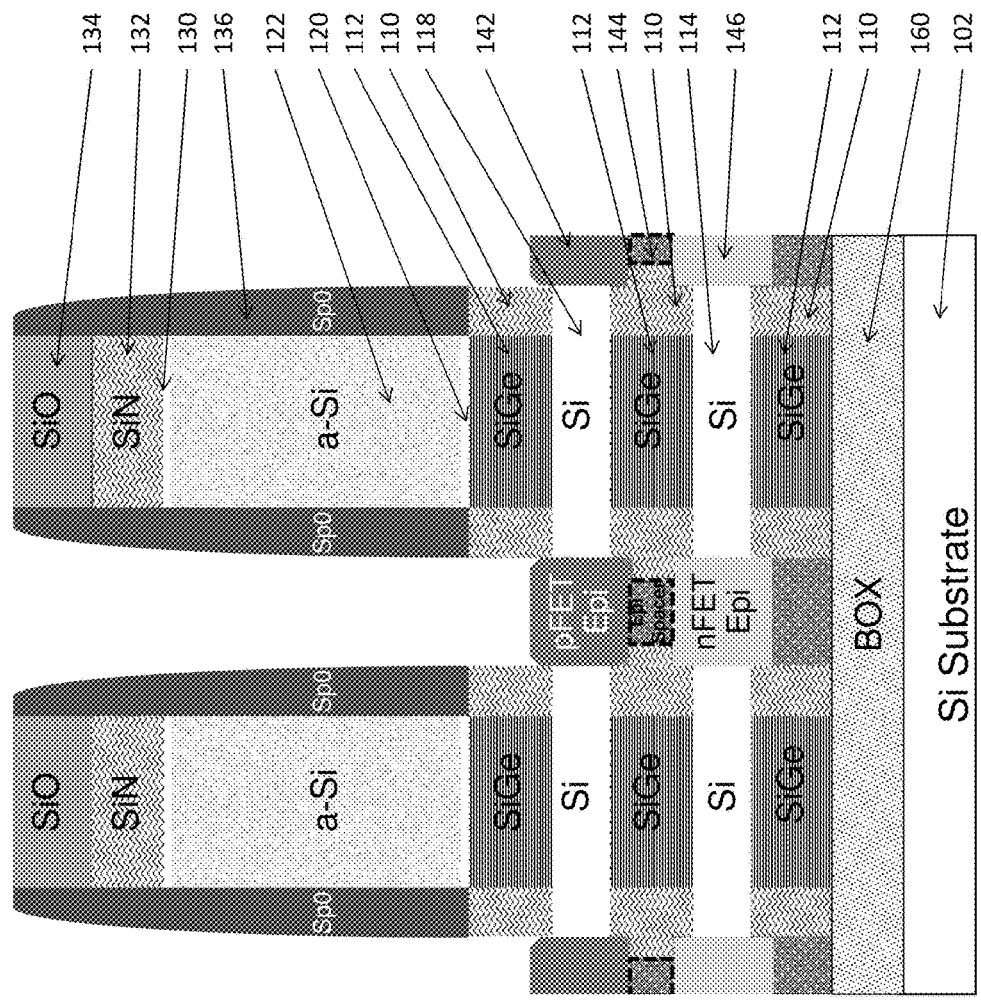

With the sides of the upper semiconductor layer 118 exposed, and the lower semiconductor layer 114 is still protected, as shown in FIG. 30, the source/drain regions 142 of the upper transistor are epitaxially grown on exposed surfaces of the upper semiconductor layer 118 to include a pFET source/drain type dopant (e.g., SiGe:B). FIG. 31 illustrates the same structure shown in FIG. 30; however, in FIG. 31, exemplary material identifications are added to the drawing to illustrate one example of some chemical compositions that could be utilized for the different components of the structure (and those ordinarily skilled in the art would understand that other materials could be substituted in place of those shown in this example, without departing from the structures identified by the claims presented below). The structure shown in FIGS. 30 and 31 is then additionally processed to remove the materials above and around the semiconductor layers 114, 118 (materials 112, 120, 122, 130, 132, 134 that are described above) and replace such components with the gate conductor 150 (described above), and various gate insulators 152 (e.g., oxides), and other conductive contacts 154, resulting in the structure shown in FIG. 2.

As mentioned above, FIGS. 32-36 are schematic diagrams illustrating various exemplary processing steps that can be used to produce the structure shown in FIG. 3. Note that the structures shown in FIGS. 3 and 32-36 again utilize the isolation plugs 103 instead of the buried insulator layer 160. Therefore, in the example shown in FIGS. 3 and 32-36, the isolation elements are the isolation plugs 103, instead of the BOX 160.

Figure 32:
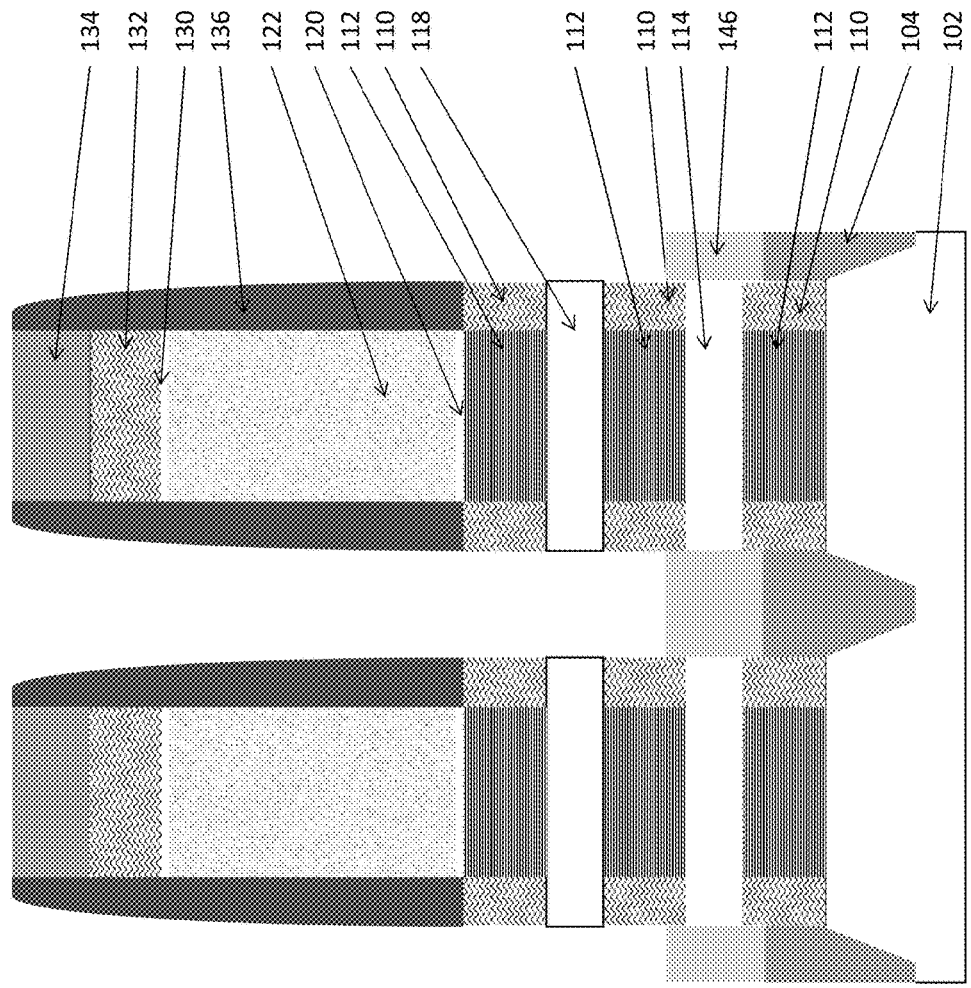
FIGS. 32-36 are schematic diagrams illustrating various exemplary processing steps that can be used to produce the structure shown in FIG. 3.
Figure 33:
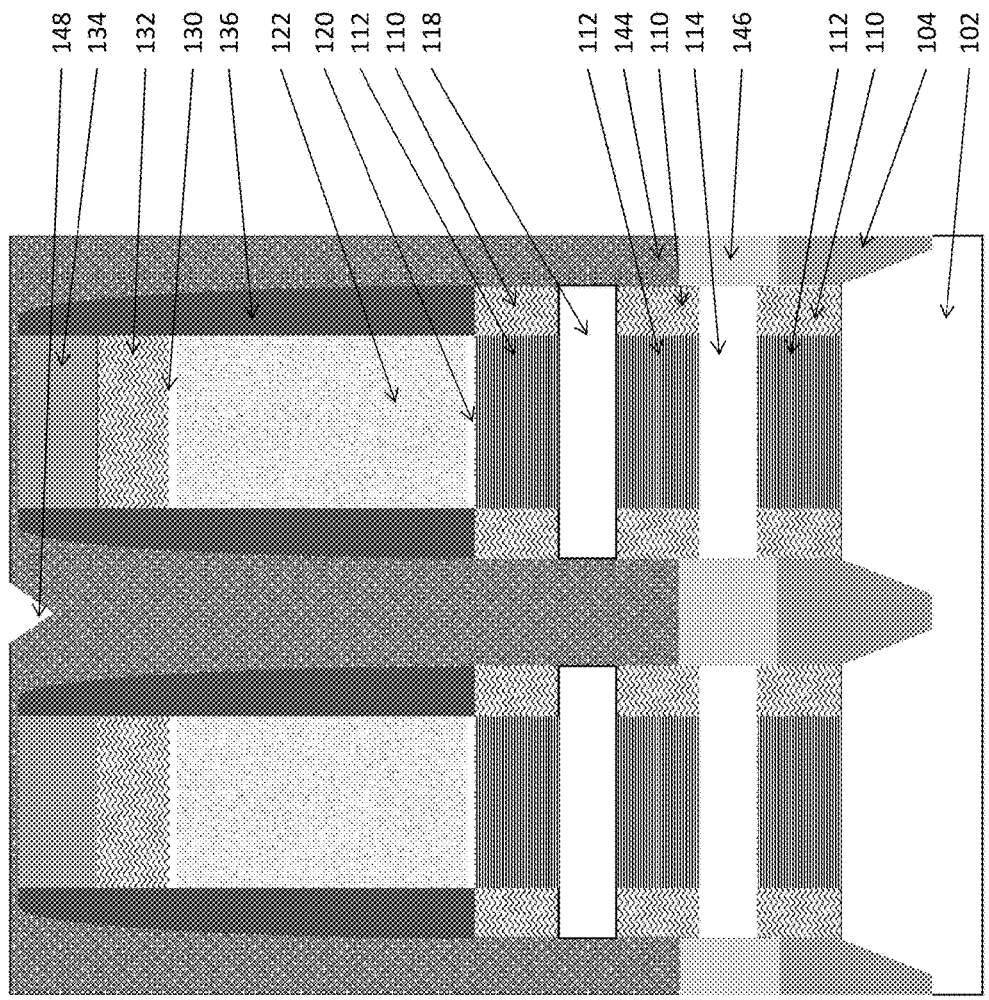
Figure 34:
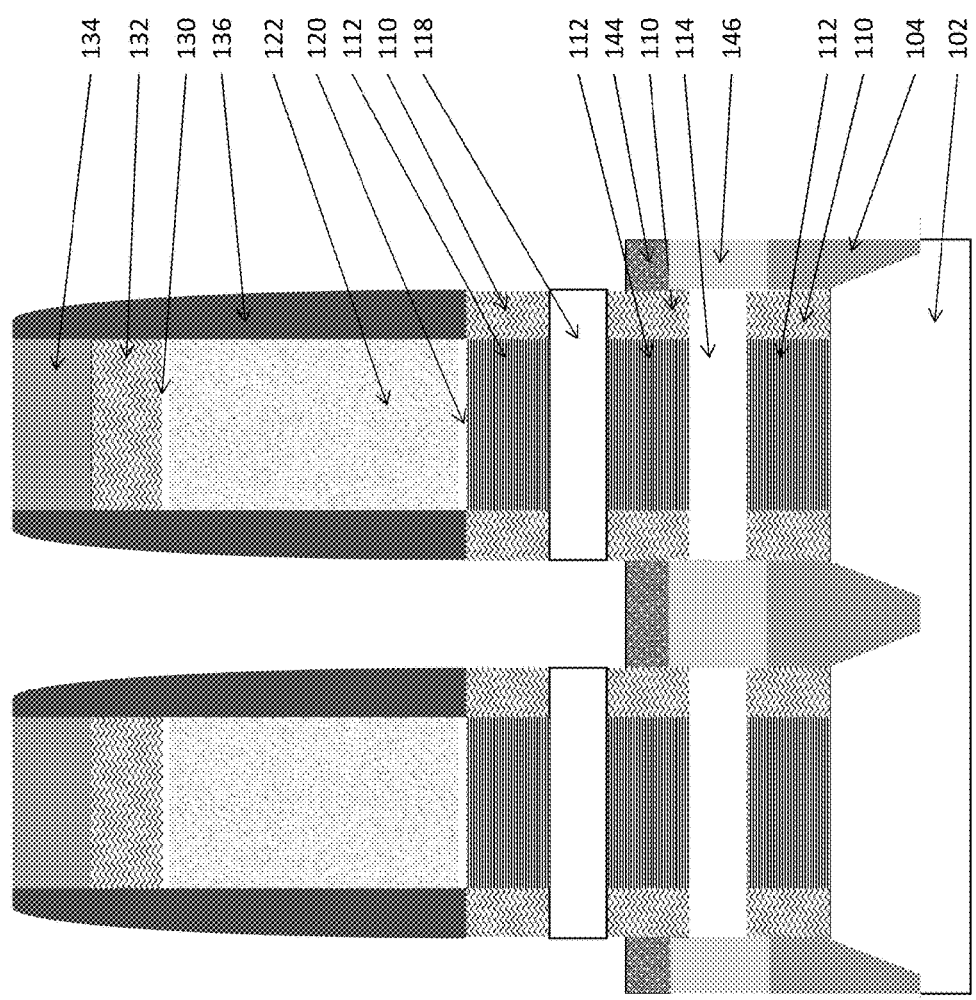

FIG. 32 illustrates the structure after processing similar to that shown in FIGS. 7-18 has been completed, except that the portion of the liner dielectric 110 outside the alignment of the spacers 136 has been etched back, where the liner dielectric 110 is self-aligned to the shape of the conformal protective layer 136 in a material removal process (e.g., an etch back process of $H_3PO_4$ at 165° C., etc.), and again a redundant discussion/illustration of such items is avoided to maintain reader focus. Then, in FIG. 33, the isolation layer material 144 is formed over the structure, using processing such as conformal deposition of $SiO_2$, SiBCN, SiOC, SiOCN, etc. Here, the conformal deposition provides encapsulation of the lower transistor source/drain 146, and prevents the subsequent upper source/drain 142 nucleation from occurring on the lower transistor source/drain 146. Note that, as shown in FIG. 33, in region 148, the seam is minimized by overfill at the top, and the isolation layer material 144 is thick enough between the fins to force pinch-off between the subsequently formed gates. The height of the isolation layer material 144 is reduced, as shown in FIG. 34, using processing such as anisotropic recessing, etc., to expose the sides of the upper semiconductor layer 118. With the sides of the upper semiconductor layer 118 exposed, and the lower semiconductor layer 114 is still protected, as shown in FIG. 35, the source/drain regions 142 of the upper transistor are epitaxially grown on exposed surfaces of the upper semiconductor layer 118 to include a pFET source/drain type dopant (e.g., SiGe:B).

Figure 35:
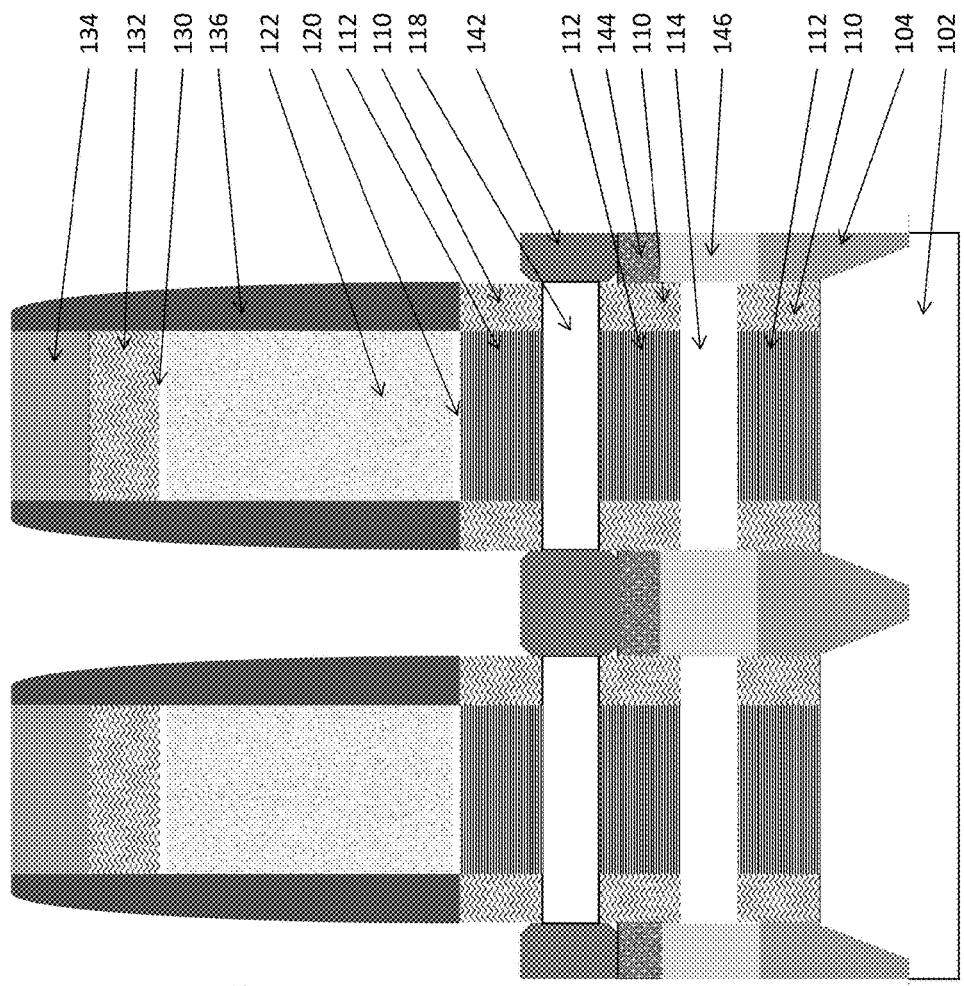
Figure 36:
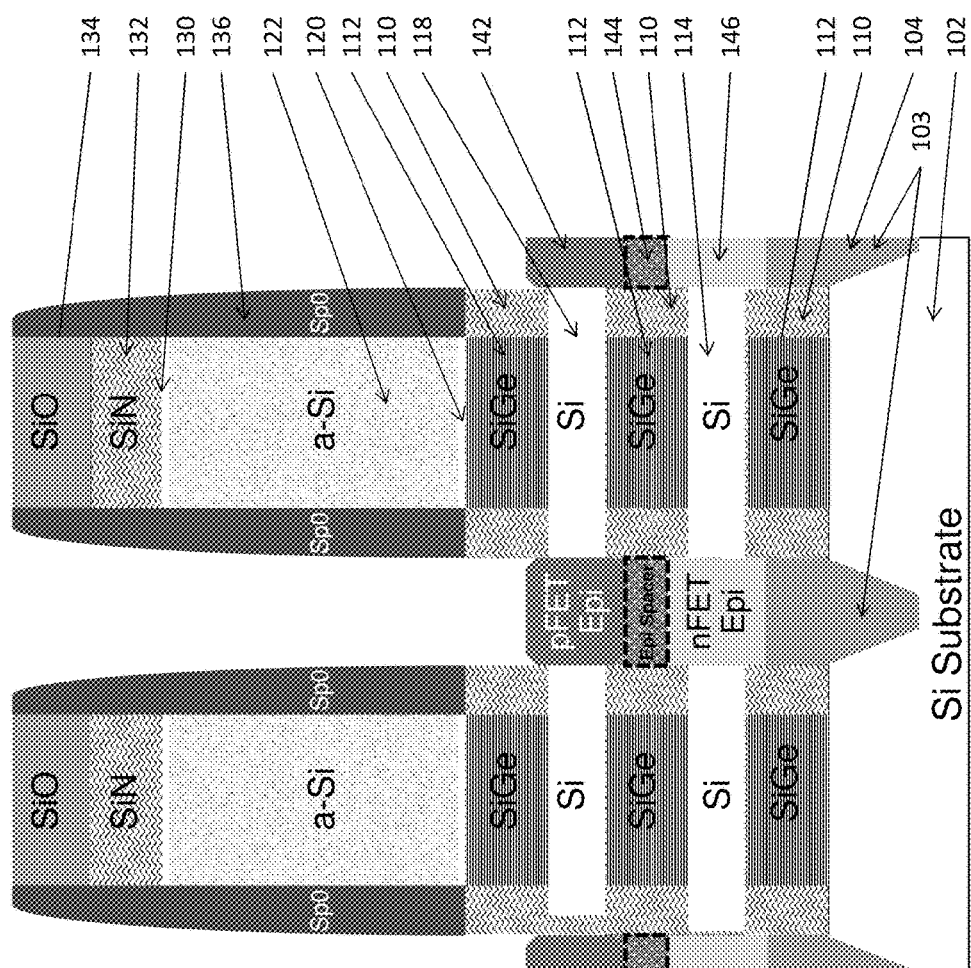

FIG. 36 illustrates the same structure shown in FIG. 35; however, in FIG. 36, exemplary material identifications are added to the drawing to illustrate one example of some chemical compositions that could be utilized for the different components of the structure (and those ordinarily skilled in the art would understand that other materials could be substituted in place of those shown in this example, without departing from the structures identified by the claims presented below). Additionally, FIG. 36 illustrates the portion of the isolation insulator 104 that extends into the substrate 102 and forms the isolation plugs 103. The structure shown in FIGS. 35 and 36 is then additionally processed to remove the materials above and around the semiconductor layers 114, 118 (materials 112, 120, 122, 130, 132, 134 that are described above) and replace such components with the gate conductor 150 (described above), and various gate insulators 152 (e.g., oxides), and other conductive contacts 154, resulting in the structure shown in FIG. 3.

As mentioned above, FIGS. 37-50 are schematic diagrams illustrating various exemplary processing steps that can be used to produce the structure shown in FIG. 4. Note that the structures shown in FIGS. 3 and 37-50 again utilize the isolation plugs 103 instead of the buried insulator layer 160. Therefore, in the example shown in FIGS. 3 and 37-50, the isolation elements are the isolation plugs 103, instead of the BOX 160.

Figure 37:
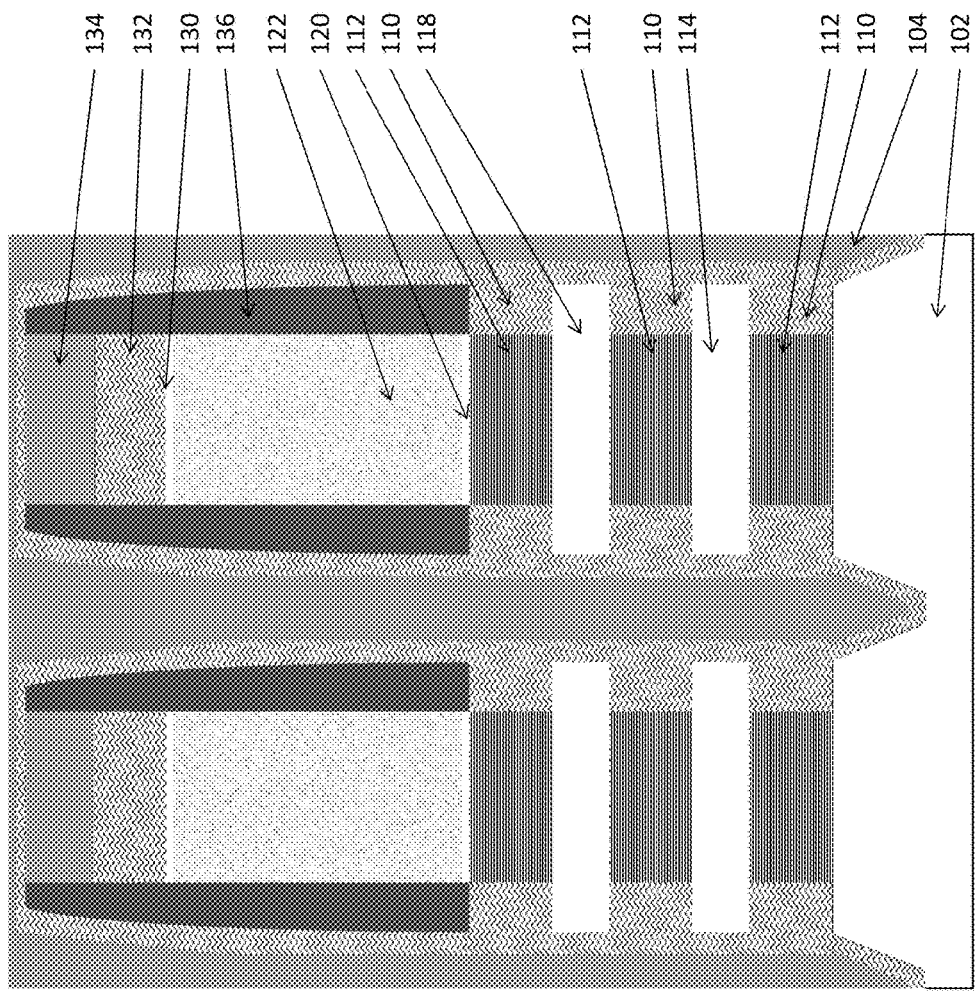
FIGS. 37-50 are schematic diagrams illustrating various exemplary processing steps that can be used to produce the structure shown in FIG. 4.

FIG. 37 illustrates the structure after processing similar to that shown in FIGS. 7-13 has been completed, except that the liner dielectric 110 removal process shown in FIG. 12 is not undertaken, and a redundant discussion/illustration of such processing is avoided to maintain focus on the salient aspects of this embodiment. This leaves the structure shown in FIG. 37 with the liner dielectric 110 in place on the fin, and between the isolation insulator 104 and the substrate 102. This causes the isolation plugs 103 to be formed to include a liner dielectric 110 contacting the substrate, and where the liner dielectric 110 is between the subsequently formed isolation layer spacer material 144 and the substrate 102.

Figure 38:
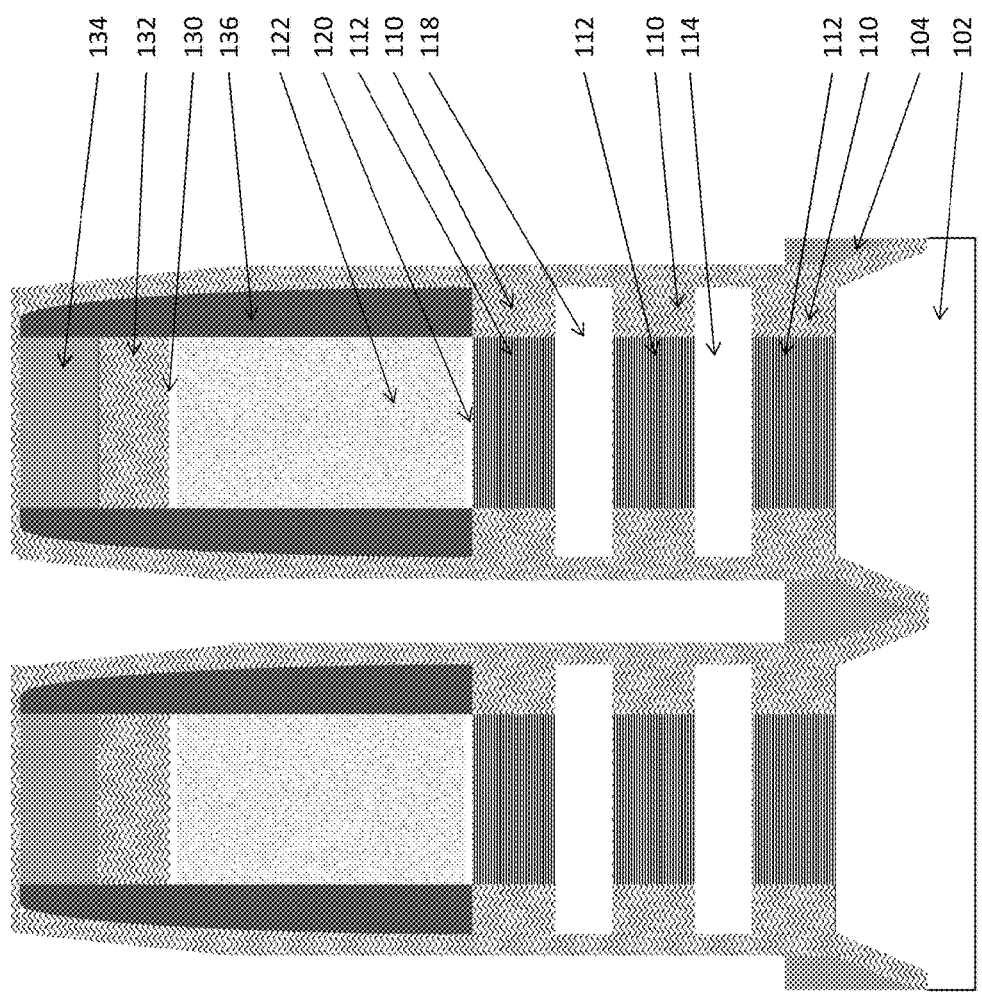
Figure 39:
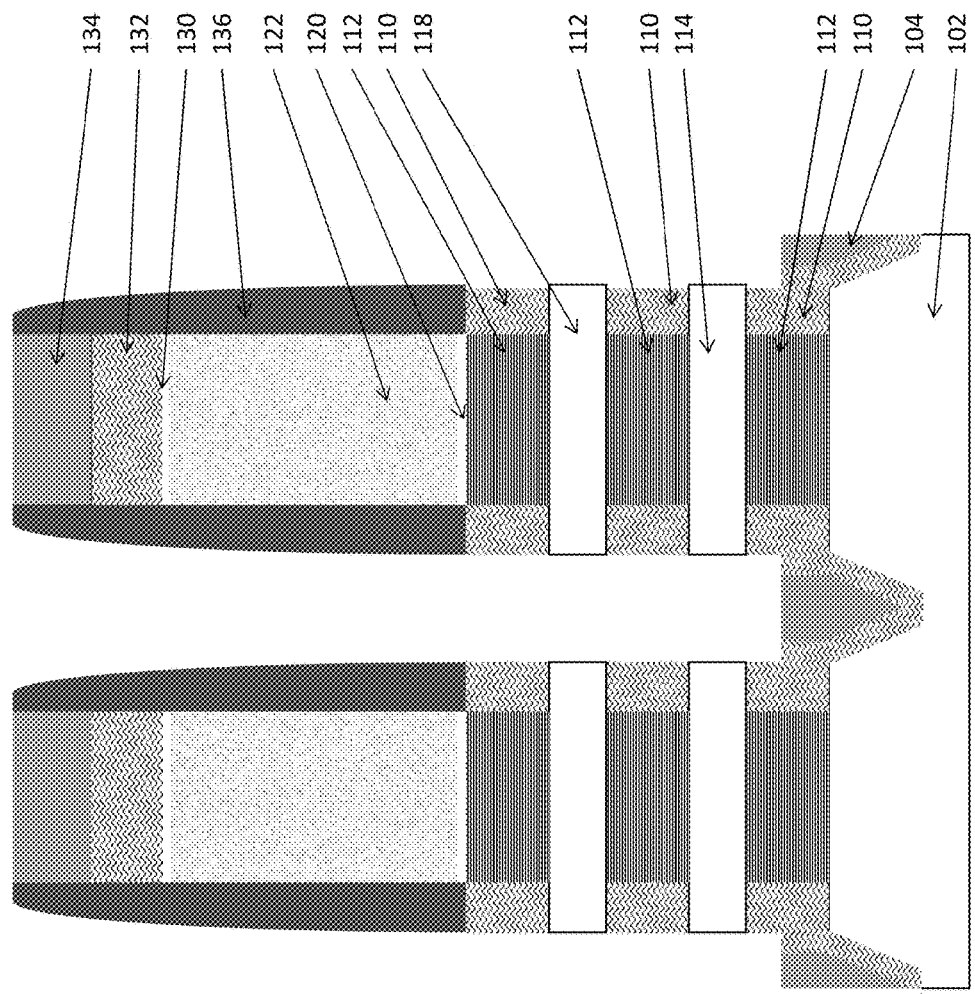
Figure 40:
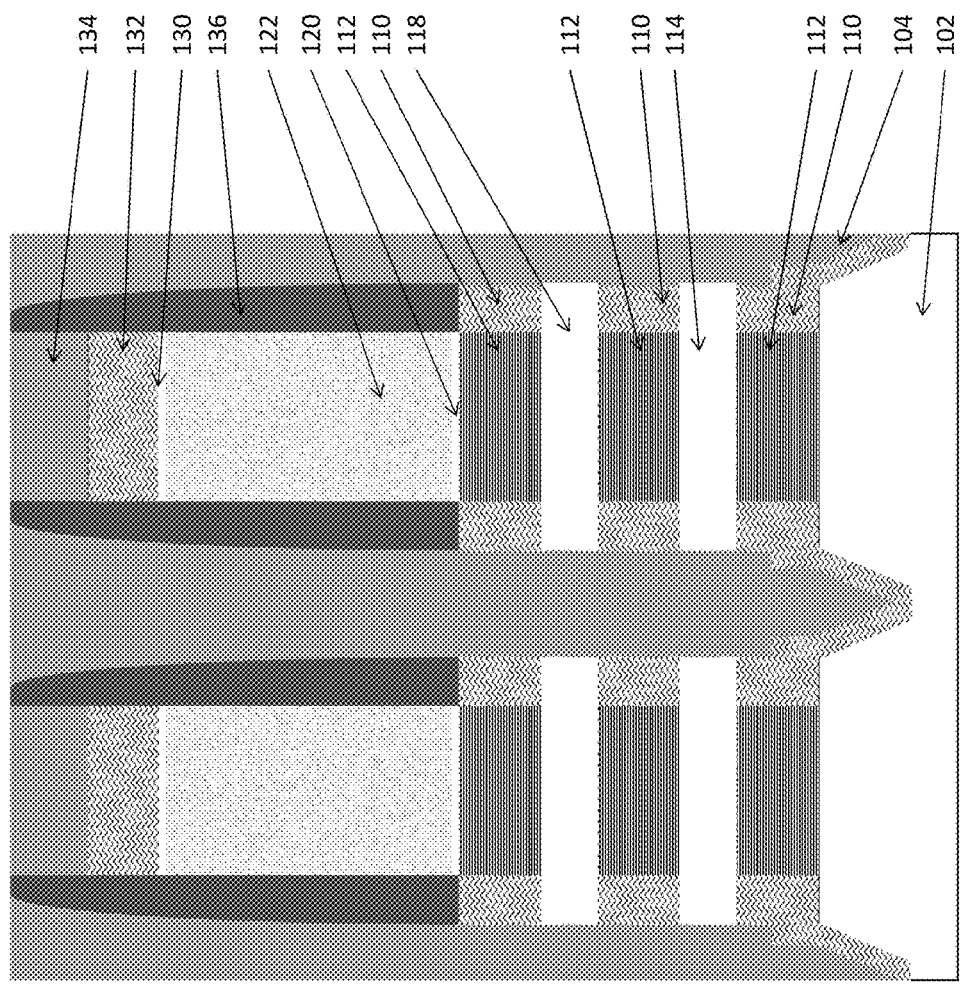

FIG. 38 illustrates processing where the isolation insulator 104 is recessed down to a level below the lower semiconductor layer 114 (to a level between the lower semiconductor 114 and the substrate 102), using processing such as oxide anisotropic recess (e.g., hybrid wet (BHF)/dry pulsing etch-deposition ($C_4F_6+O_2$/CO/Ar), etc.). In FIG. 39, the liner dielectric 110 is self-aligned to the shape of the conformal protective layer 136 in a material removal process (e.g., an etch back process of $H_3PO_4$ at 165° C., etc.) down to the top of the recessed isolation insulator 104. Next, as shown in FIG. 40, this processing reforms the isolation insulator 104 over the structure by, for example, depositing a thick conformal oxide liner (e.g., SiO, etc.) in processing such as flowable chemical vapor deposition (FCVD), anisotropic high density plasma (HDP) processing, etc.

Figure 41:
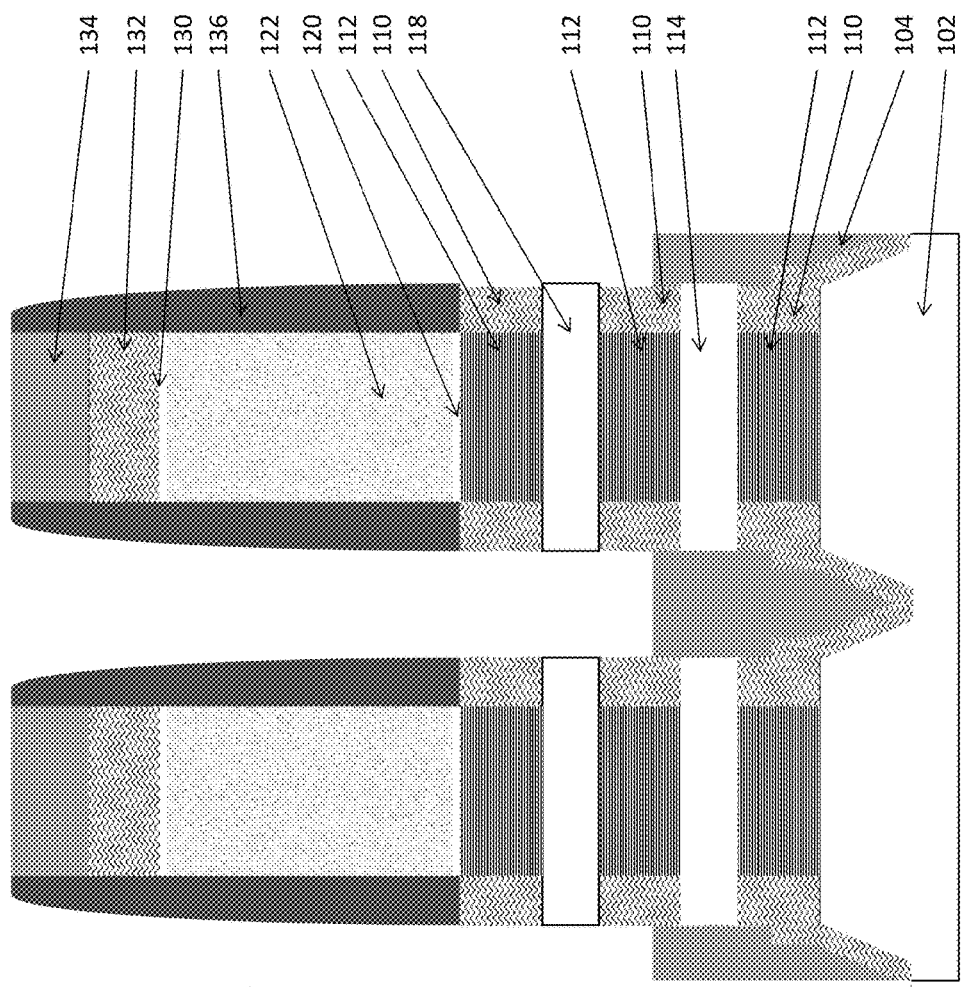
Figure 42:
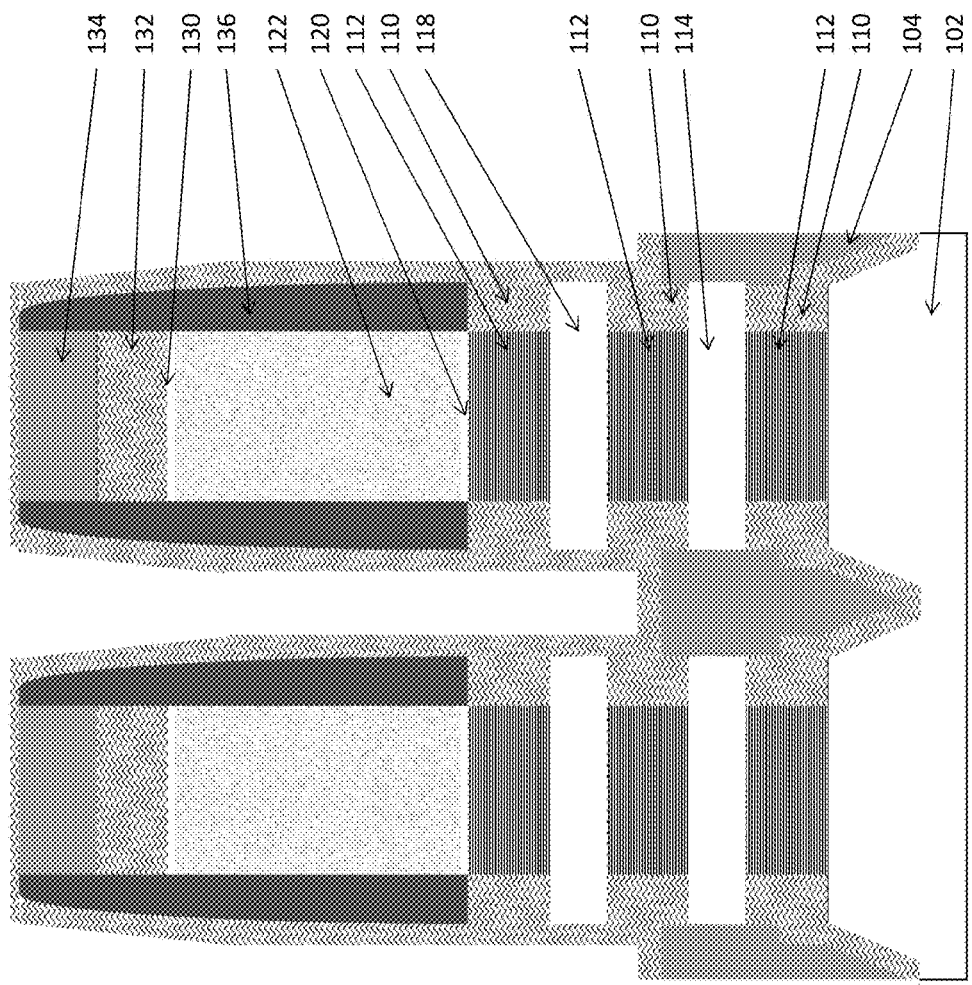
Figure 43:
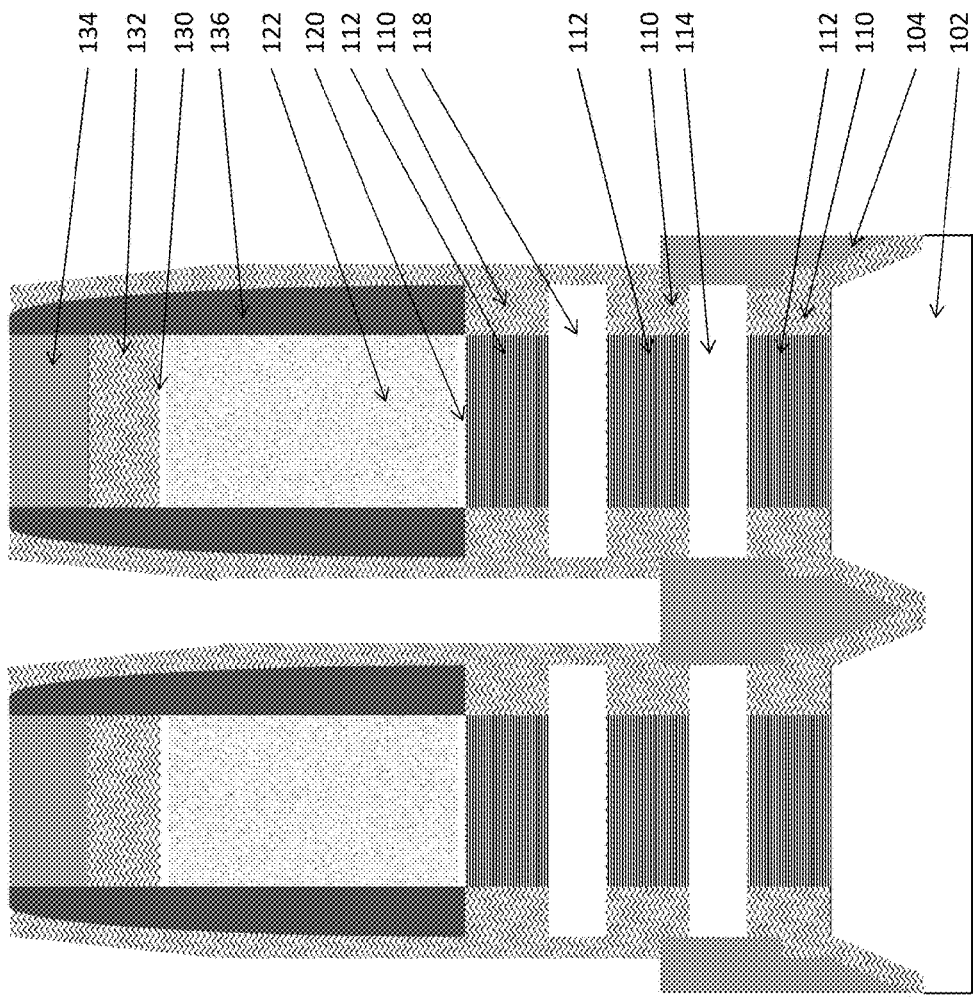

In FIG. 41, the isolation insulator 104 is recessed down to a level above the lower semiconductor layer 114 (to a level between the lower semiconductor layer 114 and the upper semiconductor layer 118), using processing such as oxide anisotropic recess (e.g., hybrid wet (BHF)/dry pulsing etch-deposition ($C_4F_6+O_2$/CO/Ar), etc.). The fins are then encapsulated by conformally forming additional amounts of the liner dielectric 110, as shown in FIG. 42. Again, as discussed with respect to FIG. 11, the liner dielectric 110 can be formed using iRAD of oxide. Subsequently, as shown in FIG. 43, the liner dielectric 110 is etched to be removed from the tops of the isolation insulator 104 (e.g., in an anisotropic etch back, such as reactive ion etching (RIE) Ge implant with selective recess, etc.).

Figure 44:
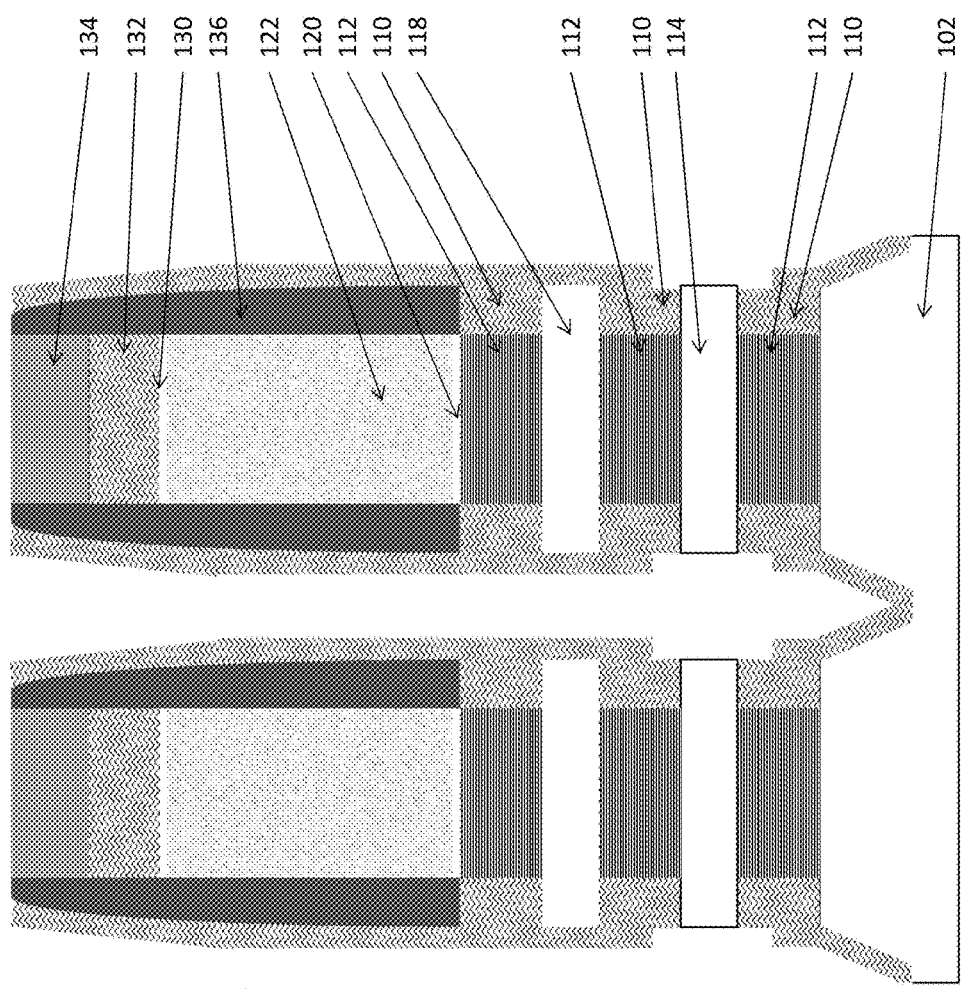
Figure 45:
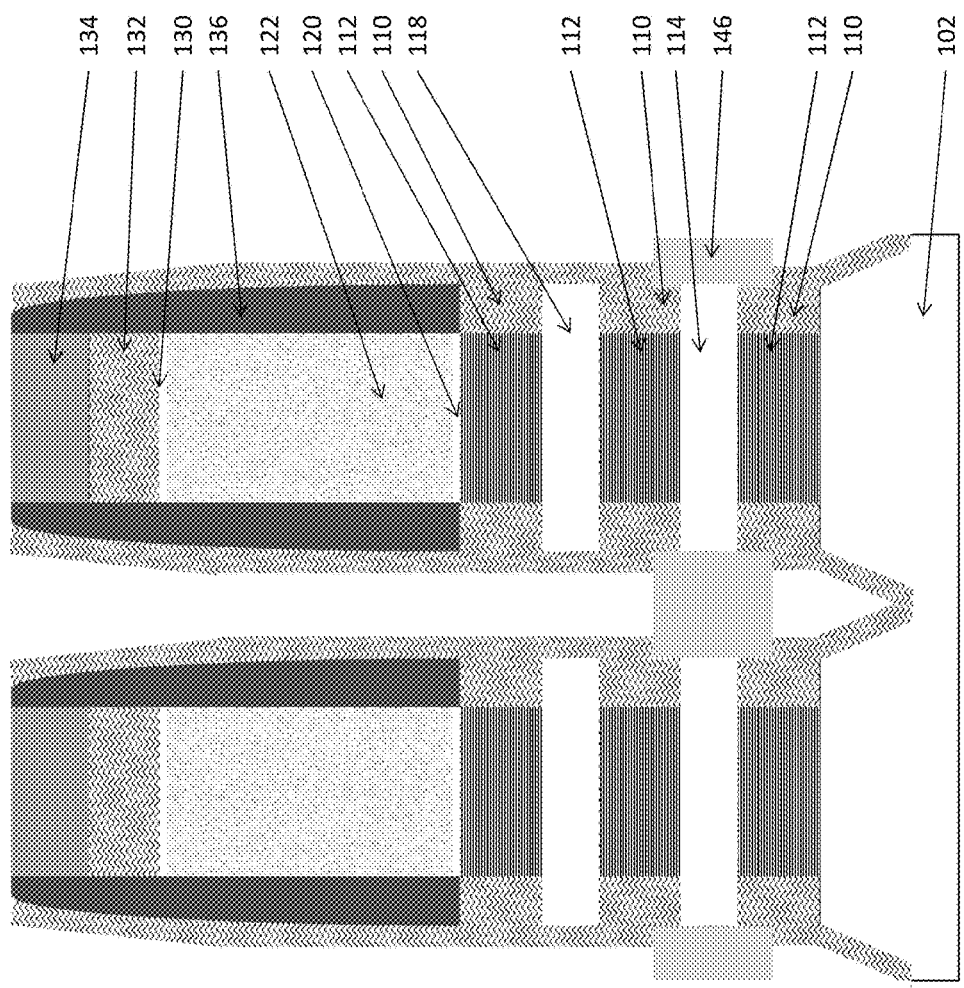

In FIG. 44, the isolation insulator 104 is fully recessed, using processing such as oxide anisotropic recess (e.g., hybrid wet (BHF)/dry pulsing etch-deposition ($C_4F_6+O_2$/CO/Ar), etc.). Note that the upper semiconductor layer 118 is still protected here, by the liner dielectric 110, as shown in FIG. 44. With the sides of the lower semiconductor layer 114 exposed, and the upper semiconductor layer 118 is still protected, as shown in FIG. 45, the source/drain regions 146 of the lower transistor are epitaxially grown on exposed surface of the lower semiconductor layer 114 to include an nFET source/drain type dopant (e.g., Si:P).

Figure 46:
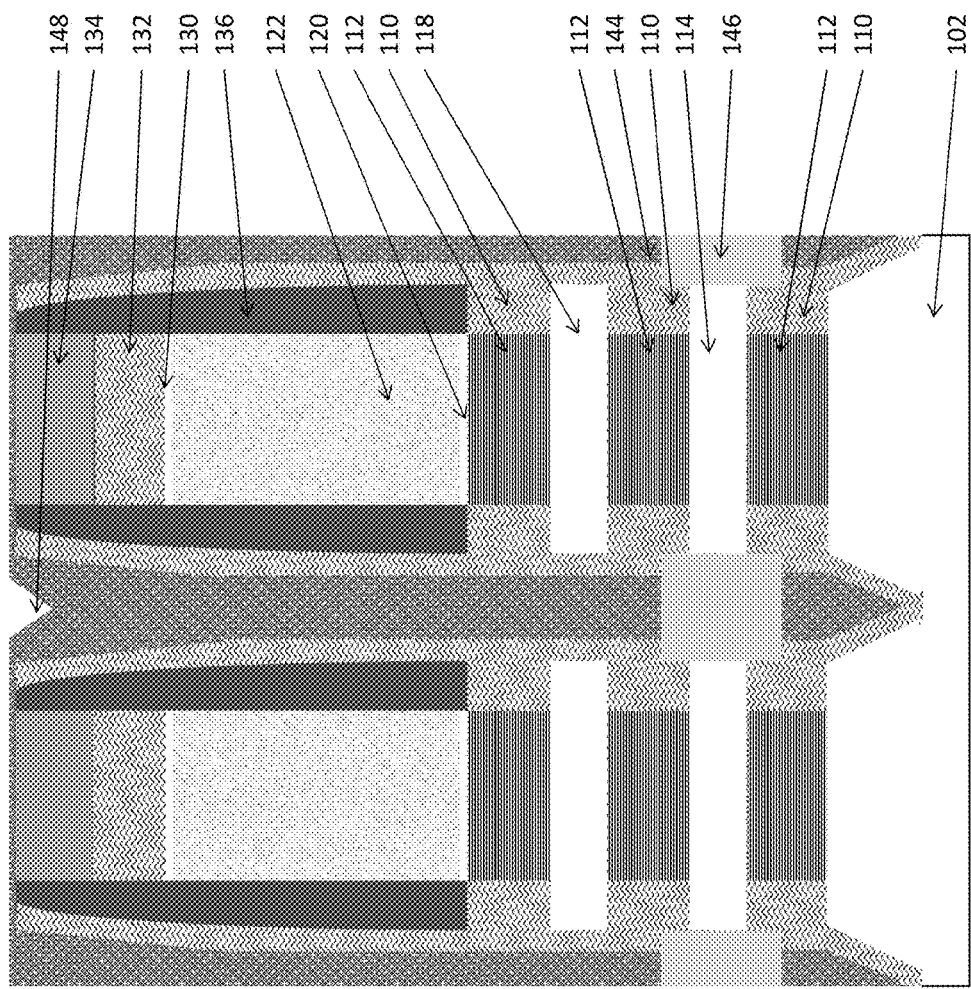
Figure 47:
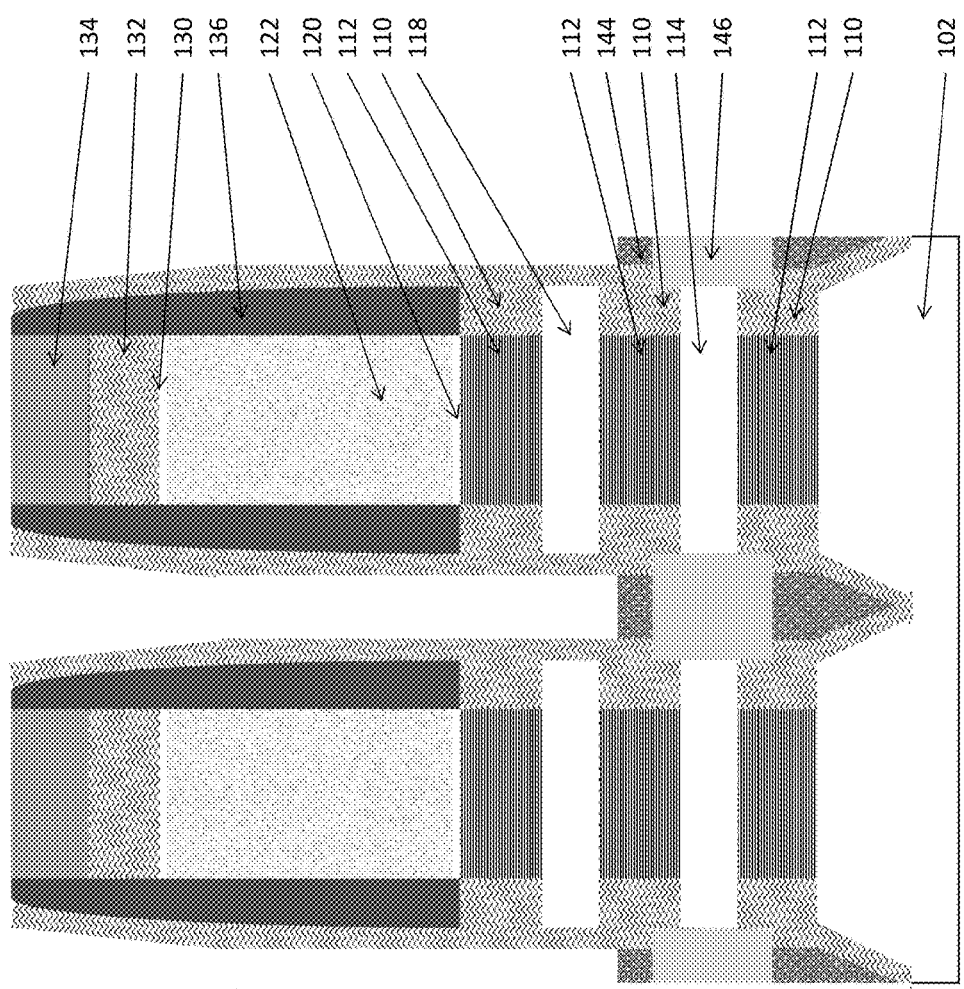
Figure 48:
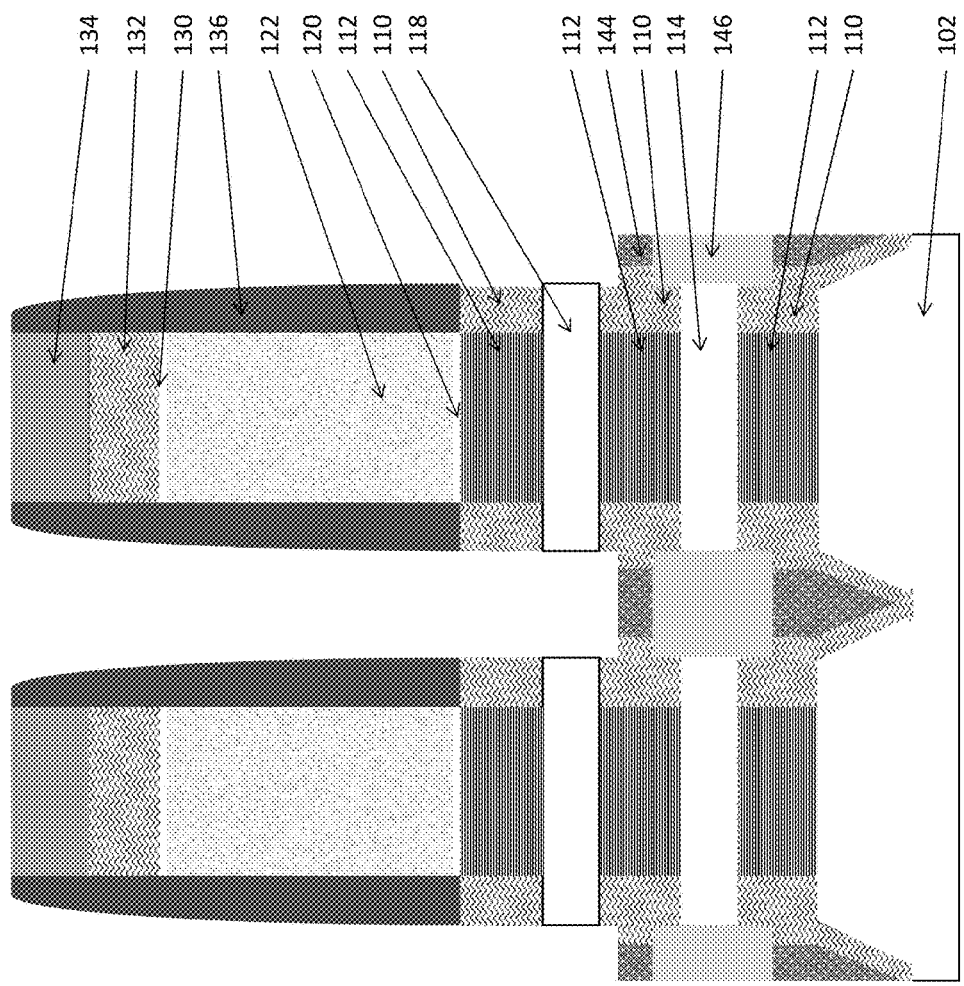

As shown in FIG. 46, the isolation layer material 144 is formed over the structure, using processing such as conformal deposition of $SiO_2$, SiBCN, SiOC, SiOCN, etc. Note that, as shown in FIG. 46, in region 148, the seam is minimized by overfill at the top, and the isolation layer material 144 is thick enough between the fins to force pinch-off between the gates. The height of the isolation layer material 144 is reduced to a level between the lower semiconductor layer 114 and the upper semiconductor layer 118, as shown in FIG. 47, using processing such as anisotropic recessing, etc. Next, as shown in FIG. 48, the liner dielectric 110 is self-aligned to the shape of the conformal protective layer 136 in a material removal process (e.g., an etch back process of $H_3PO_4$ at 165° C., etc.) to expose the upper semiconductor layer 118. With the sides of the upper semiconductor layer 118 exposed, and the lower semiconductor layer 114 is still protected, as shown in FIG. 49, the source/drain regions 142 of the upper transistor are epitaxially grown on exposed surfaces of the upper semiconductor layer 118 to include a pFET source/drain type dopant (e.g., SiGe:B).

Figure 49:
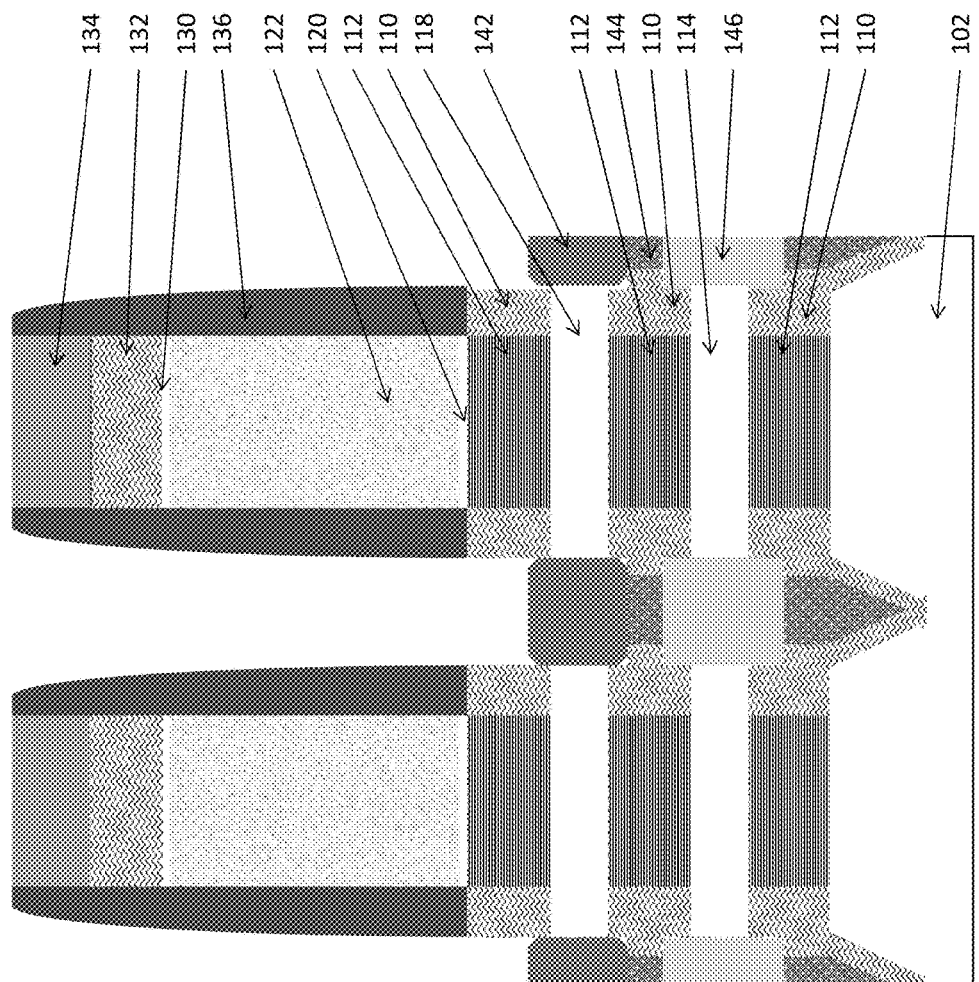
Figure 50:
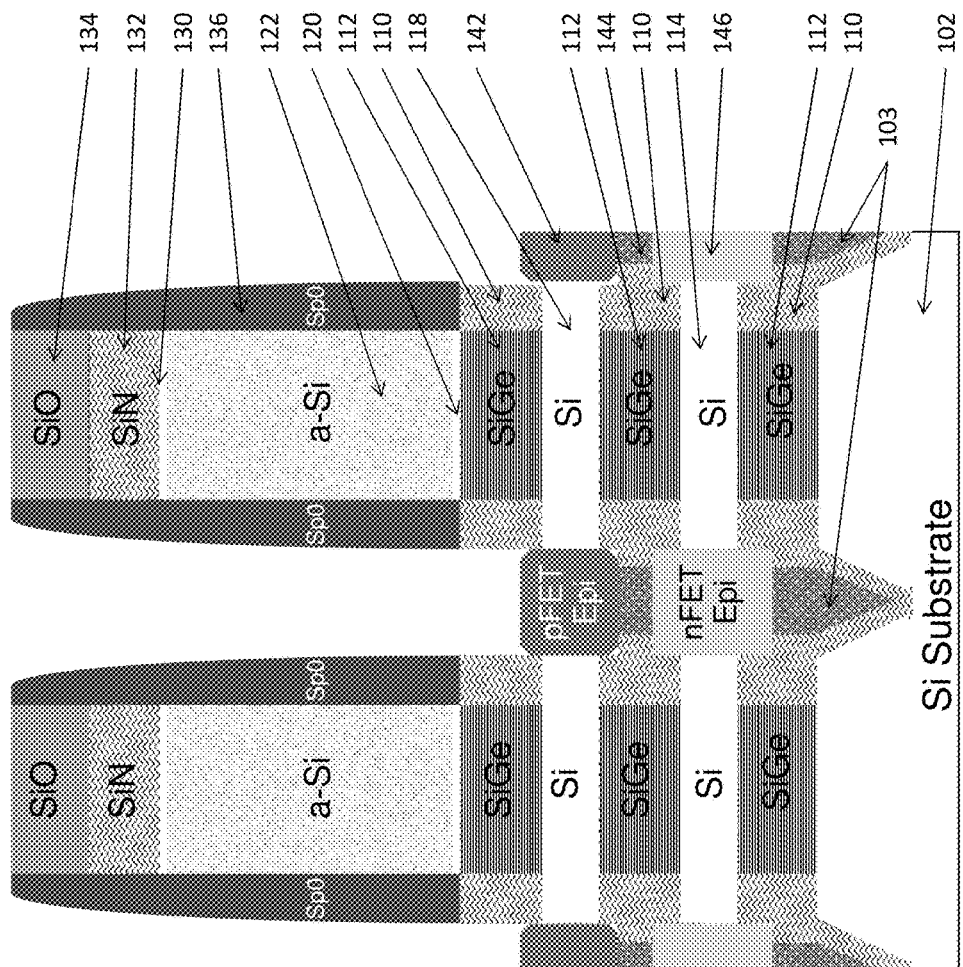

FIG. 50 illustrates the same structure shown in FIG. 49; however, in FIG. 50, exemplary material identifications are added to the drawing to illustrate one example of some chemical compositions that could be utilized for the different components of the structure (and those ordinarily skilled in the art would understand that other materials could be substituted in place of those shown in this example, without departing from the structures identified by the claims presented below). Additionally, FIG. 50 illustrates the portion of the isolation layer material 144 lined by the liner dielectric 110 that extends into the substrate 102 and forms the isolation plugs 103. The structure shown in FIGS. 49 and 50 is then additionally processed to remove the materials above and around the semiconductor layers 114, 118 (materials 112, 120, 122, 130, 132, 134 that are described above) and replace such components with the gate conductor 150 (described above), and various gate insulators 152 (e.g., oxides), and other conductive contacts 154, resulting in the structure shown in FIG. 4.

Figure 51:
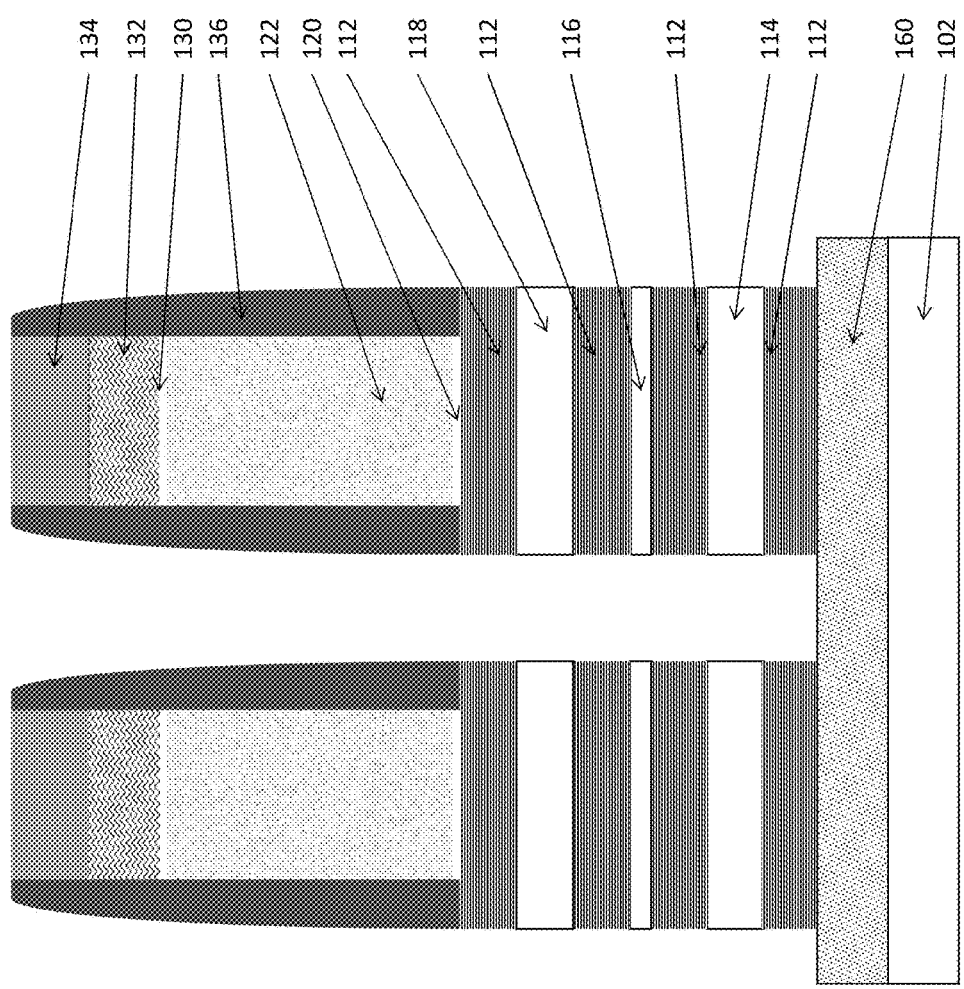
FIGS. 51-62 are schematic diagrams illustrating various exemplary processing steps that can be used to produce the structure shown in FIG. 5.

As mentioned above, FIGS. 51-62 are schematic diagrams illustrating various exemplary processing steps that can be used to produce the structure shown in FIG. 5. Note that the structures shown in FIGS. 5 and 51-62 do not utilize the isolation plugs 103; and instead, in this embodiment the substrate includes (or is attached to) a buried insulator layer 160 (which can be any type of dielectric, and for convenience is simply referred to herein as a buried oxide layer (BOX)). Therefore, in the example shown in FIGS. 5 and 51-62, the isolation element is the BOX 160, instead of the isolation plugs 103. Further, the structures shown in FIGS. 5 and 51-62 form the nanosheet stack to include an additional silicon layer 116 that is discontinuous, and thinner than the lower and upper semiconductor layers 114, 118. Further, this nanosheet stack provides more space between the lower and upper semiconductor layers 114, 118 relative to the spacing between the BOX layer 160 and the lower semiconductor layer 114, because of the double spacer layers 112 between the lower and upper semiconductor layers 114, 118. Thus, FIG. 51 illustrates the structure after processing similar to that shown in FIGS. 7-9 and associated fin formation has been completed (again, however, with the inclusion of the BOX 160, and the different nanosheet stack) and a redundant discussion/illustration of such processing is avoided to maintain focus on the salient aspects of this embodiment.

Figure 52:
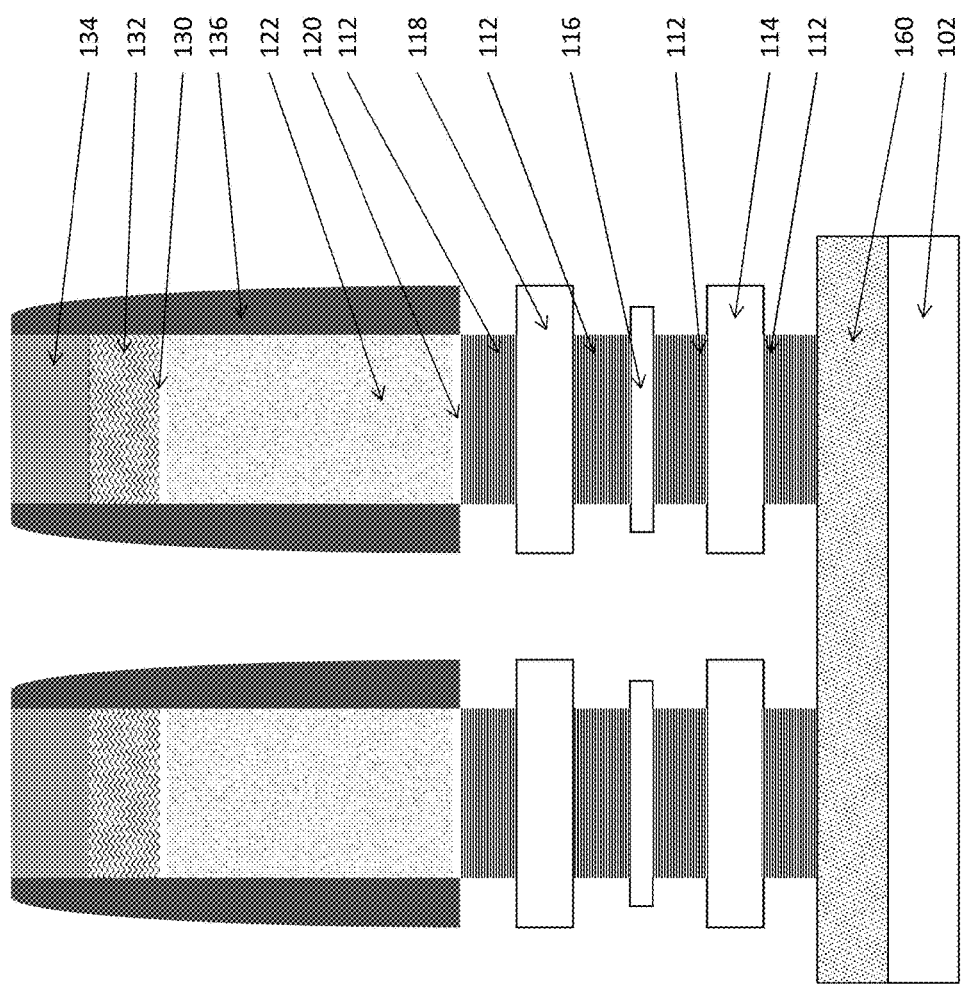
Figure 53:
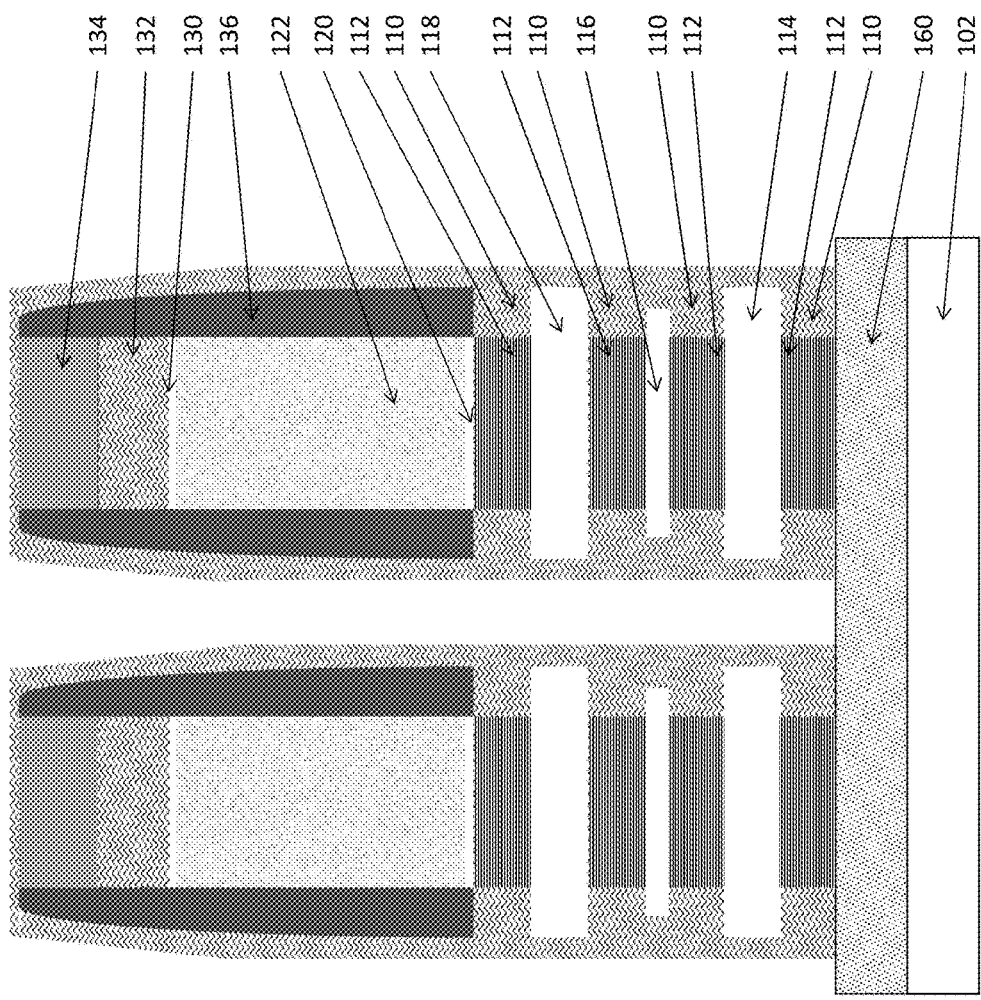
Figure 54:
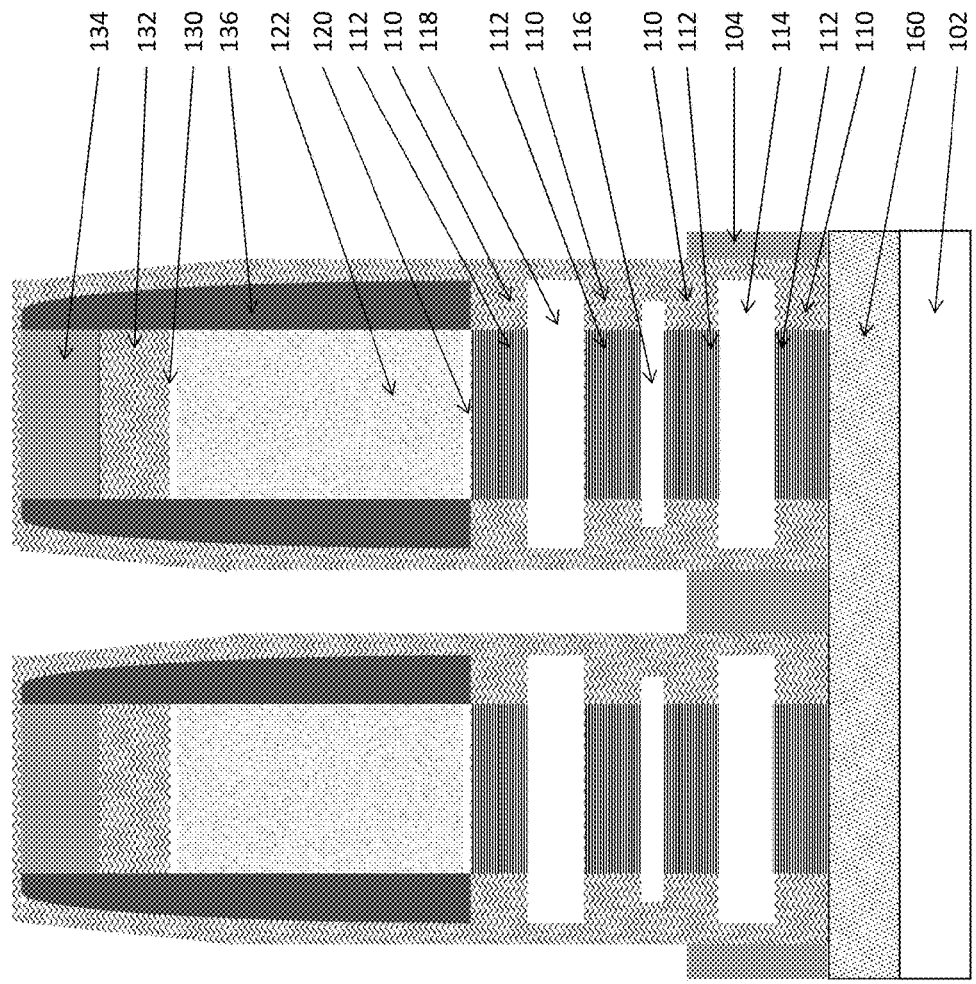

In FIG. 52, the spacer layers 112 are reduced in width using processing that selectively removes the spacer layer material (e.g., SiGe, etc.) without substantially affecting the other exposed materials, to indent the spacer layers 112 relative to the other materials. In FIG. 53, the liner dielectric 110 is formed over the fins using, for example, a conformal deposition of SiN, etc., (using processing such as in-situ radical assisted deposition (iRAD) of oxide to form a 60A layer, etc.). Next, as shown in FIG. 54, this processing forms an isolation insulator 104 over the structure by, for example, depositing a thick conformal oxide liner (e.g., SiO, etc.) in processing such as flowable chemical vapor deposition (FCVD), anisotropic high density plasma (HDP) processing, etc.; and the isolation insulator 104 is recessed down to a level above the lower semiconductor layer 114, using processing such as oxide anisotropic recess (e.g., hybrid wet (BHF)/dry pulsing etch-deposition ($C_4F_6+O_2$/CO/Ar), etc.).

Figure 55:
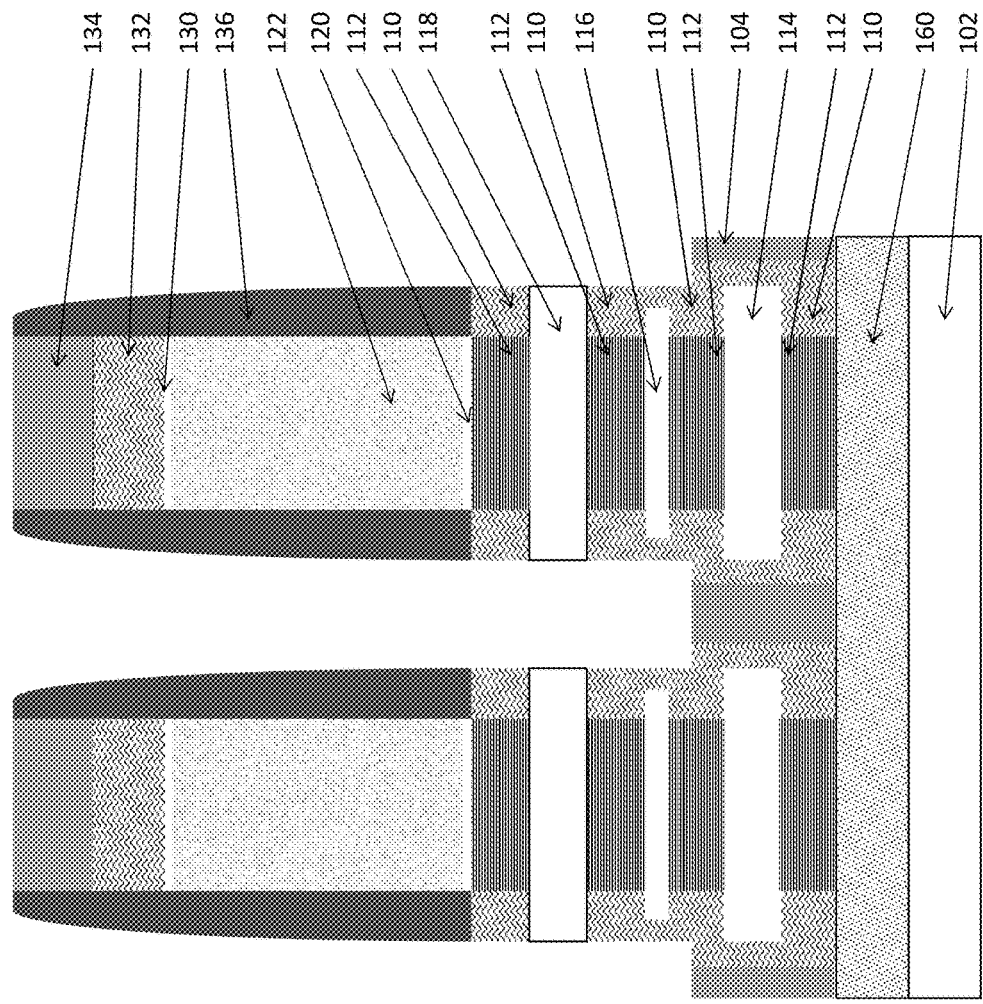
Figure 56:
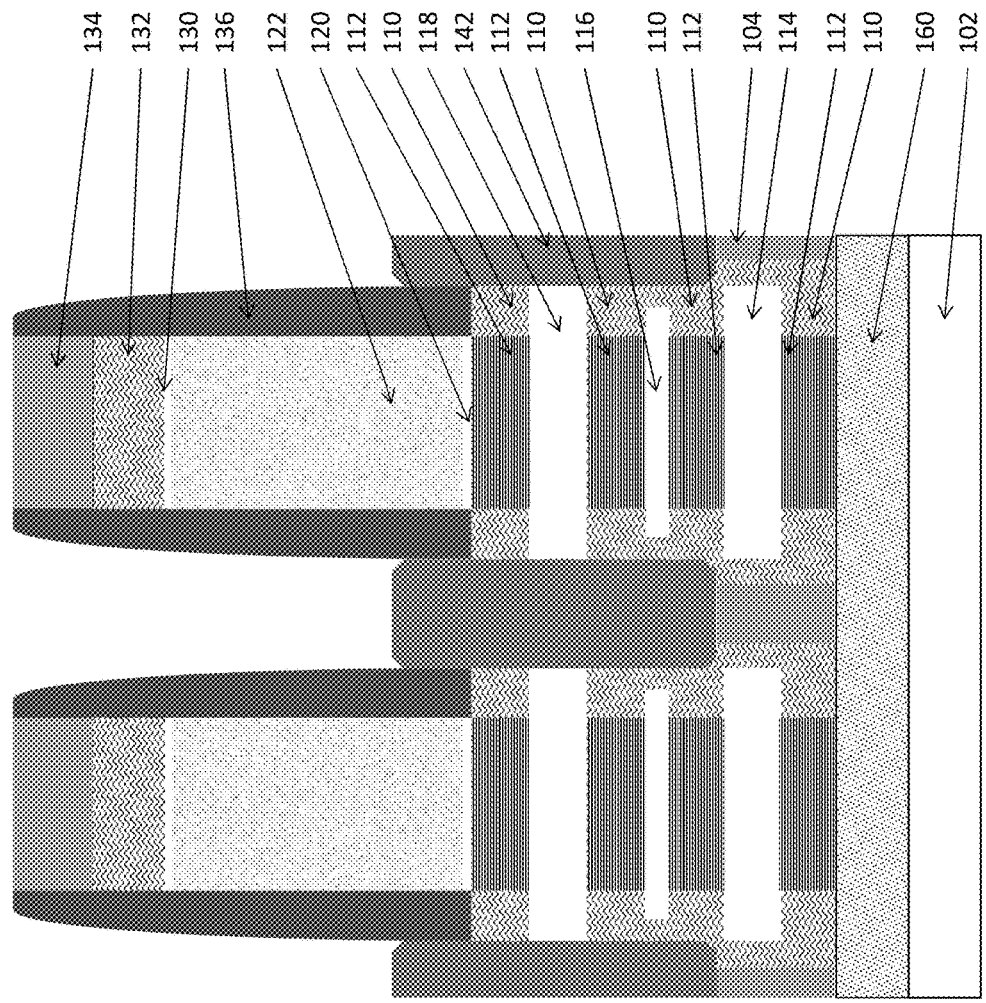
Figure 57:
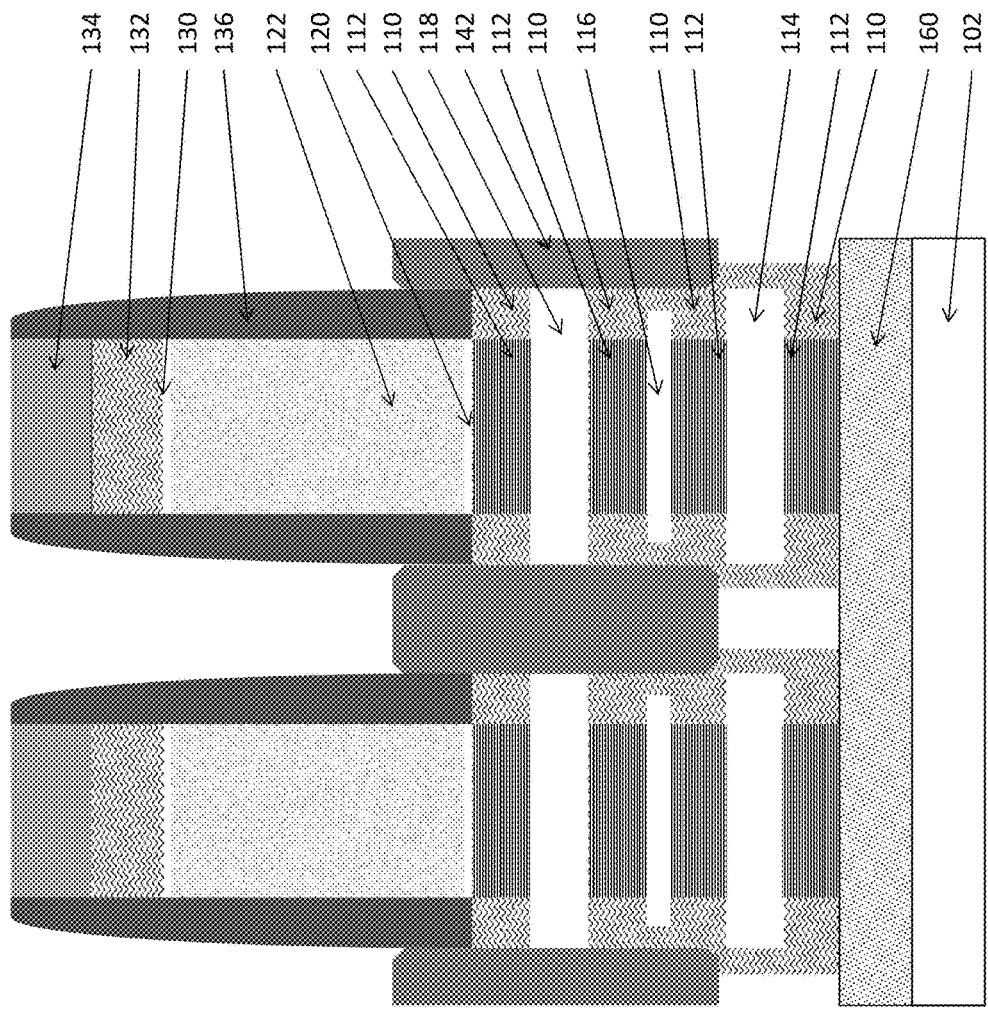

In FIG. 55, the liner dielectric 110 is self-aligned to the shape of the conformal protective layer 136 in a material removal process (e.g., an etch back process of $H_3PO_4$ at 165° C., etc.), which leaves the sides of the upper semiconductor layer 118 exposed. With the sides of the upper semiconductor layer 118 exposed, and the lower semiconductor layer 114 is still protected, as shown in FIG. 56, the source/drain regions 142 of the upper transistor are epitaxially grown on exposed surfaces of the upper semiconductor layer 118 to include a pFET source/drain type dopant (e.g., SiGe:B). In FIG. 57, the isolation insulator 104 is fully recessed down to the BOX 160, using processing such as oxide isotropic recess, which leaves portions of the source/drain regions 142 of the upper transistor exposed.

Figure 58:
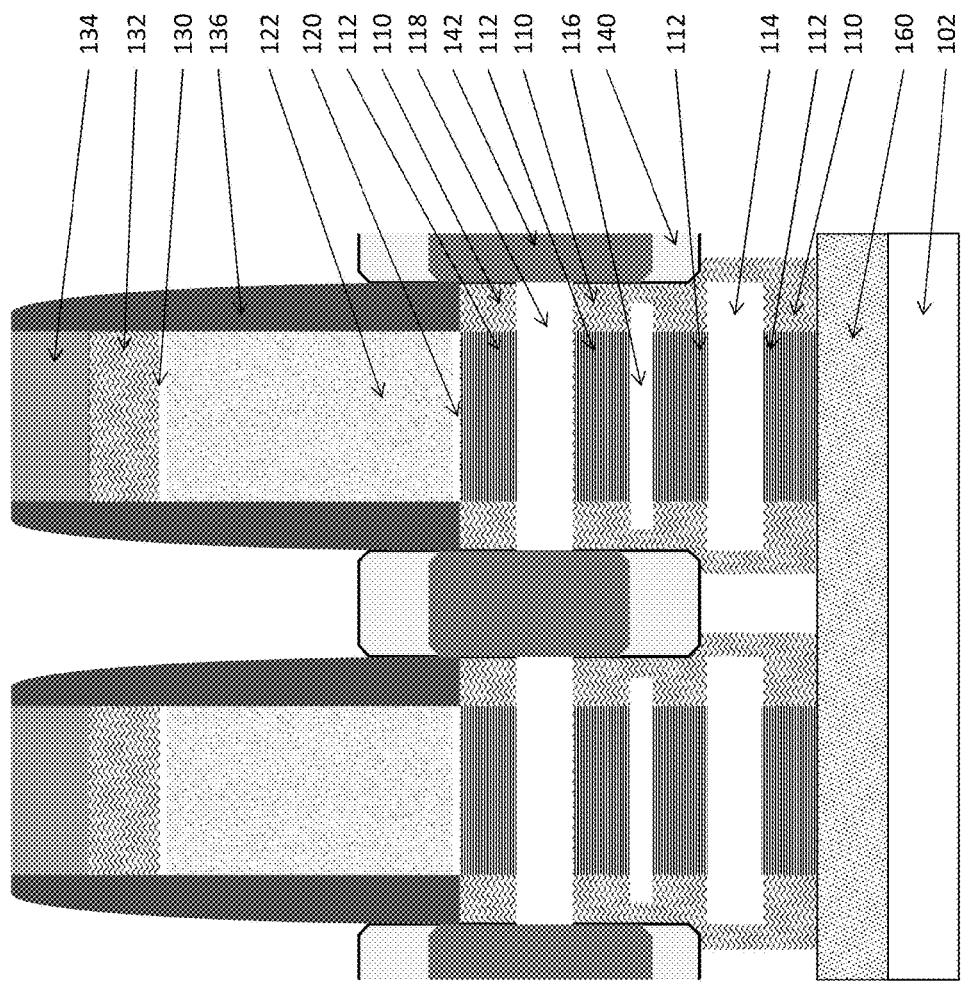

Then, in FIG. 58, the exposed portions of the source/drain regions 142 of the upper transistor are oxidized to form an isolation layer oxide 140, in processing that provides, for example $SiO_2$ encapsulation of the pFET SiGe:B by selective oxidation at high pressure and low temperature. The processing shown in FIG. 58 consumes portions of the source/drain regions 142 of the upper transistor, and thereby reduces the height of the source/drain regions 142 of the upper transistor.

Figure 59:
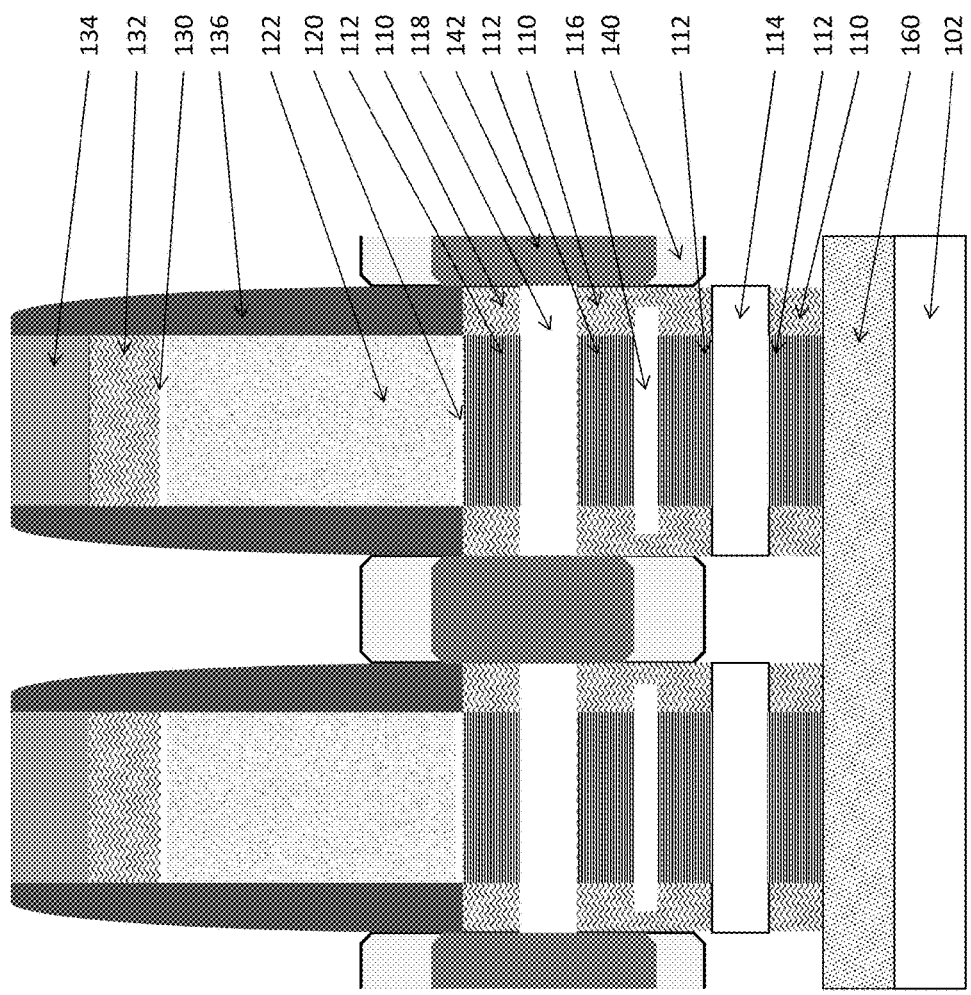
Figure 60:
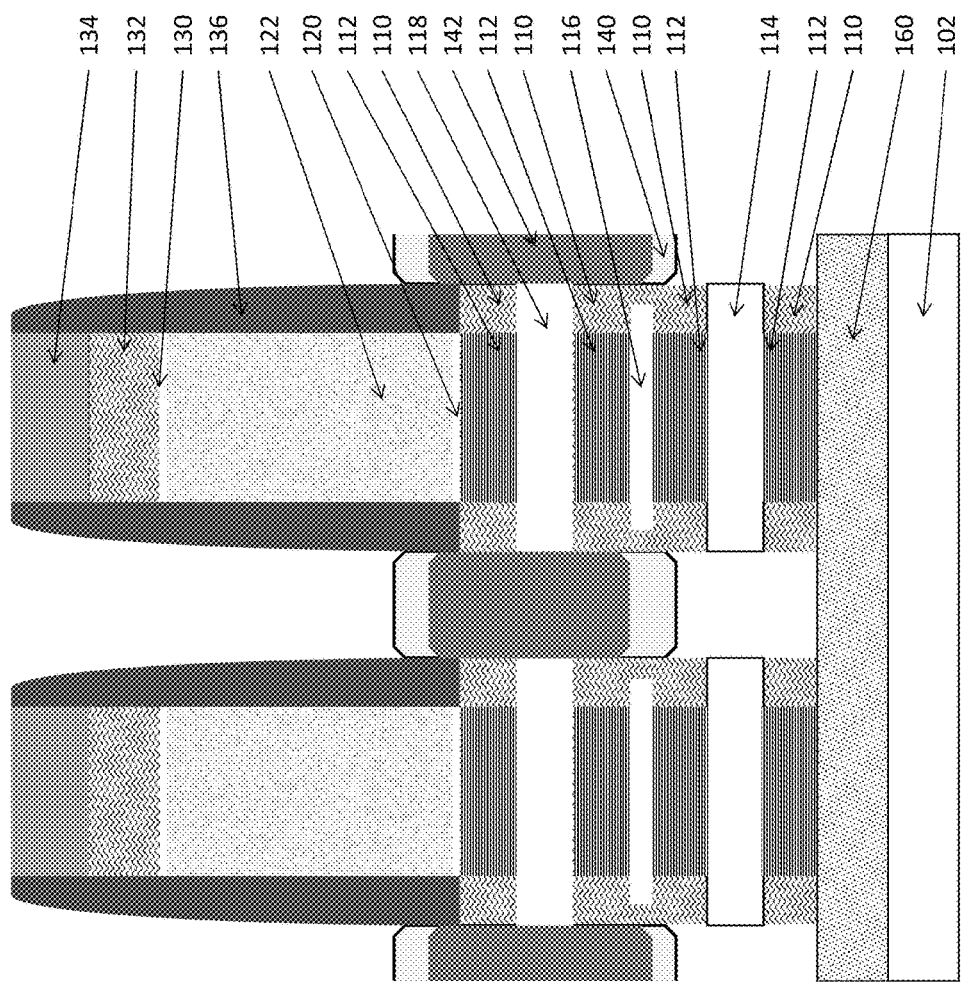

As shown in FIG. 59, the liner dielectric 110 is self-aligned to the shape of the conformal protective layer 136 in a material removal process (e.g., an etch back process of $H_3PO_4$ at 165° C., etc.) to expose the lower semiconductor layer 114. Additionally, as shown in FIG. 60, the size of the isolation layer oxide 140 is partially recessed in a pre-clean process. Next, in FIG. 61, the source/drain regions 146 of the lower transistor are epitaxially grown on exposed surface of the lower semiconductor layer 114 to include an nFET source/drain type dopant (e.g., Si:P). Note that in the processing shown in FIG. 61, the source/drain regions 146 of the lower transistor can be formed to contact the BOX layer 160; however, this does not result in undesirable current flow through the substrate 102 because the BOX layer 160 provides sufficient insulation to prevent such an occurrence.

Figure 61:
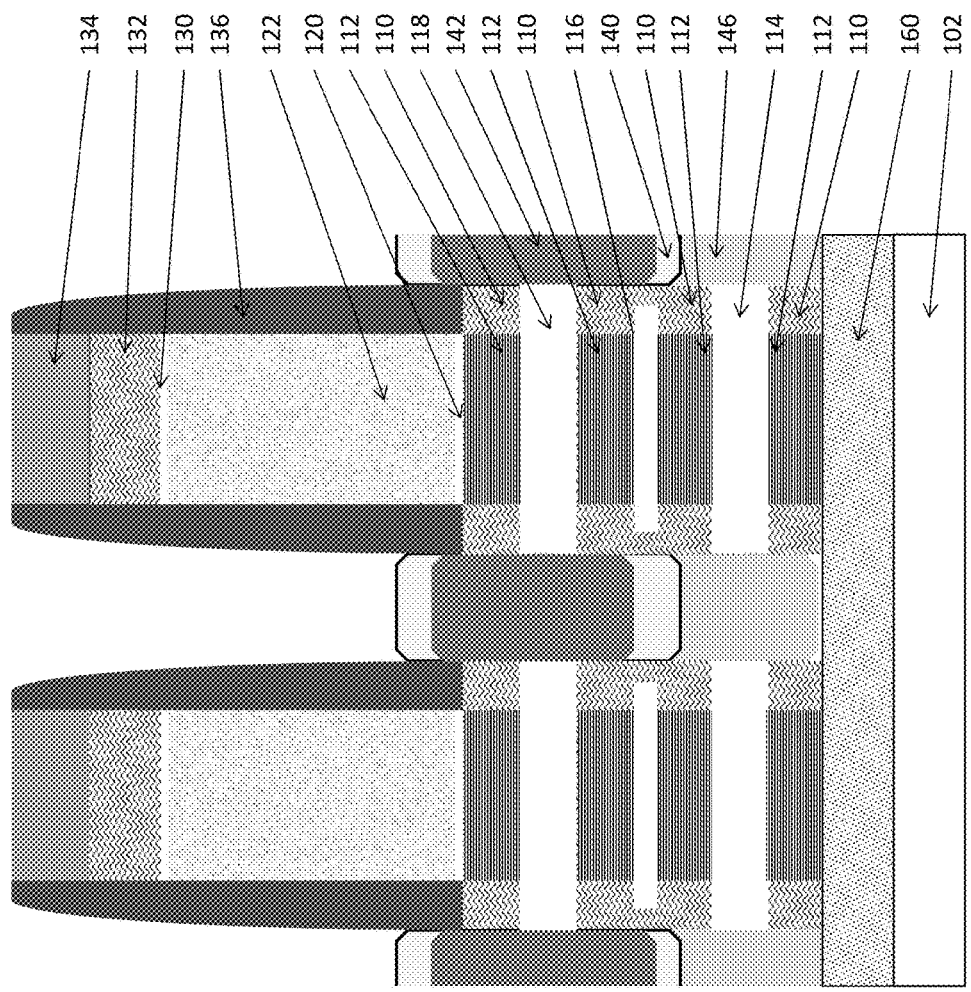
Figure 62:
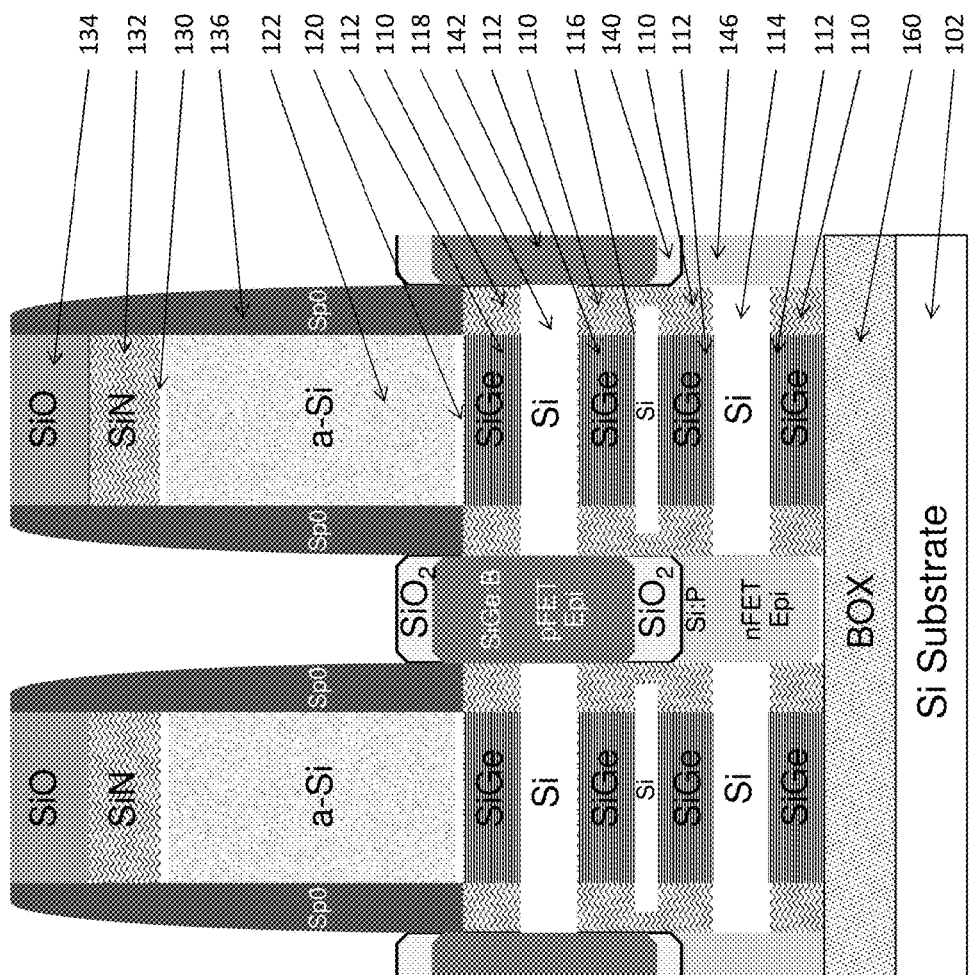

FIG. 62 illustrates the same structure shown in FIG. 61; however, in FIG. 62, exemplary material identifications are added to the drawing to illustrate one example of some chemical compositions that could be utilized for the different components of the structure (and those ordinarily skilled in the art would understand that other materials could be substituted in place of those shown in this example, without departing from the structures identified by the claims presented below). The structure shown in FIGS. 61 and 62 is then additionally processed to remove the materials above and around the semiconductor layers 114, 118 (materials 112, 116, 120, 122, 130, 132, 134 that are described above) and replace such components with the gate conductor 150 (described above), and various gate insulators 152 (e.g., oxides), and other conductive contacts 154, resulting in the structure shown in FIG. 5. Note that in FIG. 5, the gate extensions 156 are artifacts that are formed by the replacement of spacer layer 116 with the gate conductor material 150.

As mentioned above, FIGS. 63-72 are schematic diagrams illustrating various exemplary processing steps that can be used to produce the structure shown in FIG. 6. Note that the structures shown in FIGS. 6 and 63-72 do not utilize the isolation plugs 103; and instead, in this embodiment the substrate includes (or is attached to) a buried insulator layer 160 (which can be any type of dielectric, and for convenience is simply referred to herein as a buried oxide layer (BOX)). Therefore, in the example shown in FIGS. 6 and 63-72, the isolation element is the BOX 160, instead of the isolation plugs 103. Further, the structures shown in FIGS. 6 and 63-72 form the nanosheet stack to include an additional silicon layer 116 that is discontinuous, and thinner than the lower and upper semiconductor layers 114, 118. Again, this nanosheet stack provides more space between the lower and upper semiconductor layers 114, 118 relative to the spacing between the BOX layer 160 and the lower semiconductor layer 114, because of the double spacer layers 112 between the lower and upper semiconductor layers 114, 118 (the double spacer layers 112 are separated and structurally supported by the relatively thinner and disconnected additional silicon layer 116).

Figure 63:
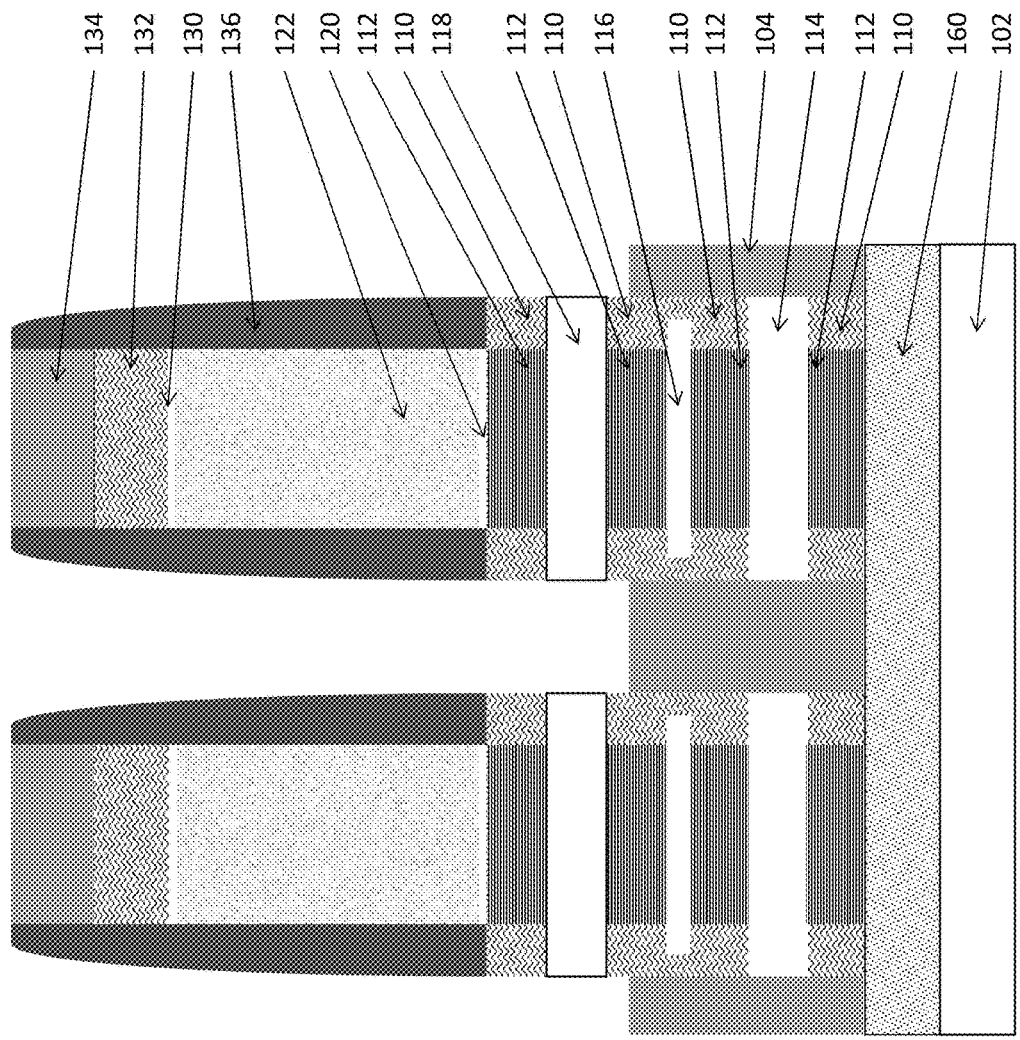
FIGS. 63-72 are schematic diagrams illustrating various exemplary processing steps that can be used to produce the structure shown in FIG. 6.

Thus, FIG. 63 illustrates the structure after processing similar to that shown in FIGS. 7-9 and 51-53 where the associated fin formation has been completed (again, however, with the inclusion of the BOX 160, and the different nanosheet stack), and the liner dielectric 110 is self-aligned to the shape of the conformal protective layer 136, and the isolation insulator 104 is formed and recessed down to a level above the middle semiconductor layer 116, using processing described above. Again, a redundant discussion/illustration of such processing is avoided to maintain focus on the salient aspects of this embodiment.

Figure 64:
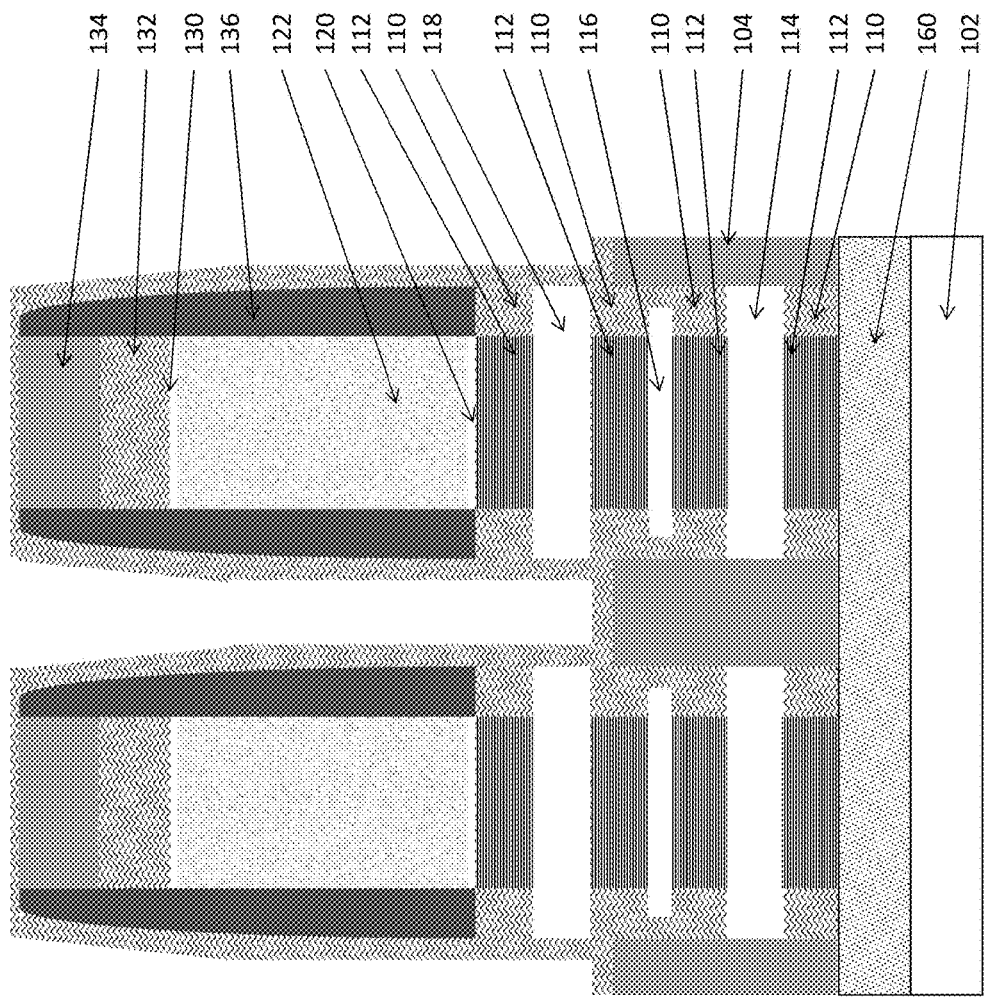
Figure 65:
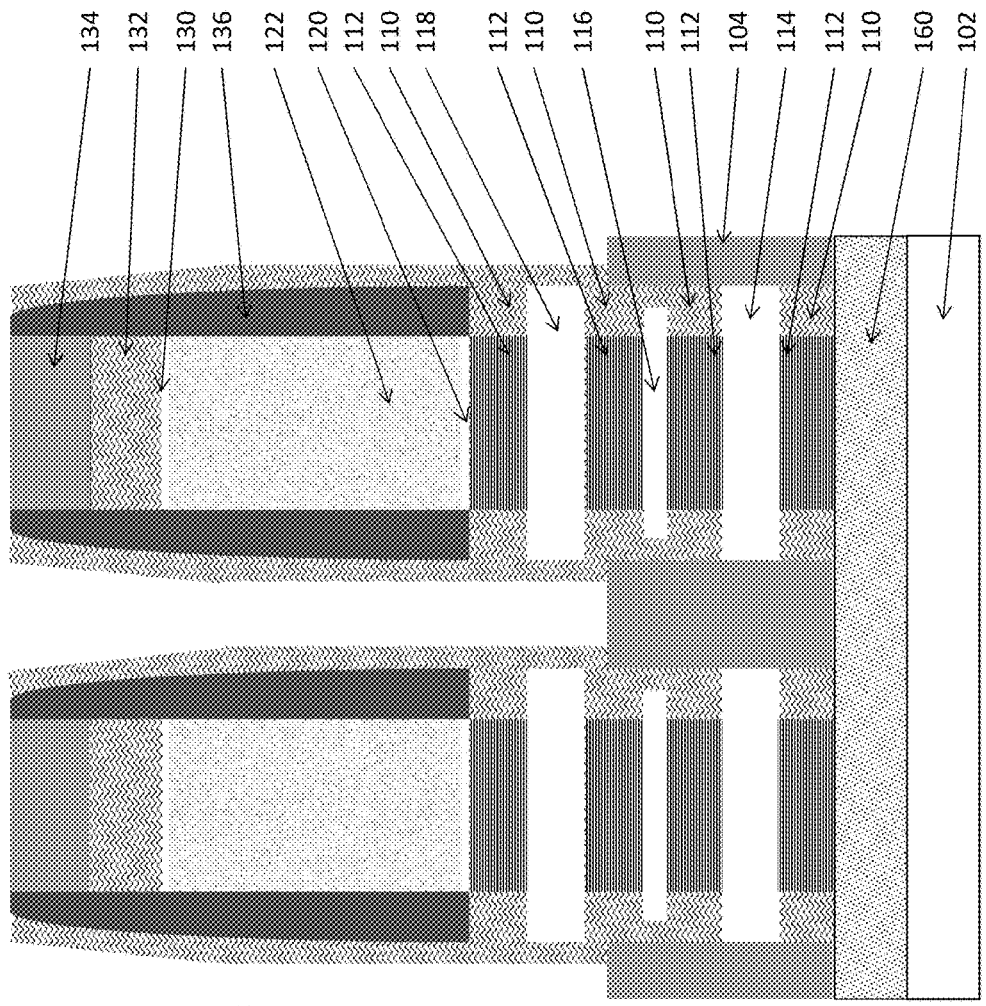
Figure 66:
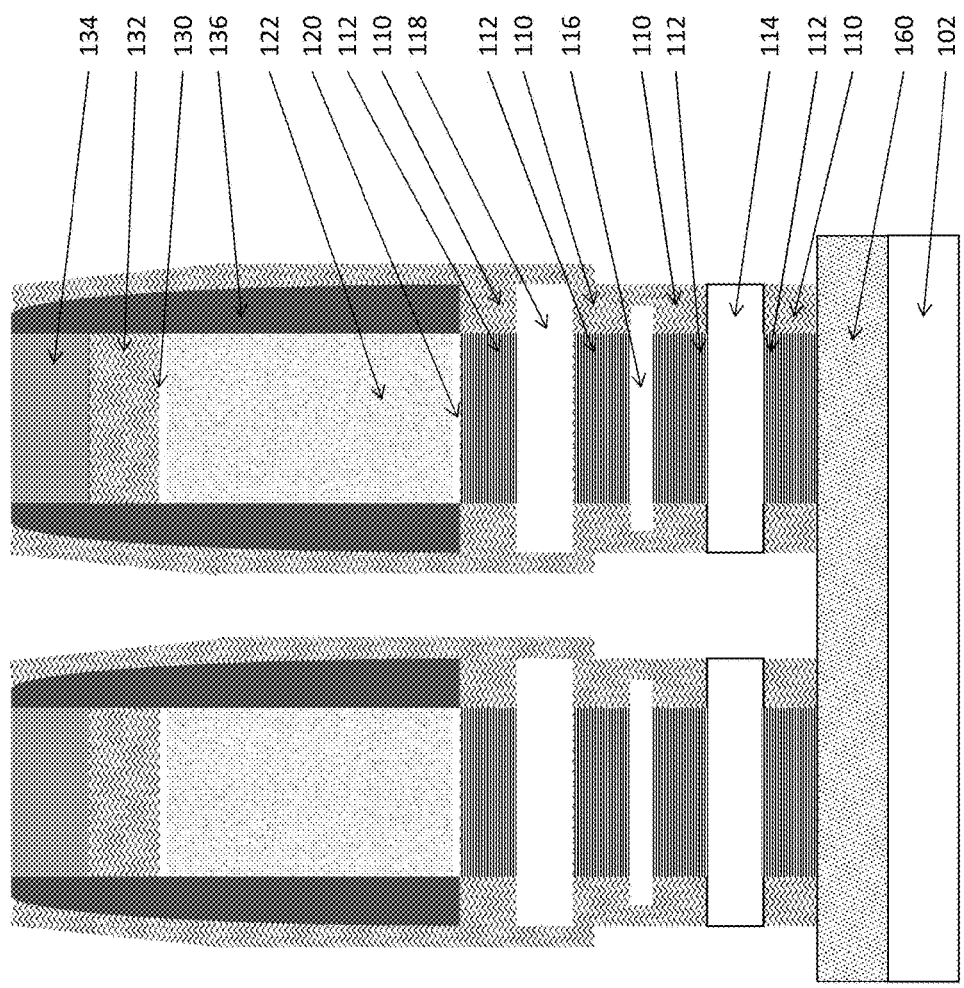
Figure 67:
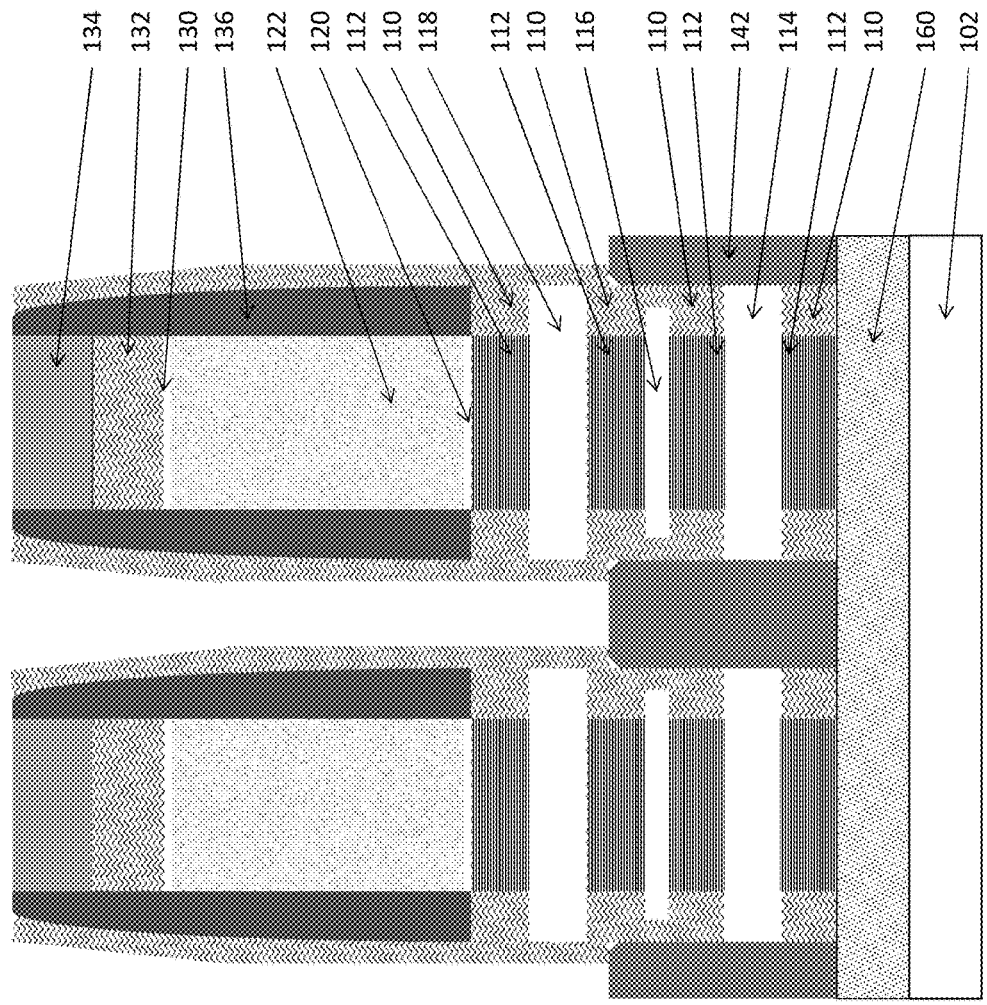

In FIG. 64, the upper semiconductor layer 118 is encapsulated by conformally forming additional amounts of the liner dielectric 110. Subsequently, as shown in FIG. 65, the liner dielectric 110 is etched to be removed from the tops of the isolation insulator 104. In FIG. 66, the isolation insulator 104 is fully recessed down to the BOX 160, using processing such as oxide anisotropic recess (e.g., hybrid wet (BHF)/dry pulsing etch-deposition ($C_4F_6+O_2$/CO/Ar), etc.), which exposes the lower semiconductor layer 114. With the lower semiconductor layer 114 exposed, and the upper semiconductor layer 118 is still protected, as shown in FIG. 67, the source/drain regions 142 of the lower transistor are epitaxially grown on exposed surfaces of the lower semiconductor layer 114 to include a pFET source/drain type dopant (e.g., SiGe:B). Note that in the processing shown in FIG. 67, the source/drain regions 142 of the lower transistor can be formed to contact the BOX layer 160; however, this does not result in undesirable current flow through the substrate 102 because the BOX layer 160 provides sufficient insulation to prevent such an occurrence.

Figure 68:
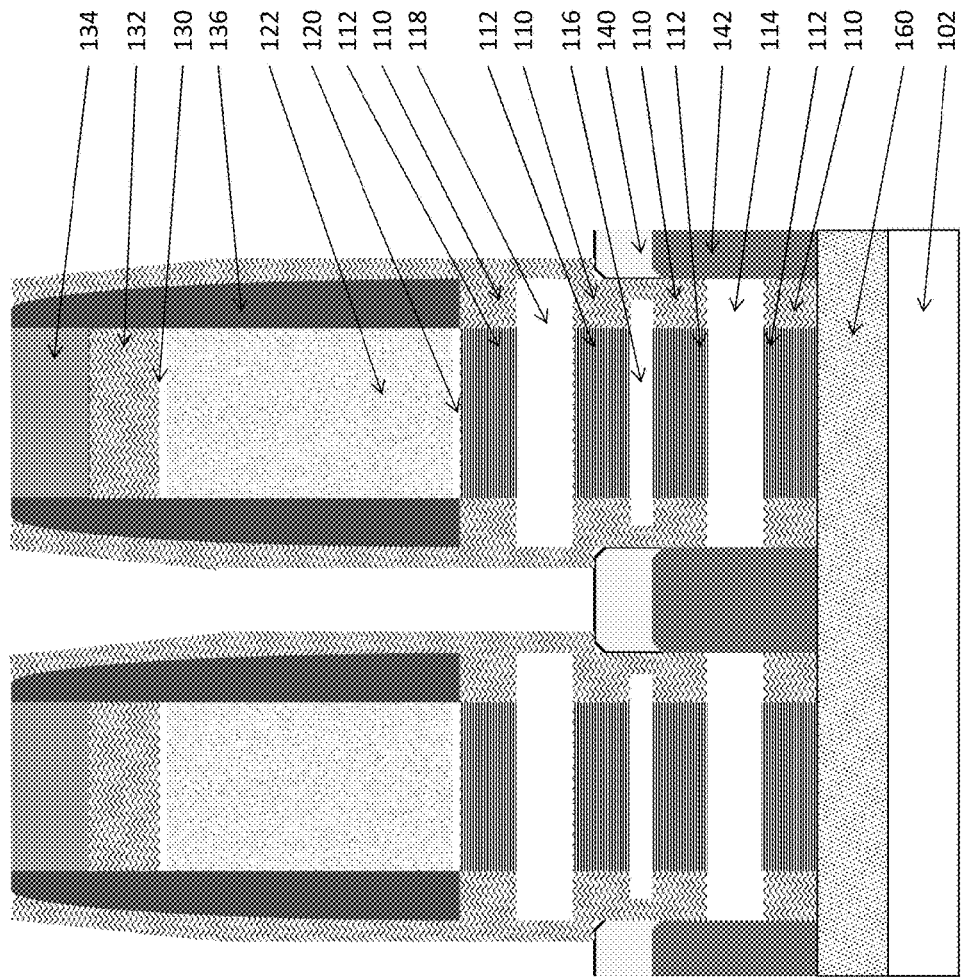

In FIG. 68, the exposed portions of the source/drain regions 142 of the lower transistor are oxidized to form the isolation layer oxide 140, in processing that provides, for example $SiO_2$ encapsulation of the pFET SiGe:B by selective oxidation at high pressure and low temperature. The processing shown in FIG. 68 consumes portions of the source/drain regions 142 of the lower transistor, and thereby reduces the height of the source/drain regions 142 of the lower transistor.

Figure 69:
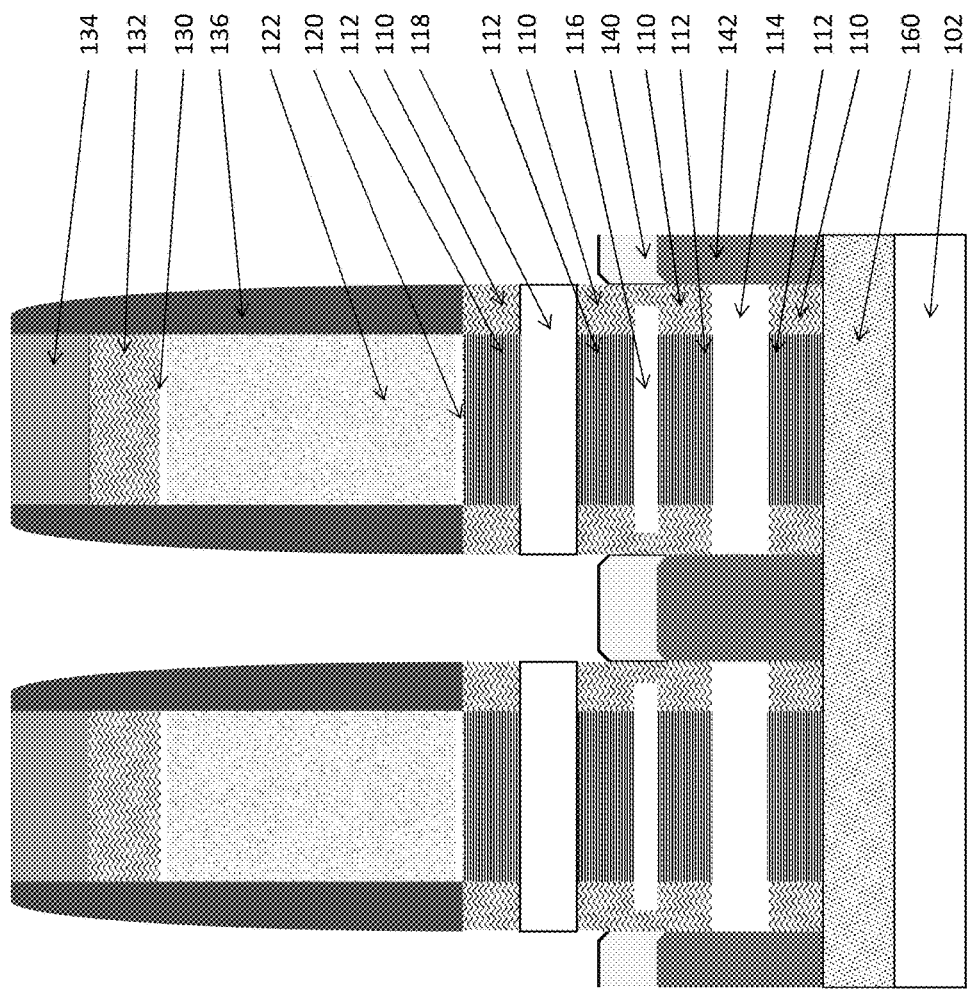
Figure 70:
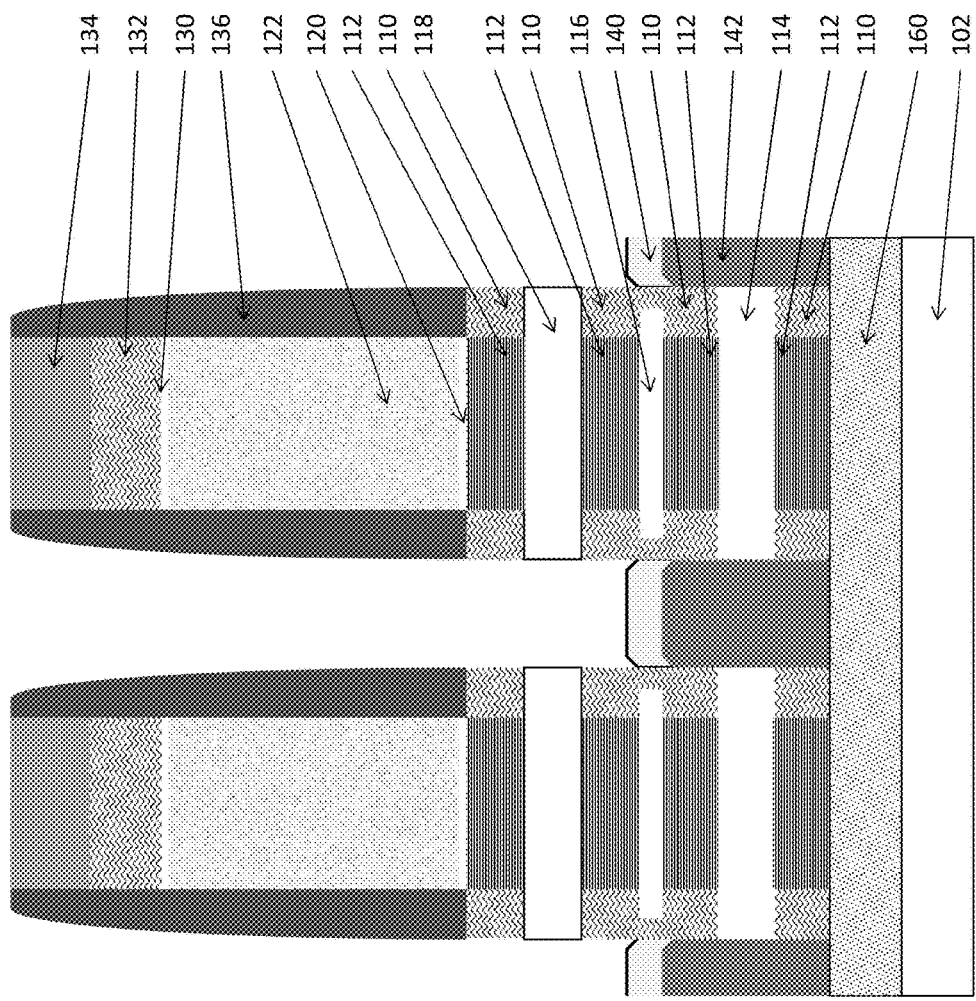

As shown in FIG. 69, the liner dielectric 110 is self-aligned to the shape of the conformal protective layer 136 in a material removal process (e.g., an etch back process of $H_3PO_4$ at 165° C., etc.) to expose the upper semiconductor layer 118. Additionally, as shown in FIG. 70, the size of the isolation layer oxide 140 is partially recessed in a pre-clean process. Next, in FIG. 71, the source/drain regions 146 of the upper transistor are epitaxially grown on exposed surface of the upper semiconductor layer 118 to include an nFET source/drain type dopant (e.g., Si:P).

Figure 71:
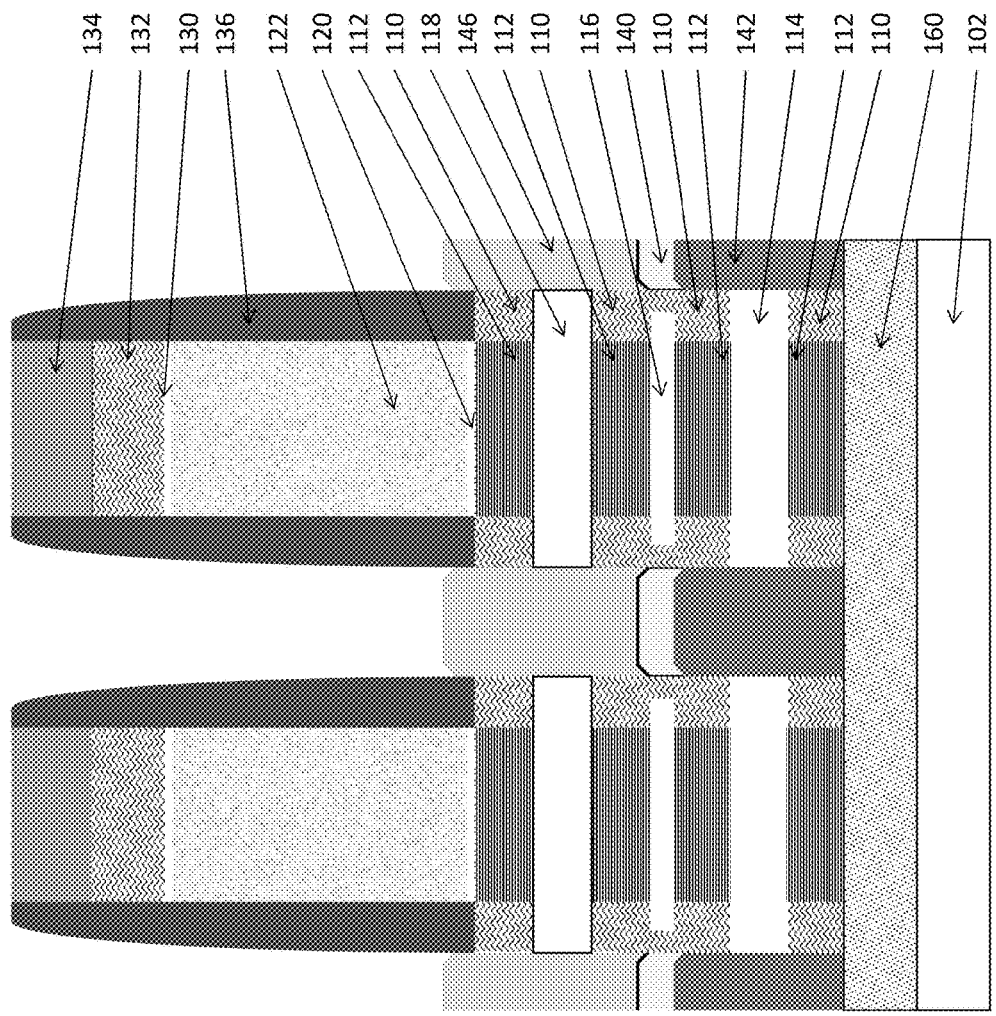
Figure 72:
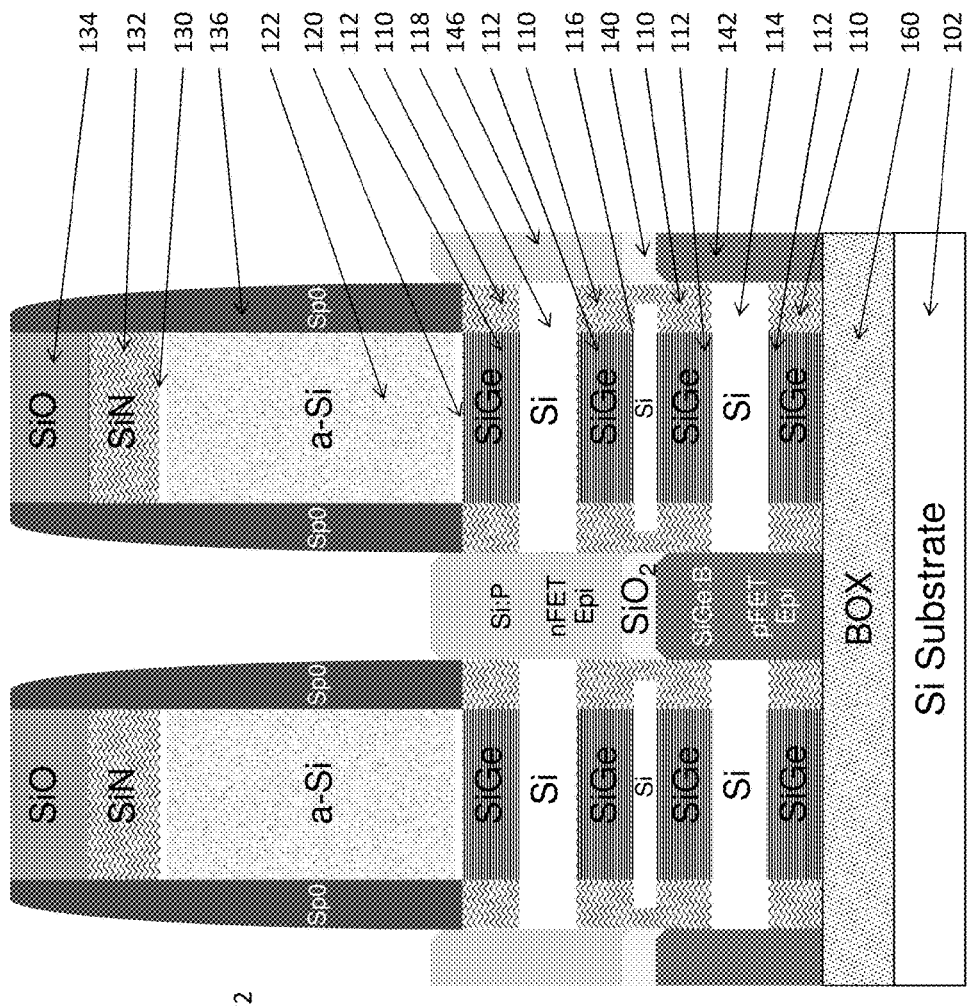

FIG. 72 illustrates the same structure shown in FIG. 71; however, in FIG. 72, exemplary material identifications are added to the drawing to illustrate one example of some chemical compositions that could be utilized for the different components of the structure (and those ordinarily skilled in the art would understand that other materials could be substituted in place of those shown in this example, without departing from the structures identified by the claims presented below). The structure shown in FIGS. 71 and 72 is then additionally processed to remove the materials above and around the semiconductor layers 114, 118 (materials 112, 116, 120, 122, 130, 132, 134 that are described above) and replace such components with the gate conductor 150 (described above), and various gate insulators 152 (e.g., oxides), and other conductive contacts 154, resulting in the structure shown in FIG. 6. Note that in FIG. 6, the gate extensions 156 are artifacts that are formed by the replacement of spacer layer 116 with the gate conductor material 150.

For purposes herein, a "semiconductor" is a material or structure that may include an implanted or in situ (e.g., epitaxially grown) impurity that allows the material to sometimes be a conductor and sometimes be an insulator, based on electron and hole carrier concentration. As used herein, "implantation processes" can take any appropriate form (whether now known or developed in the future) and can be, for example, ion implantation, etc. Epitaxial growth occurs in a heated (and sometimes pressurized) environment that is rich with a gas of the material that is to be grown.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

A "substrate" herein can be any material appropriate for the given purpose (whether now known or developed in the future) and can be, for example, silicon-based wafers (bulk materials), ceramic materials, organic materials, oxide materials, nitride materials, etc., whether doped or undoped. When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

For purposes herein, "sidewall spacers" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. An integrated circuit structure comprising:
   isolation elements extending into a substrate;
   source/drain regions of a first transistor contacting the isolation elements, wherein the isolation elements extend from the substrate to the source/drain regions of the first transistor;
   isolation layers contacting the source/drain regions of the first transistor;
   source/drain regions of a second transistor contacting the isolation layers, wherein the first transistor is positioned between the second transistor and the substrate, and wherein the isolation layers comprise insulators and are between the source/drain regions of the first transistor and the source/drain regions of the second transistor;
   a channel region of the first transistor contacting and extending between the source/drain regions of the first transistor;
   a channel region of the second transistor contacting and extending between the source/drain regions of the second transistor; and
   a gate conductor surrounding sides of the channel region of the first transistor and the channel region of the second transistor.

2. The integrated circuit structure according to claim 1, wherein the isolation elements comprise insulator plugs or a buried oxide region in the substrate.

3. The integrated circuit structure according to claim 1, wherein the isolation layers have a width that is smaller than, or equal to, a width of the source/drain regions of the first transistor, in a direction parallel to a surface of the substrate.

4. The integrated circuit structure according to claim 1, further comprising a liner dielectric positioned between the isolation elements and the substrate.

5. The integrated circuit structure according to claim 1, wherein the source/drain regions of the first transistor contact a buried oxide layer connected to the substrate.

6. The integrated circuit structure according to claim 1, wherein the source/drain regions of the second transistor are SiGe:B epitaxial growths on surfaces of the channel region of the second transistor.

7. The integrated circuit structure according to claim 1, wherein the source/drain regions of the first transistor and the source/drain regions of the second transistor comprise epitaxially grown materials.

8. An integrated circuit structure comprising:
a substrate;
isolation elements extending into a surface of the substrate;
source/drain regions of a first transistor contacting the isolation elements, wherein the isolation elements extend from the substrate to the source/drain regions of the first transistor;
isolation layers contacting the source/drain regions of the first transistor;
source/drain regions of a second transistor contacting the isolation layers, wherein the first transistor is positioned between the second transistor and the substrate, and wherein the isolation layers comprise insulators and are between the source/drain regions of the first transistor and the source/drain regions of the second transistor;
a channel region of the first transistor contacting and extending between the source/drain regions of the first transistor;
a channel region of the second transistor contacting and extending between the source/drain regions of the second transistor, wherein the channel region of the first transistor and the channel region of the second transistor extend parallel to the surface of the substrate;
a gate conductor surrounding sides of the channel region of the first transistor and the channel region of the second transistor; and
a liner dielectric electrically laterally adjacent the gate conductor,
wherein the liner dielectric is different from the isolation layers and the isolation elements.

9. The integrated circuit structure according to claim 8, wherein the isolation elements comprise insulator plugs or a buried oxide region in the substrate.

10. The integrated circuit structure according to claim 8, wherein the isolation layers have a width that is smaller than, or equal to, a width of the source/drain regions of the first transistor, in a direction parallel to the surface of the substrate.

11. The integrated circuit structure according to claim 8, wherein the liner dielectric is positioned between the isolation elements and the substrate.

12. The integrated circuit structure according to claim 8, wherein the source/drain regions of the first transistor contact a buried oxide layer connected to the substrate.

13. The integrated circuit structure according to claim 8, wherein the source/drain regions of the second transistor are SiGe:B epitaxial growths on surfaces of the channel region of the second transistor.

14. The integrated circuit structure according to claim 8, wherein the source/drain regions of the first transistor and the source/drain regions of the second transistor comprise epitaxially grown materials.

15. An integrated circuit structure comprising:
isolation elements extending into a substrate;
source/drain regions of a first transistor contacting the isolation elements, wherein the isolation elements extend from the substrate to the source/drain regions of the first transistor;
isolation layers contacting the source/drain regions of the first transistor;
source/drain regions of a second transistor contacting the isolation layers, wherein the first transistor is positioned between the second transistor and the substrate, and wherein the isolation layers are between the source/drain regions of the first transistor and the source/drain regions of the second transistor;
a channel region of the first transistor contacting and extending between the source/drain regions of the first transistor;
a channel region of the second transistor contacting and extending between the source/drain regions of the second transistor; and
a gate conductor surrounding sides of the channel region of the first transistor and the channel region of the second transistor,
wherein the source/drain regions of the second transistor are SiGe:B epitaxial growths on surfaces of the channel region of the second transistor.

16. The integrated circuit structure according to claim 15, wherein the isolation elements comprise insulator plugs or a buried oxide region in the substrate.

17. The integrated circuit structure according to claim 15, wherein the isolation layers have a width that is smaller than, or equal to, a width of the source/drain regions of the first transistor, in a direction parallel to a surface of the substrate.

18. The integrated circuit structure according to claim 15, further comprising a liner dielectric positioned between the isolation elements and the substrate.

19. The integrated circuit structure according to claim 15, wherein the source/drain regions of the first transistor contact a buried oxide layer connected to the substrate.

20. The integrated circuit structure according to claim 15, wherein the source/drain regions of the first transistor and the source/drain regions of the second transistor comprise epitaxially grown materials.

* * * * *